(12) United States Patent
Cheng

(10) Patent No.: US 11,756,934 B2
(45) Date of Patent: Sep. 12, 2023

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventor: Chung-Liang Cheng, Changhua (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 204 days.

(21) Appl. No.: 17/232,471

(22) Filed: Apr. 16, 2021

(65) Prior Publication Data

US 2022/0336418 A1 Oct. 20, 2022

(51) Int. Cl.
*H01L 21/00* (2006.01)
*H01L 25/065* (2023.01)
*H01L 23/00* (2006.01)
*H01L 29/423* (2006.01)
*H01L 29/66* (2006.01)
*H01L 29/786* (2006.01)

(52) U.S. Cl.
CPC .......... *H01L 25/0657* (2013.01); *H01L 24/32* (2013.01); *H01L 29/42392* (2013.01); *H01L 29/66742* (2013.01); *H01L 29/7869* (2013.01); *H01L 2224/32146* (2013.01); *H01L 2224/32235* (2013.01); *H01L 2225/06524* (2013.01); *H01L 2225/06541* (2013.01); *H01L 2924/1431* (2013.01); *H01L 2924/1432* (2013.01); *H01L 2924/1436* (2013.01); *H01L 2924/1443* (2013.01)

(58) Field of Classification Search
CPC ................. H01L 25/0657; H01L 24/32; H01L 29/42392
See application file for complete search history.

(56) References Cited

U.S. PATENT DOCUMENTS

| | | | | |
|---|---|---|---|---|
| 10,629,616 B1 * | 4/2020 | Kai | ........................ | H10B 43/10 |
| 11,195,781 B2 * | 12/2021 | Okina | ............... | H01L 21/76898 |
| 11,201,107 B2 * | 12/2021 | Okina | ..................... | H01L 24/08 |
| 11,362,108 B2 * | 6/2022 | Young | .................. | H01L 27/0688 |
| 11,482,539 B2 * | 10/2022 | Sharangpani | ........... | H01L 24/08 |
| 11,508,711 B2 * | 11/2022 | Ninomiya | .............. | H10B 41/10 |
| 2009/0289304 A1 * | 11/2009 | Pouydebasque | .... | H01L 27/1211 |
| | | | | 438/154 |
| 2014/0035028 A1 * | 2/2014 | Takano | ............... | H01L 29/4234 |
| | | | | 257/326 |

(Continued)

FOREIGN PATENT DOCUMENTS

| | | | | |
|---|---|---|---|---|
| CN | 114388501 A | * | 4/2022 | ......... H01L 25/0657 |
| CN | 114639680 A | * | 6/2022 | ......... H01L 23/5226 |

(Continued)

*Primary Examiner* — Laura M Menz
(74) *Attorney, Agent, or Firm* — Harrity & Harrity, LLP

(57) ABSTRACT

Some implementations described herein provide a semiconductor structure. The semiconductor structure may include a logic device disposed, at a first side of the logic device, on a carrier wafer of the semiconductor structure. The semiconductor structure may include a dielectric structure disposed on a second side of the logic device, the second side being opposite the first side. The semiconductor structure may include a memory device formed on the dielectric structure.

20 Claims, 56 Drawing Sheets

(56) References Cited

U.S. PATENT DOCUMENTS

| | | | |
|---|---|---|---|
| 2020/0258816 A1* | 8/2020 | Okina | H10B 43/40 |
| 2020/0258817 A1* | 8/2020 | Okina | H10B 43/40 |
| 2021/0035965 A1* | 2/2021 | Mizutani | H01L 25/18 |
| 2021/0091063 A1* | 3/2021 | Ninomiya | H01L 24/03 |
| 2021/0305160 A1* | 9/2021 | Chen | H01L 21/76895 |
| 2022/0068903 A1* | 3/2022 | Kim | H10B 43/40 |
| 2022/0122947 A1* | 4/2022 | Jin | H01L 29/42392 |
| 2022/0130853 A1* | 4/2022 | Sharangpani | H10B 43/40 |
| 2022/0208748 A1* | 6/2022 | Rabkin | H01L 24/08 |
| 2022/0293503 A1* | 9/2022 | Huang | H01L 21/76879 |
| 2022/0310537 A1* | 9/2022 | Lin | H10B 20/20 |
| 2022/0336418 A1* | 10/2022 | Cheng | H01L 29/78696 |
| 2022/0344284 A1* | 10/2022 | Chang | H01L 23/481 |
| 2023/0005940 A1* | 1/2023 | Yang | H10B 41/35 |

FOREIGN PATENT DOCUMENTS

| | | | | |
|---|---|---|---|---|
| WO | WO-2007115954 A1 * | 10/2007 | | H01L 21/845 |
| WO | WO-2020167355 A1 * | 8/2020 | | H01L 24/92 |
| WO | WO-2022046239 A1 * | 3/2022 | | H01L 23/5226 |
| WO | WO-2022260710 A1 * | 12/2022 | | H01L 21/76897 |

* cited by examiner

300

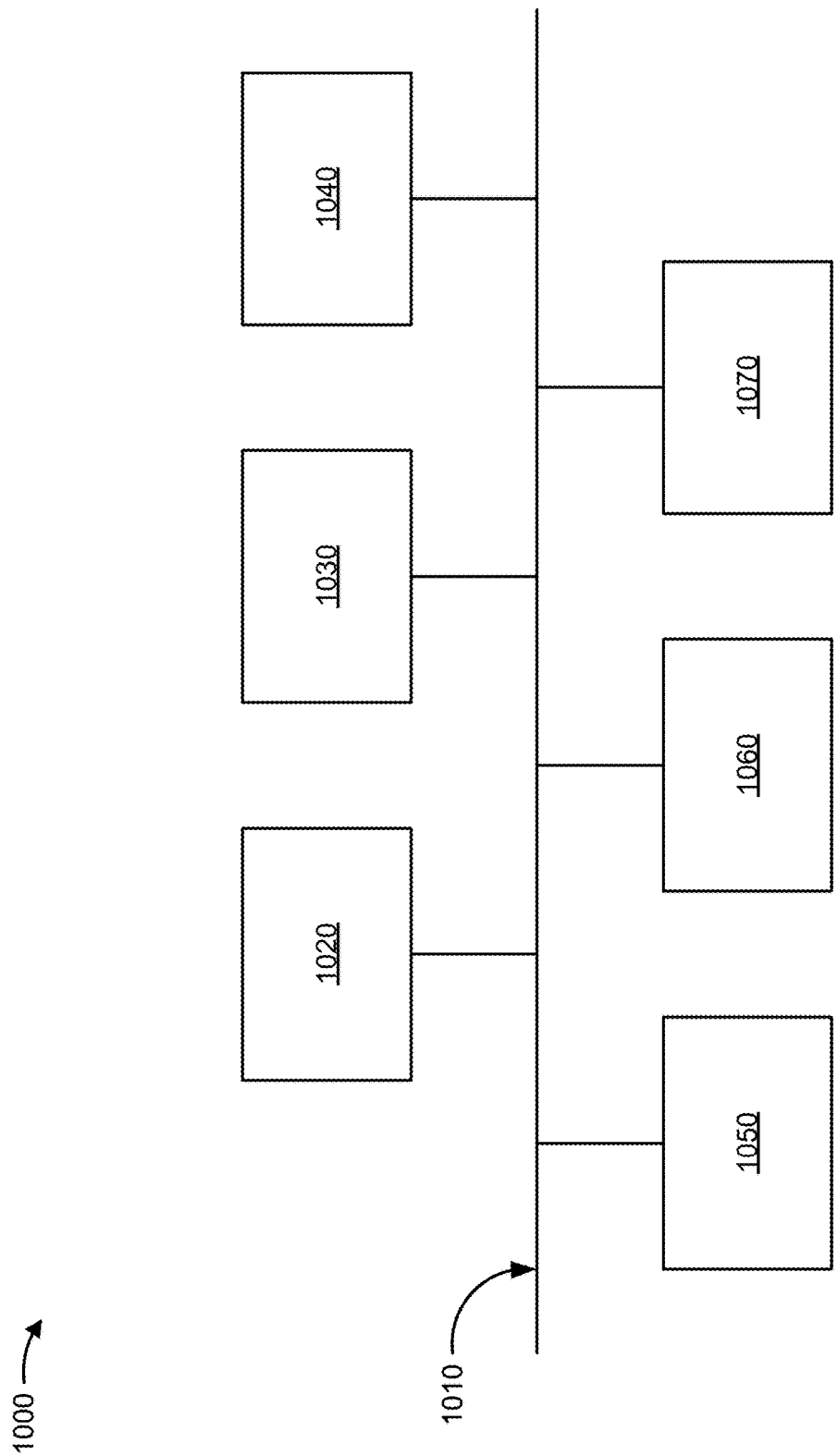

SEMICONDUCTOR STRUCTURE AND MANUFACTURING METHOD THEREOF

BACKGROUND

A semiconductor structure may include a logic device and a memory device configured to perform operations of the semiconductor structure. For example, the logic device may access information stored on the memory device. Semiconductor structure manufacturers have attempted to produce smaller and more complex semiconductor structures to improve performance, reduce power consumption, and/or conserve valuable space for deployment in an electronic device. For example, semiconductor structure manufacturers have attempted to reduce a width and/or height of portions of the semiconductor structure that include logic devices and memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a diagram of example components of one or more devices of FIG. 1.

DETAILED DESCRIPTION

Figure 1:
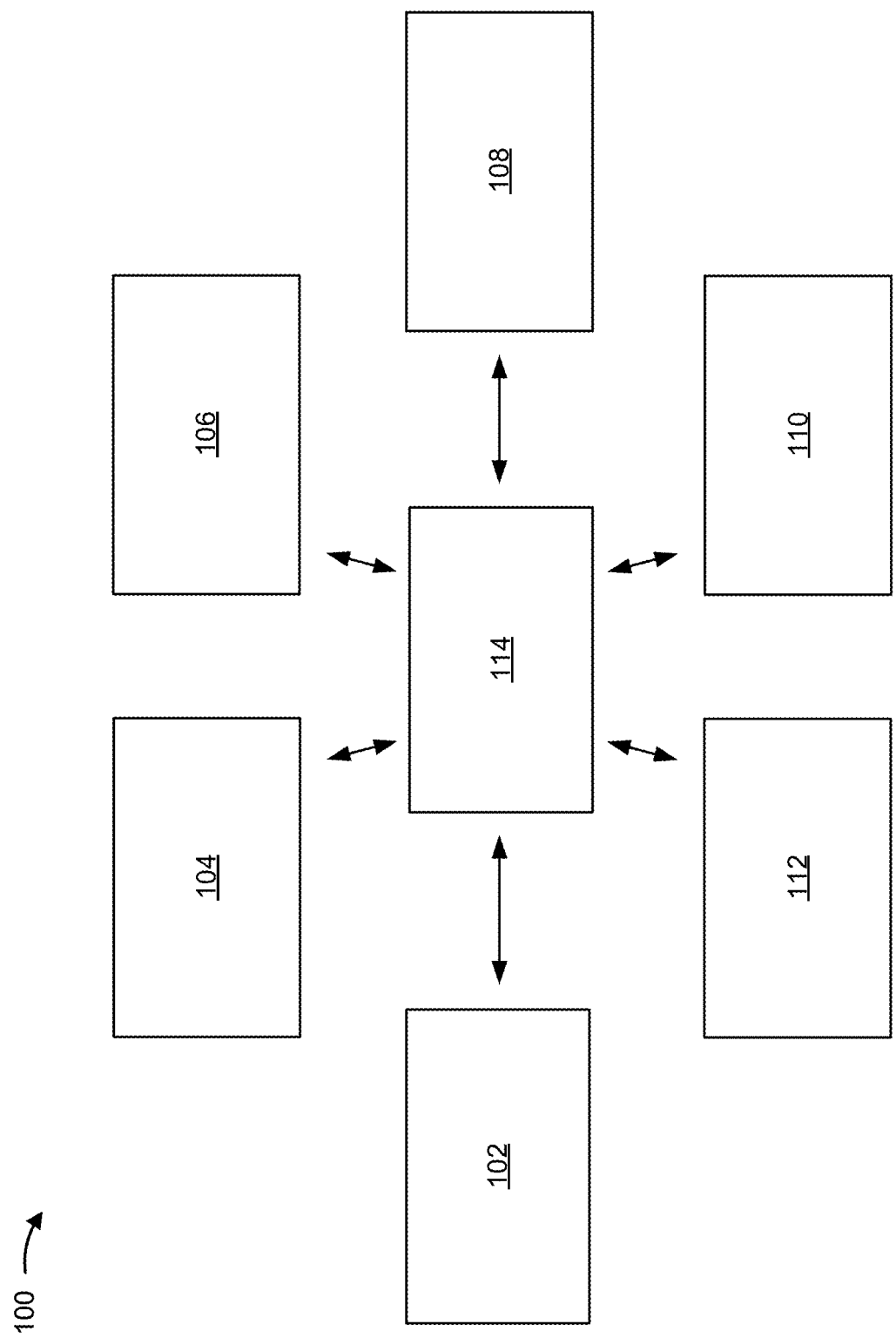
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor structure may include one or more memory devices and one or more logic devices. However, space may be limited within electronic devices, which limit an amount of computing resources and/or memory resources within the electronic devices. For example, an amount of memory of an electronic device may be limited by an amount of space that is allocated to one or more memory devices. For at least this reason, semiconductor manufacturers have attempted to reduce dimensions of device structures within a semiconductor structure.

Some implementations described herein provide techniques and apparatuses for stacking a logic device (e.g., a three-dimensional (3D) logic device) and a memory device (e.g., a two-dimensional (2D) memory device) on different layers of a semiconductor structure. For example, the memory device may be stacked on the logic device (e.g., directly on or with one or more materials between the memory device and the logic device). In some implementations, one or more semiconductor processing tools may form the logic device on a wafer (e.g., a silicon on insulator (SOI) wafer), may couple a carrier wafer to the logic device (e.g., on a front-side opposite the wafer), may flip the logic device, may remove at least a portion of the wafer, and may form the memory device on a back-side of the logic device. In some implementations, the one or more semiconductor processing tools may deposit a dielectric structure on the backside of the logic device before forming the memory device, with the dielectric structure providing electrical insulation between the logic device and the memory device. In some implementations, the semiconductor structure may include a conductive structure that extends through the memory device and/or the dielectric structure to provide a connection to one or more elements of the logic device.

Based on stacking the memory device and the logic device, a device density may be increased within the semiconductor structure. The increased device density may facilitate an increased quantity of memory devices and logic devices within the semiconductor structure, and/or may reduce a dimension (e.g., a width and/or volume) of the semiconductor structure.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an etching tool 104, a planarization tool 106, a bonding tool 108, a laser tool 110, an exposure tool 112, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor structure. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotopically or directionally etch the one or more portions), or another type of dry etching technique.

In some implementations, the etching tool 104 may perform an atomic layer etch (ALE) process. In an ALE process, etch process parameters to be used by an etch tool to perform an iteration of an etch process may be dynamically tuned using an analysis model (e.g., a model trained to determine a set of dynamic etch process parameters). In some implementations, information associated with a result of the etch process may be used to update the analysis model. In some implementations, the analysis model may be updated on a cycle-to-cycle basis or on a run-to-run basis.

In some implementations, the dynamic tuning of the etch process parameters enables etching with improved reliability. That is, the dynamic tuning of the etch process parameters may enable etching that reliably falls within target specifications, thereby enabling reliable performance of a semiconductor device and improving manufacturing yield.

The etching tool 104 (e.g., a dry etching tool) may perform an etching operation until detecting a contact etch stop layer (CESL) of the wafer or semiconductor structure. Detection of the CESL may indicate that the etching operation is complete. The etching tool 104 may perform a subsequent etching operation and/or the wafer/die transport tool 114 may transport the wafer or semiconductor structure from the etching tool 104 to another semiconductor processing tool after the etching operation is complete.

The planarization tool 106 is a semiconductor processing tool that is capable of polishing or planarizing various layers of a wafer or semiconductor structure. For example, the planarization tool 106 may include a chemical mechanical planarization (CMP) tool and/or another type of planarization tool 106 that polishes or planarizes a layer or surface of deposited or plated material. The planarization tool 106 may polish or planarize a surface of a semiconductor structure with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor structure). The polishing pad and the semiconductor structure may be pressed together by a dynamic polishing head and held in place by the retaining ring. The dynamic polishing head may rotate with different axes of rotation to remove material and even out any irregular topography of the semiconductor structure, making the semiconductor structure flat or planar.

The bonding tool 108 is a semiconductor processing tool that is capable of bonding two or more wafers (or two or more semiconductor substrates, or two or more semiconductor structures) together. For example, the bonding tool 108 may include a eutectic bonding tool that is capable of forming a eutectic bond between two or more wafers together. In these examples, the bonding tool 108 may heat the two or more wafers to form a eutectic system between the materials of the two or more wafers.

The laser tool 110 is a semiconductor processing tool that is capable of exposing a semiconductor structure to a radiation source, such as an ultraviolet light (UV) source (e.g., a deep UV light source, an extreme UV (EUV) light source, and/or the like), an x-ray source, an electron beam source, and/or another type of radiation source. The laser tool 110 may expose a material (e.g., a bonding material or a release layer material) to the radiation source to eject the material and/or change a physical state of the material (e.g., from a solid to a liquid or from a solid to a gas). In some implementations, the laser tool 110 may expose the material to the radiation source through a translucent material, such as glass.

Exposure tool 112 is a semiconductor processing tool that is capable of exposing a photoresist layer to a radiation source, such as a UV source (e.g., a deep UV light source, an EUV light source, and/or the like), an x-ray source, an electron beam source, and/or another type of radiation source. The exposure tool 112 may expose a photoresist layer to the radiation source to transfer a pattern from a photomask to the photoresist layer. The pattern may include one or more semiconductor device layer patterns for forming one or more semiconductor structure, may include a pattern for forming one or more structures of a semiconductor structure, and/or may include a pattern for etching various portions of a semiconductor structure, among other examples. In some implementations, the exposure tool 112 includes a scanner, a stepper, or a similar type of exposure tool.

Wafer/die transport tool 114 includes a mobile robot, a robot arm, a tram or rail car, an overhead hoist transfer (OHT) vehicle, an automated material handling system (AMES), and/or another type of tool that is used to transport wafers and/or dies between semiconductor processing tools 108-110 and/or to and from other locations such as a wafer rack, a storage room, or another location. In some implementations, wafer/die transport tool 114 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2A:
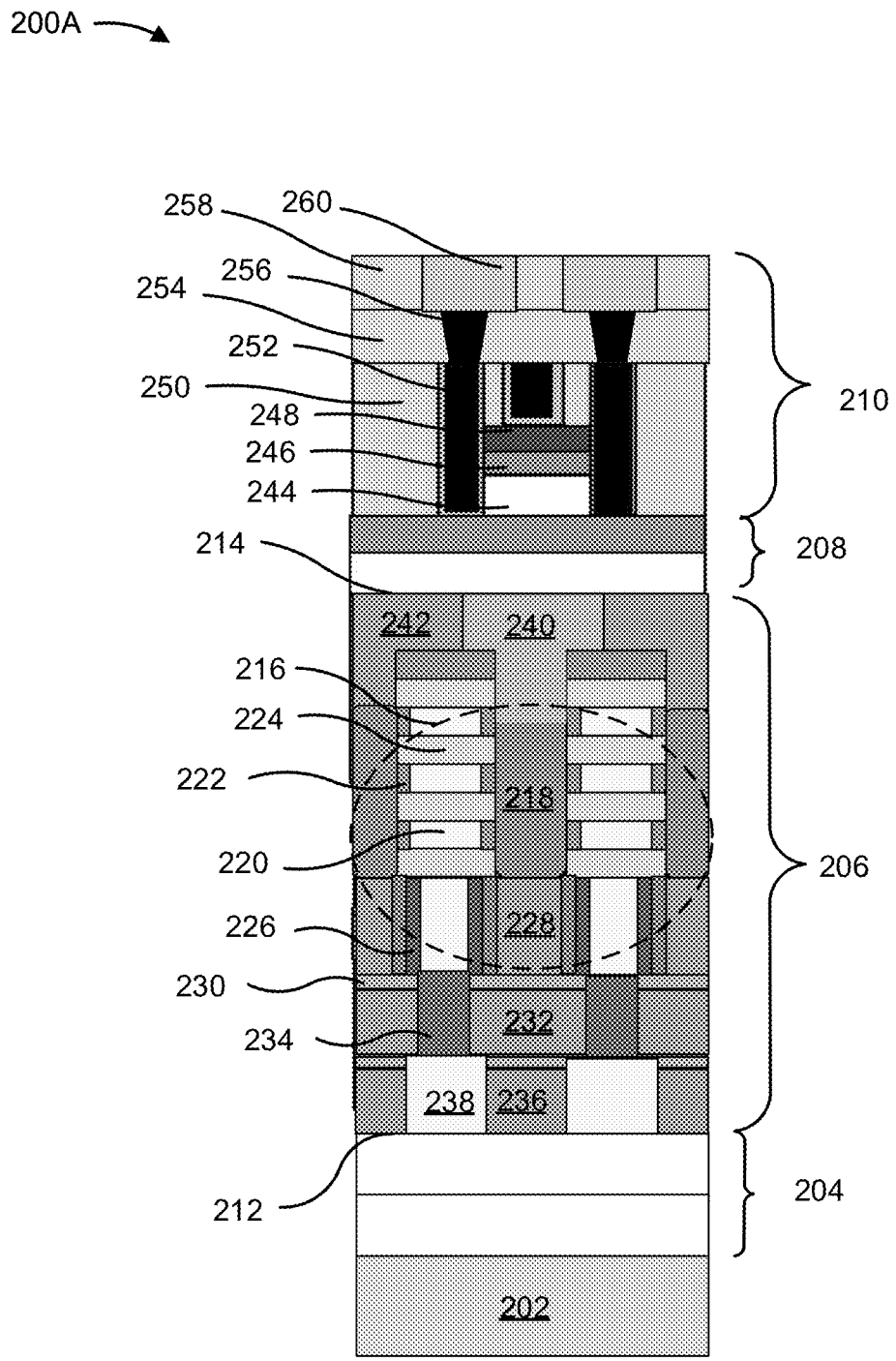
FIGS. 2A and 2B are diagrams of example semiconductor structures described herein.

FIG. 2A is a diagram of an example semiconductor structure 200A described herein. In some implementations, the semiconductor structure 200A may include one or more layers not shown in FIG. 2A, such as one or more barrier layers, adhesion layers, metal gates, substrates, interconnects, recesses (e.g., vias), or semiconductor structures, among other examples.

As shown in FIG. 2A, the semiconductor structure 200A may include a carrier wafer 202. The carrier wafer 202 may include a silicon-based material (e.g., $SiO_2$). A dielectric structure 204 may be disposed on the carrier wafer 202. The dielectric structure 204 may include one more dielectric layers and/or adhesion layers. In some implementations, the dielectric structure 204 may include a thermal oxide layer (e.g., disposed on the carrier wafer 202) and/or a high density plasma oxide (e.g., disposed on the thermal oxide layer). In some implementations, the dielectric structure 204 may be bonded to the carrier wafer 202 (e.g., via thermal bonding).

As further shown in FIG. 2A, the semiconductor structure 200A may include a logic device 206 (e.g., a three dimensional (3D) logic device) disposed on the dielectric structure 204. The semiconductor structure 200A may further include a dielectric structure 208 disposed on the logic device 206 and/or a memory device 210 (e.g., a two dimensional (2D) memory device) disposed on the logic device 206 (e.g., directly on the logic device 206 or directly on the dielectric structure 204).

In some implementations, the logic device 206 may include, or be included in, a central processing unit, a graphics processing unit, among other examples. The logic device 206 may include, and/or be formed with, multiple layers of materials. The logic device may include a side 212 that is coupled to the carrier wafer 202 (e.g., coupled using the dielectric structure 204) and a side 214 that is opposite the carrier wafer 202. In some implementations, the logic device 206 may include a gate-all-around field-effect transistor (GAA FET) 216, such as a metal-oxide-semiconductor (MOS) GAA FET.

The GAA FET 216 may include one or more source/drains 218 (e.g., an epitaxial layer). The one or more source/drains 218 may comprise a silicon-based material (e.g., silicon germanium). The GAA FET 216 may include one or more gates 220, spacers 222, silicon-based layers 224, dielectric liners 226, and/or an inter-layer dielectric 228. The one or more gates 220 (e.g., metal-based gates or silicide-based gates) may include an aluminum-based material, a tantalum-based material, a tantalum nitride-based material, or a niobium-based material, among other examples. The spacers 222 may include a doped silicon-based material, such as silicon carbon nitride, among other examples. The silicon-based layers 224 may include a crystalline silicon material, among other examples. The dielectric liners 226 may include a high-k material, such as a hafnium-based material (e.g., hafnium silicate or hafnium dioxide, among other examples) or a zirconium-based material (zirconium silicate or zirconium dioxide, among other examples), among other examples. The inter-layer dielectric 228 may include a low-k material, such as silicon dioxide, silicon nitride, or silicon oxynitride, among other examples. The inter-layer dielectric 228 may provide structural support to the semiconductor structure 200A and electrical insulation between structures within the semiconductor structure 200A.

As shown in FIG. 2A, the GAA FET 216 may be formed with a gate structure between source/drains 218 such that the source/drains 218 are on lateral sides of the gate structure. The gate structure may include layers that alternate between the silicon-based layers 224 and the one or more gates 220. In some implementations, the gate structure may include one or more liners and/or barrier layers between the silicon-based layers 224 and the one or more gates 220. The silicon-based layers 224 may extend between, and may be in contact with, the source/drains 218 on both lateral sides of the silicon-based layers 224. In some implementations, a liner or barrier layer may be disposed between the silicon-based layers 224 and the source/drains 218. A gate 220 may be separated from (e.g., insulated from) the source/drains 218 by the spacers 222 (e.g., one on each lateral side of the gate 220) and/or a liner and/or a barrier layer.

As shown in FIG. 2A, a gate 220 on an upper or lower end of the gate structure (e.g., shown as a lowest gate in FIG. 2A) may extend into a layer that does not include the source/drains 218. The gate 220 may have a height that is greater than heights of other gates having the source/drains 218 on lateral sides. The gate 220 may be lined with a dielectric liner 226 on lateral sides of the gate 220 and/or between the gate 220 and a nearest silicon-based layer 224 of the gate structure. Spacers 222 may be disposed between the gate 220 and the inter-layer dielectric 228 (e.g., in contact with the inter-layer dielectric 228 and the gate 220 or the dielectric liner 226).

A silicon-based layer 230 may be disposed between the inter-layer dielectric 228 (e.g., a layer-0 inter-layer dielectric) and an inter-layer dielectric 232 (e.g., a layer-1 inter-layer dielectric). The silicon-based layer 230 (e.g., including a silicon-nitride material) may provide a barrier between the inter-layer dielectric 228 and the inter-layer dielectric 232. Inter-layer dielectrics described herein (e.g., inter-layer dielectric 232) may include a low-k material, such as silicon dioxide, silicon nitride, or silicon oxynitride, among other examples. Additionally, or alternatively, inter-layer dielectrics may provide structural support to an associated semiconductor structure and electrical insulation between structures within the semiconductor structure. For example, the inter-layer dielectric 232 may provide structural support to the semiconductor structure 200A and electrical insulation between structures within the semiconductor structure 200A.

A conductive structure 234 (e.g., a plug or an interconnect, among other examples) may extend through the inter-layer dielectric 232 and the silicon-based layer 230 to the GAA FET 216 (e.g., at the gate that extends into the inter-layer dielectric 228). In some implementations, the conductive structure 234 may include a tungsten-based material, a ruthenium-based material, a cobalt-based material, a liner and/or barrier layer (e.g., a tantalum-based liner or barrier and/or a titanium-based liner or barrier, among other examples), among other examples.

Another silicon-based layer 230 may be disposed between the inter-layer dielectric 232 and an inter-layer dielectric 236 (e.g., a layer-2 inter-layer dielectric). The silicon-based layer 230 (e.g., including a silicon-nitride material) may provide a barrier between the inter-layer dielectric 232 and the inter-layer dielectric 236. The inter-layer dielectric 236 may include a low-k material, such as silicon dioxide, silicon nitride, or silicon oxynitride, among other examples. The inter-layer dielectric 236 may provide structural support to the semiconductor structure 200A and electrical insulation between structures within the semiconductor structure 200A.

A conductive structure 238 (e.g., a trench line or an interconnect, a copper-based material, among other examples) may extend through the inter-layer dielectric 236 and the other silicon-based layer 230 to the conductive structure 234 to provide an electrical connection through the conductive structure 234 to the GAA FET 216. In some implementations, the conductive structure 238 may include a copper-based material, a liner and/or barrier layer (e.g., a tantalum-based liner or barrier and/or a titanium-based liner or barrier, among other examples), among other examples.

The logic device 206 may include, at the side 214 that is opposite the carrier wafer 202, a dielectric structure 242. The dielectric structure 242 may include a silicon-carbon-nitride material or an oxide material, among other examples. In some implementations, the logic device 206 may also include, at the side 214, a conductive structure 240. The conductive structure 240 may include one or more conductive materials (e.g., a plug) and/or one or more barrier layers or liners (e.g., a metal silicide, such as titanium silicide, copper silicide, or nickel silicide, among other examples). In some implementations, the conductive structure 240 may provide a connection, at side 214 of the logic device 206, to the source/drain 218.

In some implementations, the dielectric structure 208 may include one or more layers of materials. For example, the dielectric structure 208 may include a silicon dioxide layer and/or a high-k dielectric layer (e.g., a silicon-nitride-based material or a silicon-oxide-based material, among other examples). In some implementations, the dielectric structure 208 may provide electrical insulation between the logic device 206 and a memory device (e.g., memory device 210) to be stacked on the logic device 206 via the dielectric structure 208.

In some implementations, the memory device 210 may include a dielectric structure 244 disposed on the dielectric structure 208, a first memory layer 246 (e.g., a tungsten-based material and/or a tungsten-disulfide-based material, among other examples) disposed on the dielectric structure 244, and a second memory layer 248 (e.g., an aluminum-based material and/or an aluminum-oxide-based material, among other examples) disposed on the first memory layer 246. The dielectric structure 208, the first memory layer 246, and/or the second memory layer 248 may be disposed within an inter-layer dielectric 250. The inter-layer dielectric 250 may include a low-k material, such as silicon dioxide, silicon nitride, or silicon oxynitride, among other examples. The inter-layer dielectric 250 may provide structural support to the semiconductor structure 200A and electrical insulation between structures within the semiconductor structure 200A. The inter-layer dielectric 250 may be disposed on the dielectric structure 208. In some implementations, conductive structures 252 may provide electrical connections from one or more of the dielectric structure 244, the first memory layer 246, and/or the second memory layer 248 to another layer of the semiconductor structure 200A. In some implementations, the conductive structures 252 may extend along lateral sides of the dielectric structure 244, the first memory layer 246, and/or the second memory layer 248. In some implementations, the conductive structures 252 may include a conductive plug (e.g., tungsten-based material, cobalt-based material, or ruthenium-based material, among other examples) and/or one or more barrier layers or liners (e.g., titanium-based material, titanium-nitride-based material, and/or tantalum-based material, among other examples). In some implementations, the first memory layer 246, the second memory layer 248, and/or the conductive structures 252 may form a thin film transistor.

In some implementations, the conductive structures 252 may provide electrical connections to an inter-layer dielectric 254 and/or a structure within the inter-layer dielectric 254. The inter-layer dielectric 254 may include a low-k material, such as silicon dioxide, silicon nitride, or silicon oxynitride, among other examples. The inter-layer dielectric 254 may provide structural support to the semiconductor structure 200A and electrical insulation between structures within the semiconductor structure 200A. In some implementations, the conductive structures 252 may provide electrical connections to additional conductive structures 256 within the inter-layer dielectric 254. In some implementations, the conductive structures 256 may include, or be formed of, a same material as the conductive structures 252.

In some implementations, the conductive structures 256 may provide electrical connections to an inter-layer dielectric 258 and/or a structure within the inter-layer dielectric 258. The inter-layer dielectric 258 may include a low-k material, such as silicon dioxide, silicon nitride, or silicon oxynitride, among other examples. The inter-layer dielectric 258 may provide structural support to the semiconductor structure 200A and electrical insulation between structures within the semiconductor structure 200A. In some implementations, the conductive structures 256 may provide electrical connections to additional conductive structures 260 within the inter-layer dielectric 258. In some implementations, the conductive structures 260 may include a bit line and/or a copper-based material, among other examples.

Figure 2B:
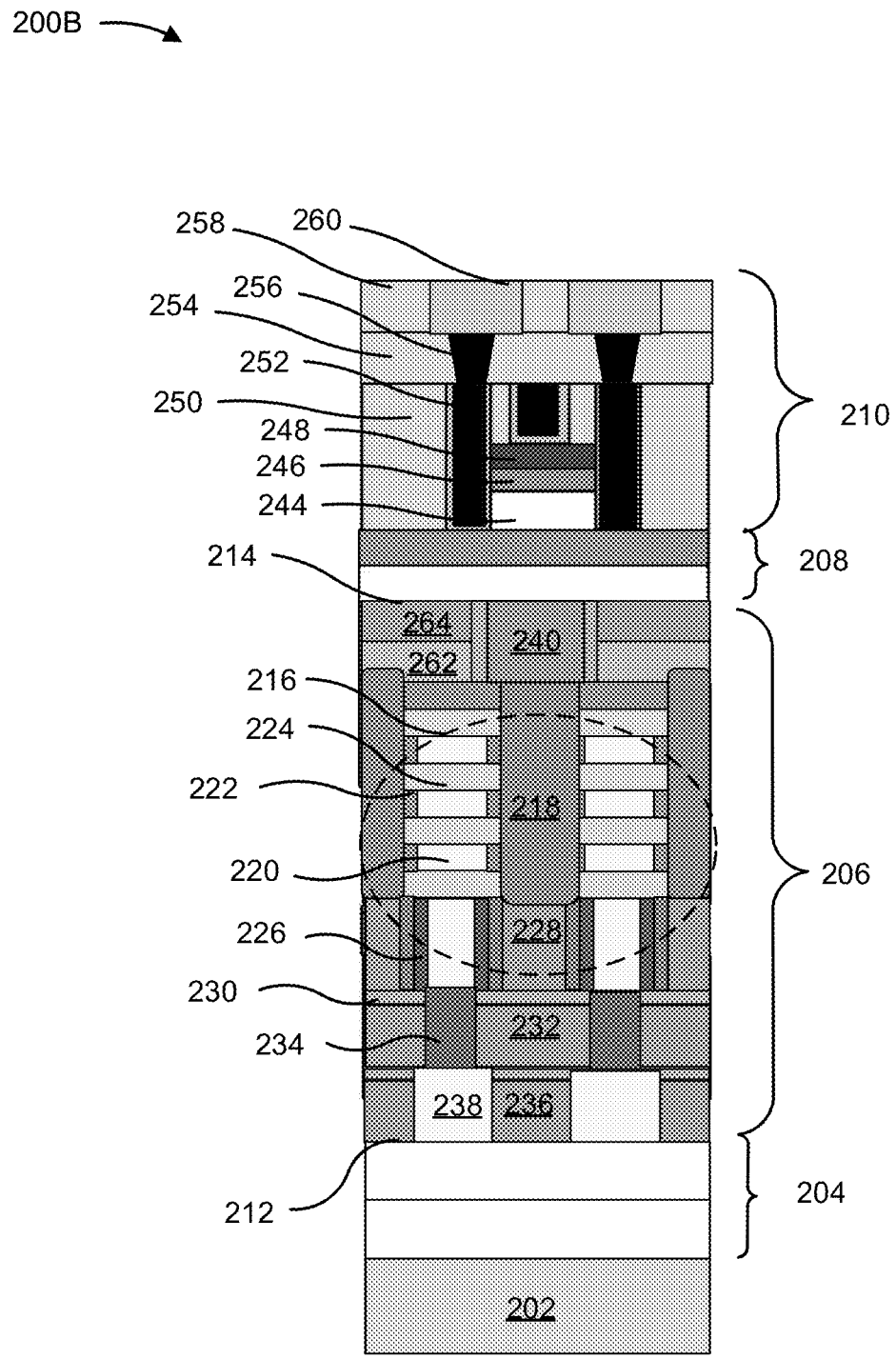

FIG. 2B is a diagram of an example semiconductor structure 200B described herein. In some implementations, the semiconductor structure 200B may include one or more layers not shown in FIG. 2B, such as one or more barrier layers, adhesion layers, metal gates, substrates, interconnects, recesses (e.g., vias), or semiconductor structures, among other examples. The semiconductor structure 200B may generally include structures, layers, and devices as described with reference to the semiconductor structure 200A. However, the logic device 206 of the semiconductor structure 200B may have one or more different structures and/or layers than the logic device 206 of the semiconductor structure 200A.

As shown in FIG. 2B, the logic device 206 may include, at side 214, a silicon-based structure 262 (e.g., silicon crystalline-based material) and a silicon-based structure 264 (e.g., a germanium-based structure). In some implementations, the silicon-based structure 264 may include B-doped silicon. In some implementations, the logic device 206, at side 214, may also include a conductive structure 240. The conductive structure 240 may include one or more conductive materials (e.g., tungsten, ruthenium, or cobalt, among other examples) and/or one or more barrier layers or liners (e.g., silicon nitride, a titanium nitride, a metal silicide, such as titanium silicide, copper silicide, or nickel silicide, among other examples). In some implementations, the conductive structure 240 may provide a connection, at side 214 of the logic device 206, to the source/drain 218. In some implementations, the source/drain 218 may extend into the conductive structure 240. In some implementations, the conductive structure 240 may have a lower surface that is generally flush with a lower surface of the silicon-based structure 262.

Based on stacking the memory device and the logic device, a device density may be increased within the semiconductor structure 200 (e.g., semiconductor structure 200A and/or semiconductor structure 200B). The increased device density may facilitate an increased quantity of memory devices and logic devices within the semiconductor structure 200, and/or may reduce a dimension (e.g., a width and/or volume) of the semiconductor structure 200. Additionally, or alternatively, based at least in part on using the silicon-based structure 262 and the silicon-based structure 264 as structural support for the conductive structure 240, a process for manufacturing the semiconductor structure 200B may reduce a number of depositions of dielectric material (e.g., to deposit the dielectric structure 242 of semiconductor structure 200A). This may reduce a fabrication time for manufacturing the semiconductor structure 200B.

As indicated above, FIGS. 2A and 2B are provided as examples. Other examples may differ from what is described with regard to FIGS. 2A and 2B.

Figure 3A:
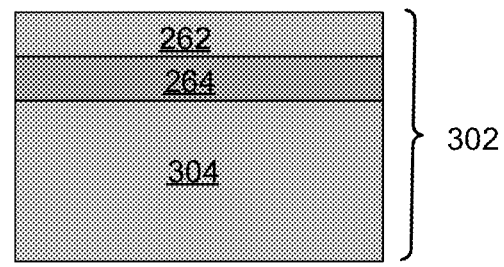
FIGS. 3A-3W are diagrams of an example implementation described herein.
Figure 3B:
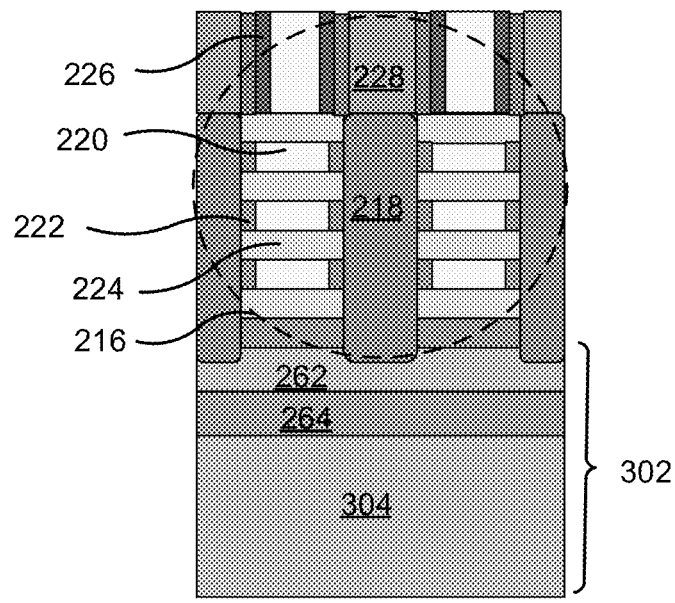
Figure 3C:
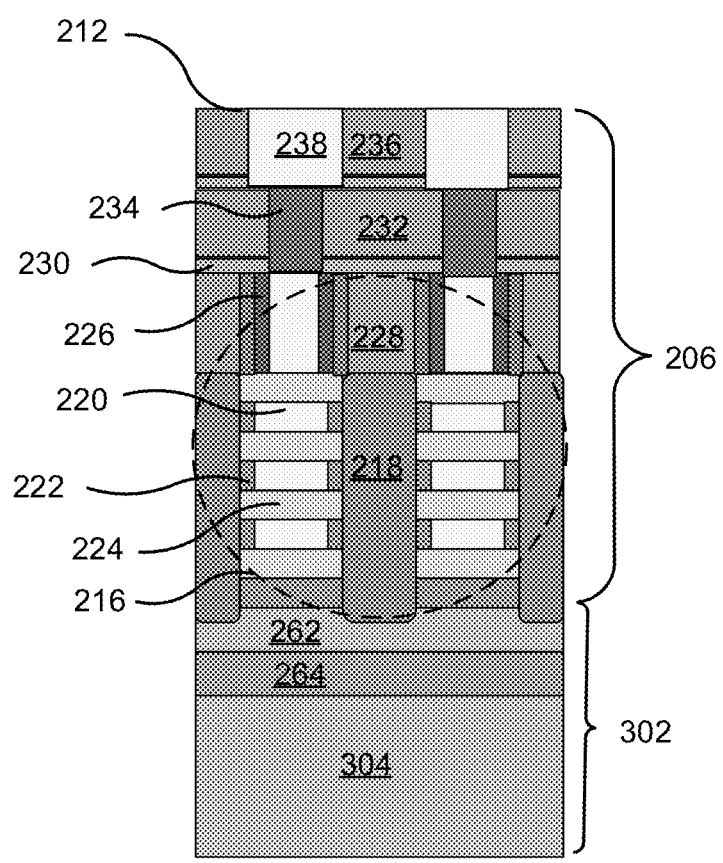
Figure 3D:
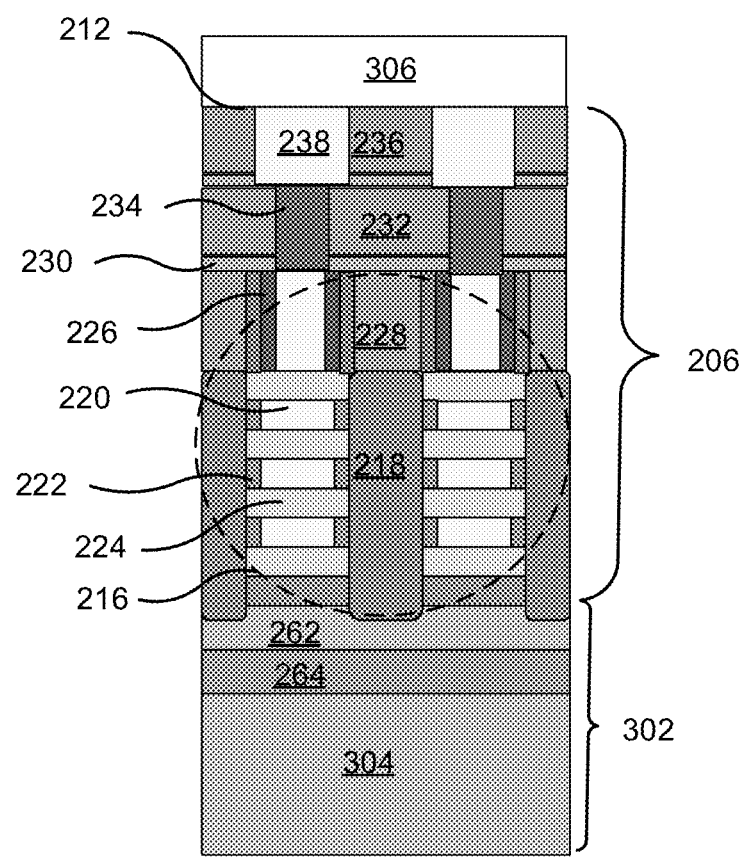
Figure 3E:
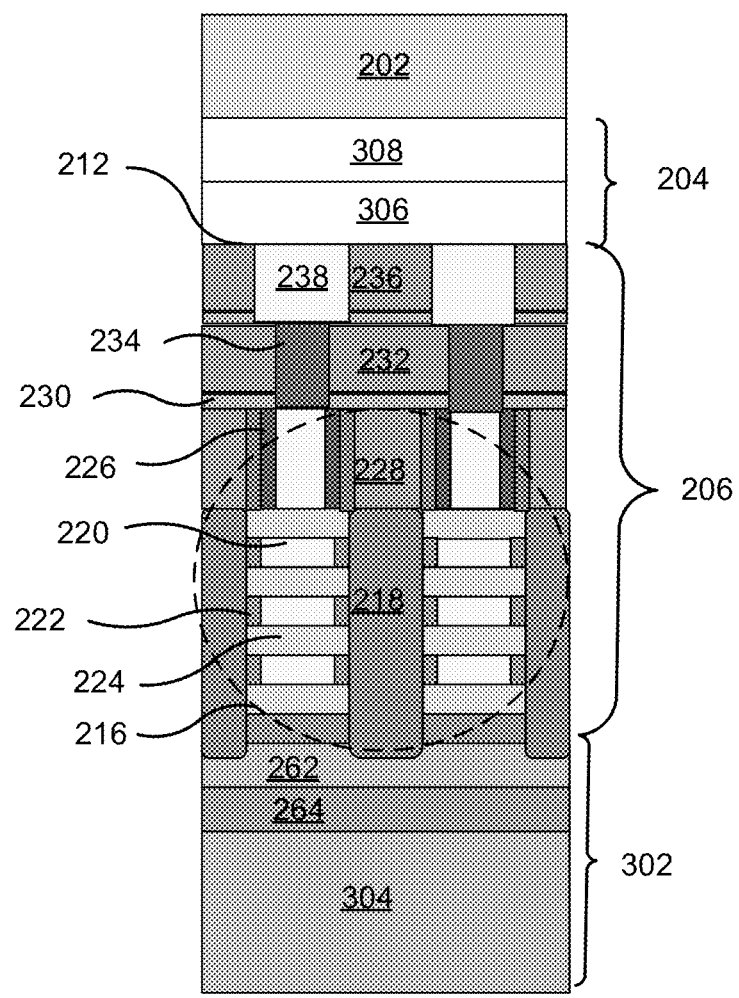
Figure 3F:
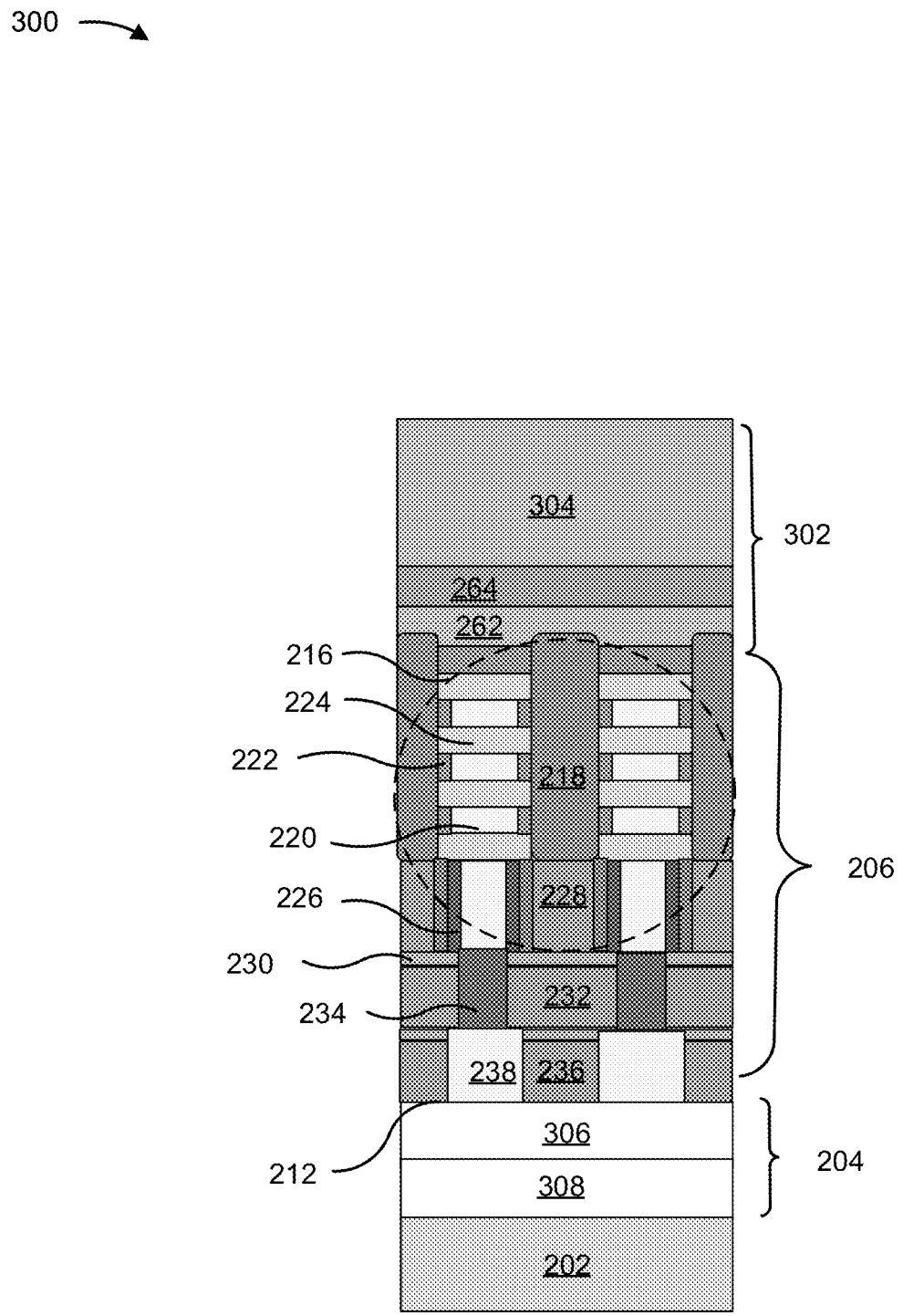
Figure 3G:
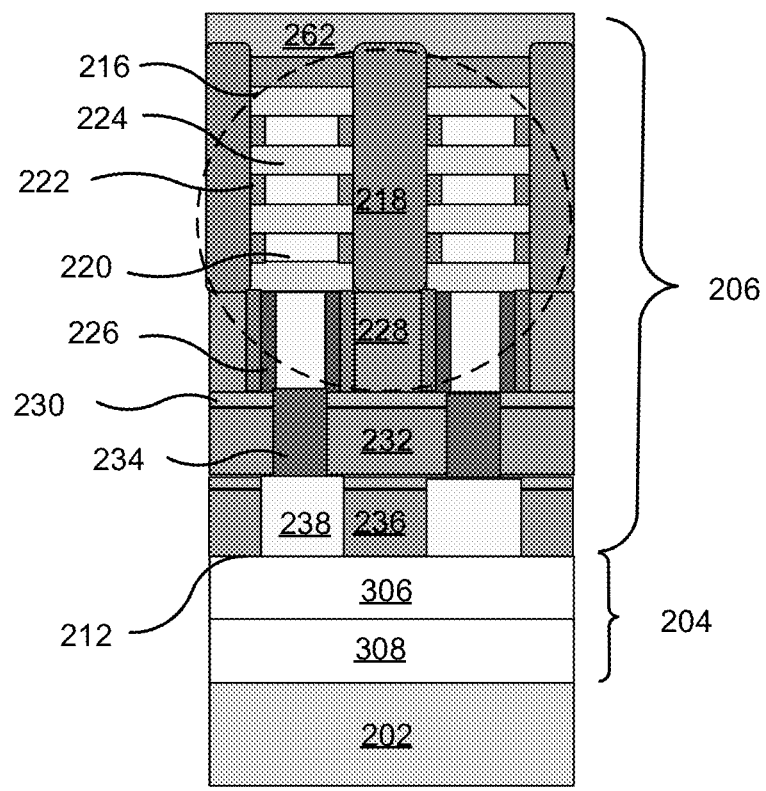
Figure 3H:
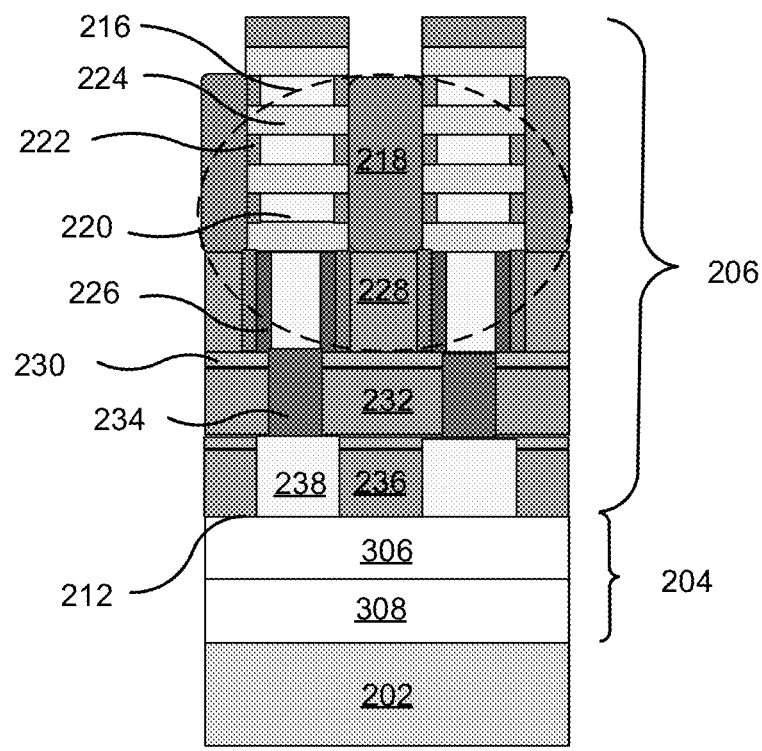
Figure 3I:
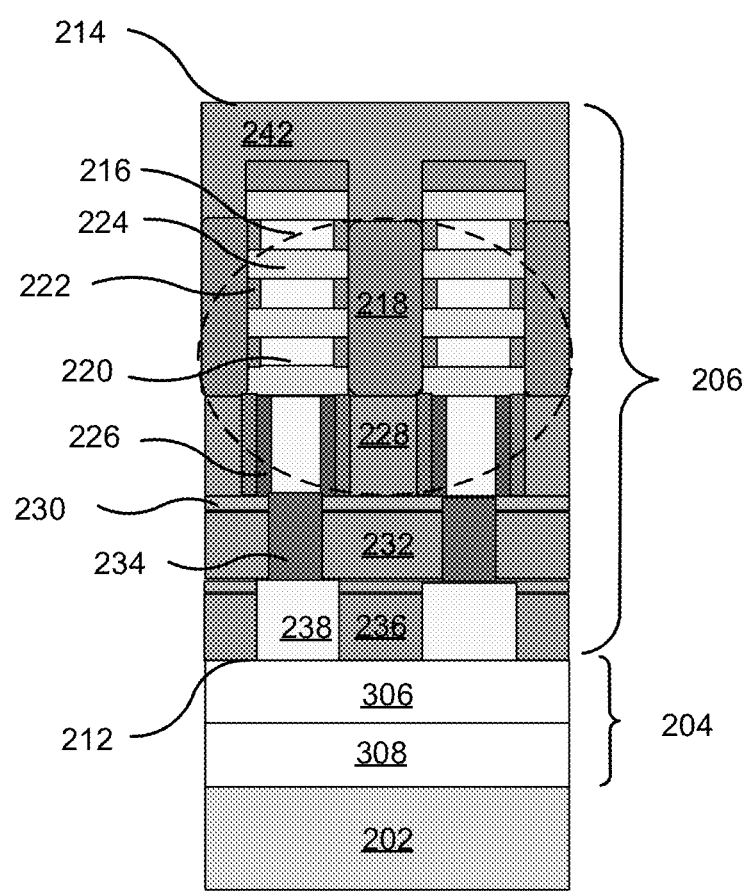
Figure 3J:
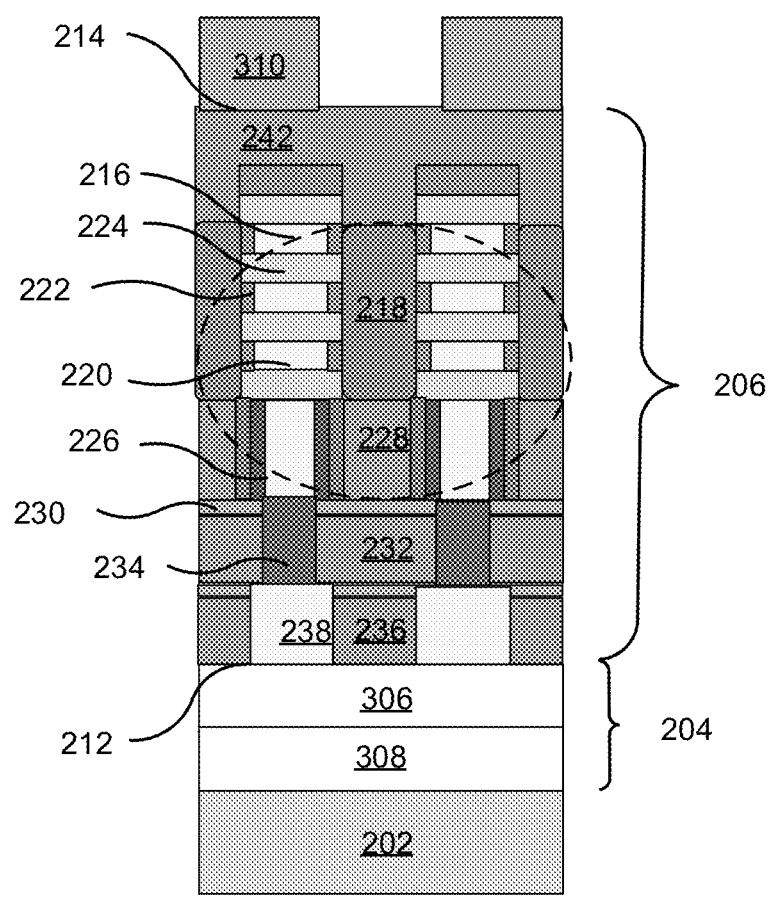
Figure 3K:
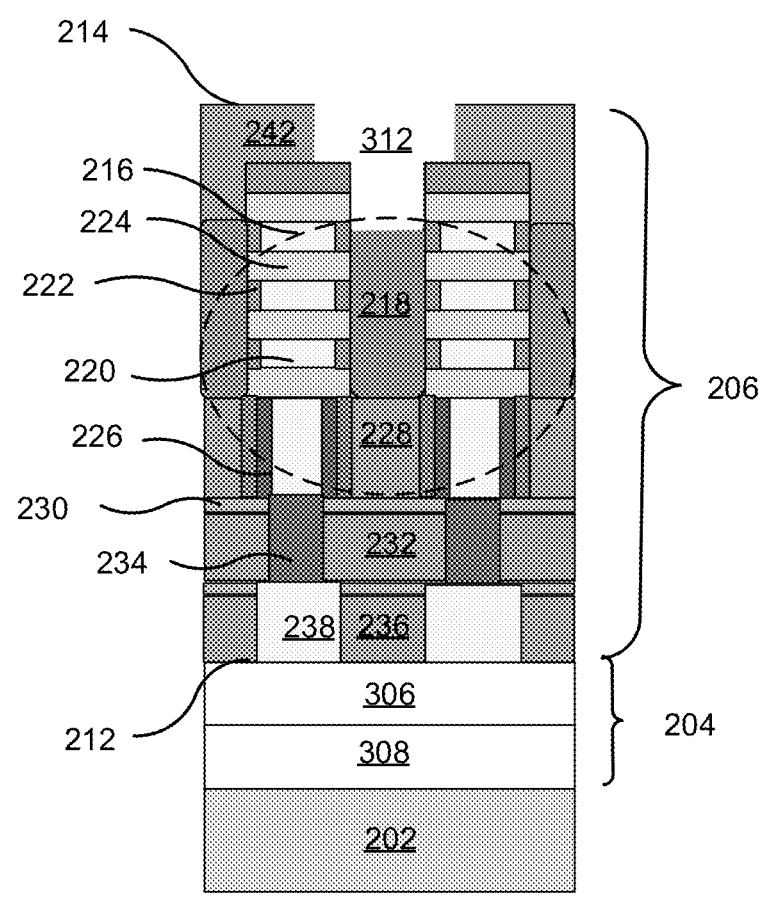
Figure 3L:
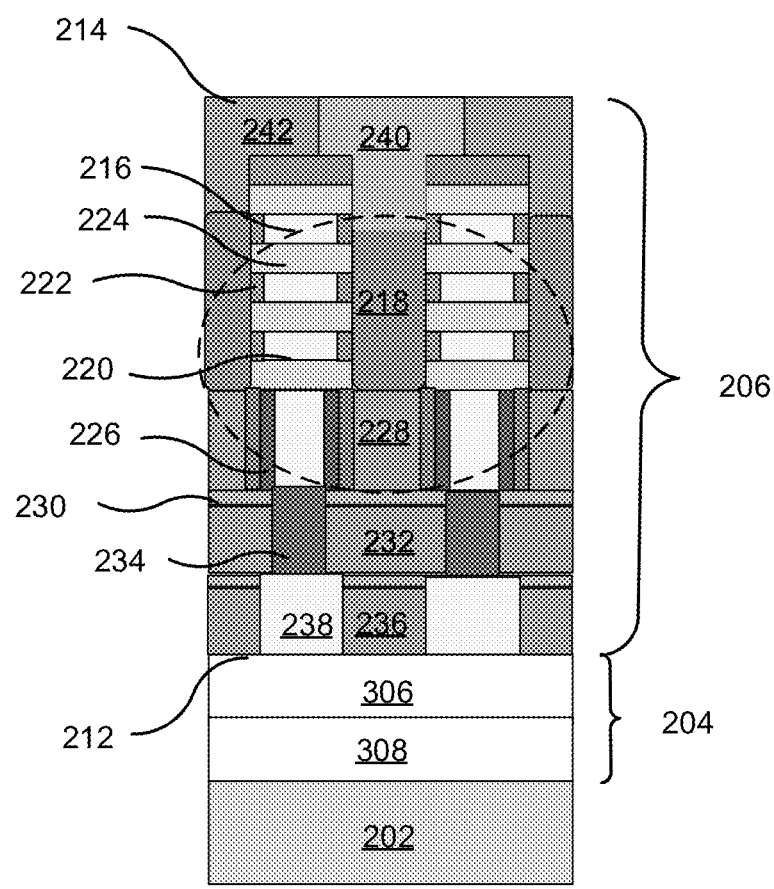
Figure 3M:
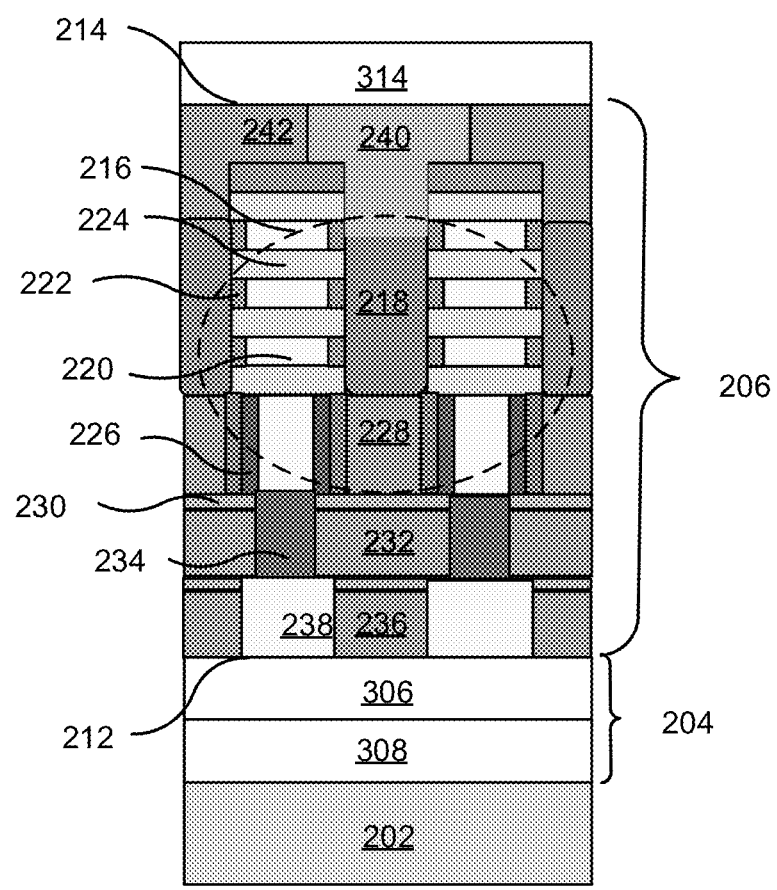
Figure 3N:
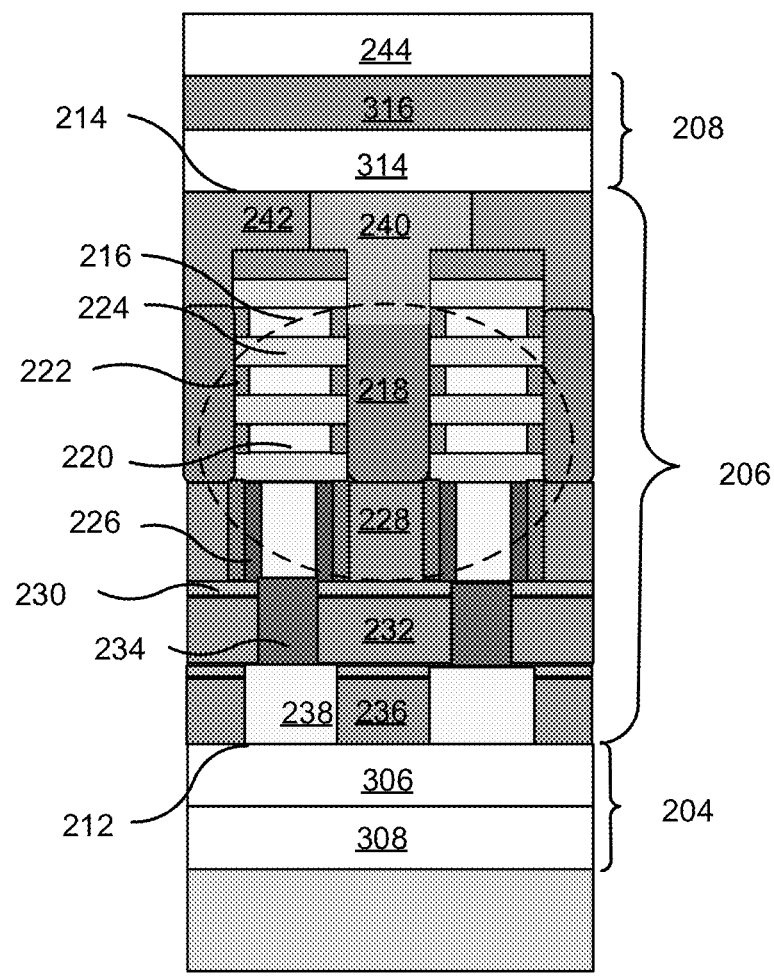
Figure 3O:
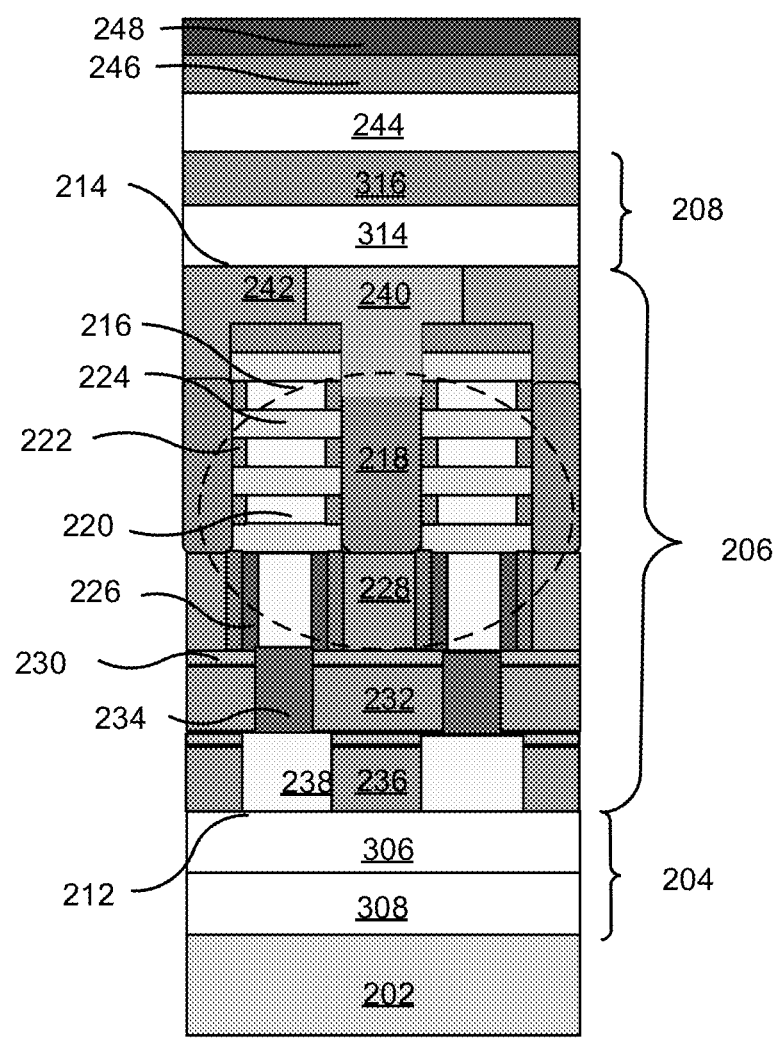
Figure 3P:
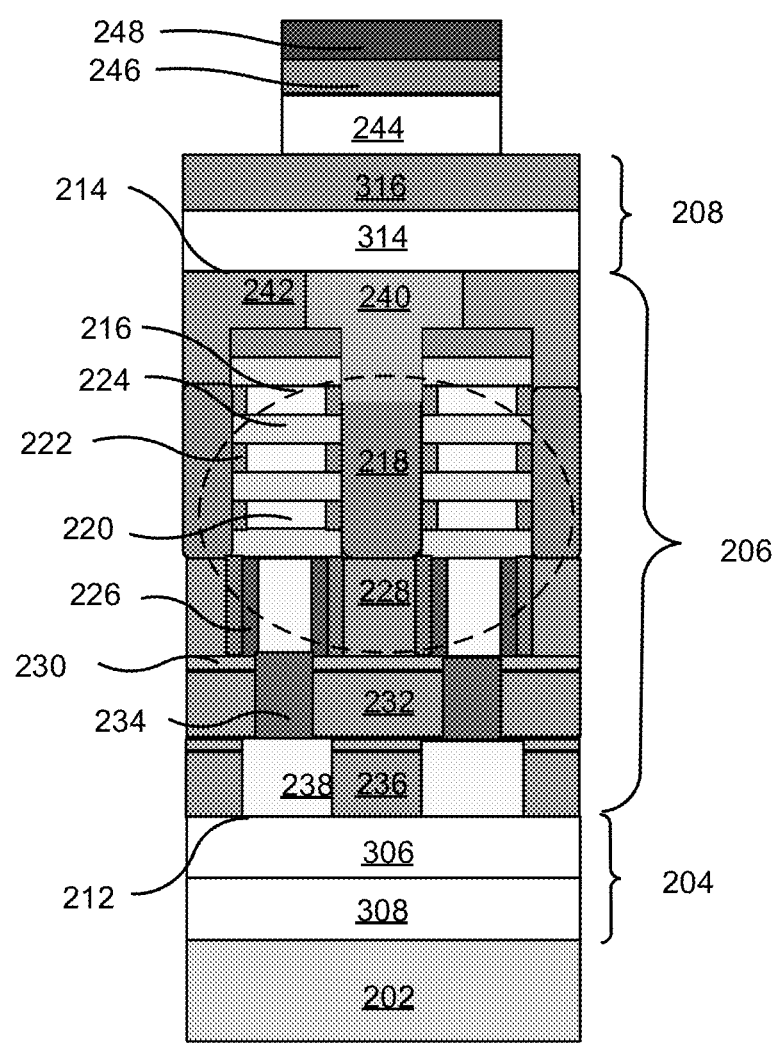
Figure 3Q:
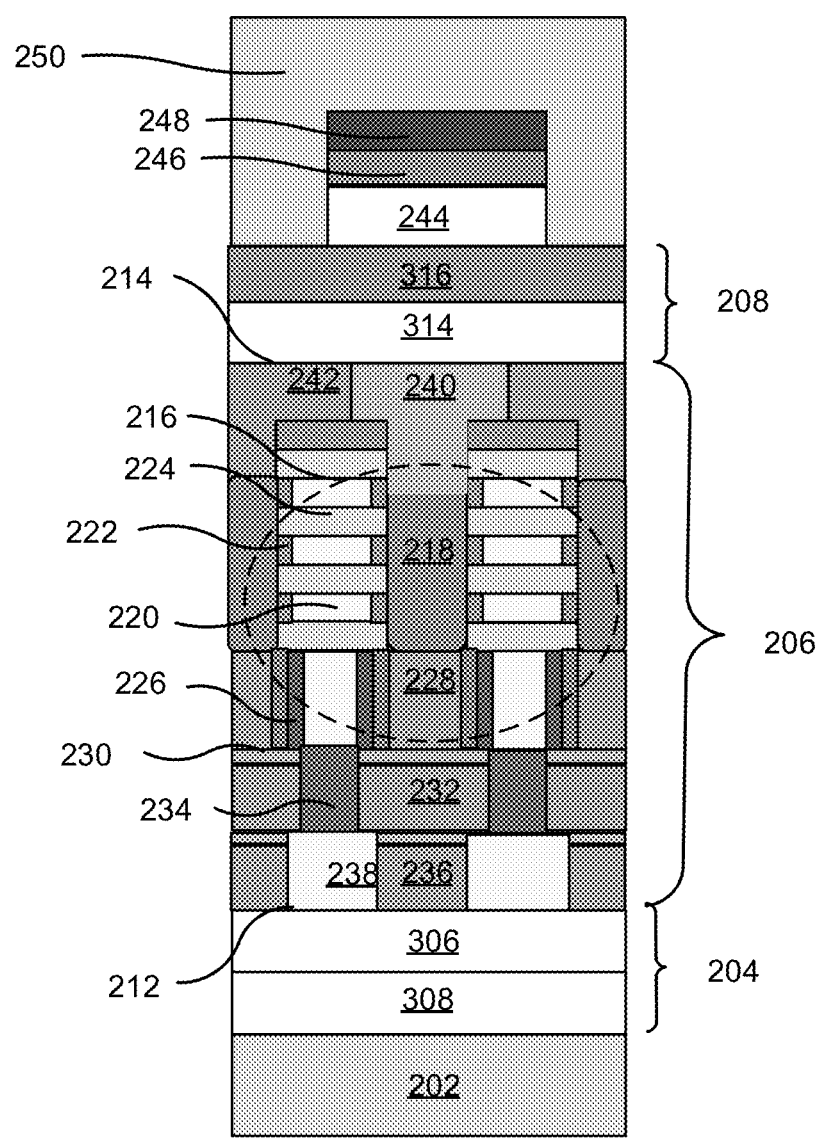
Figure 3R:
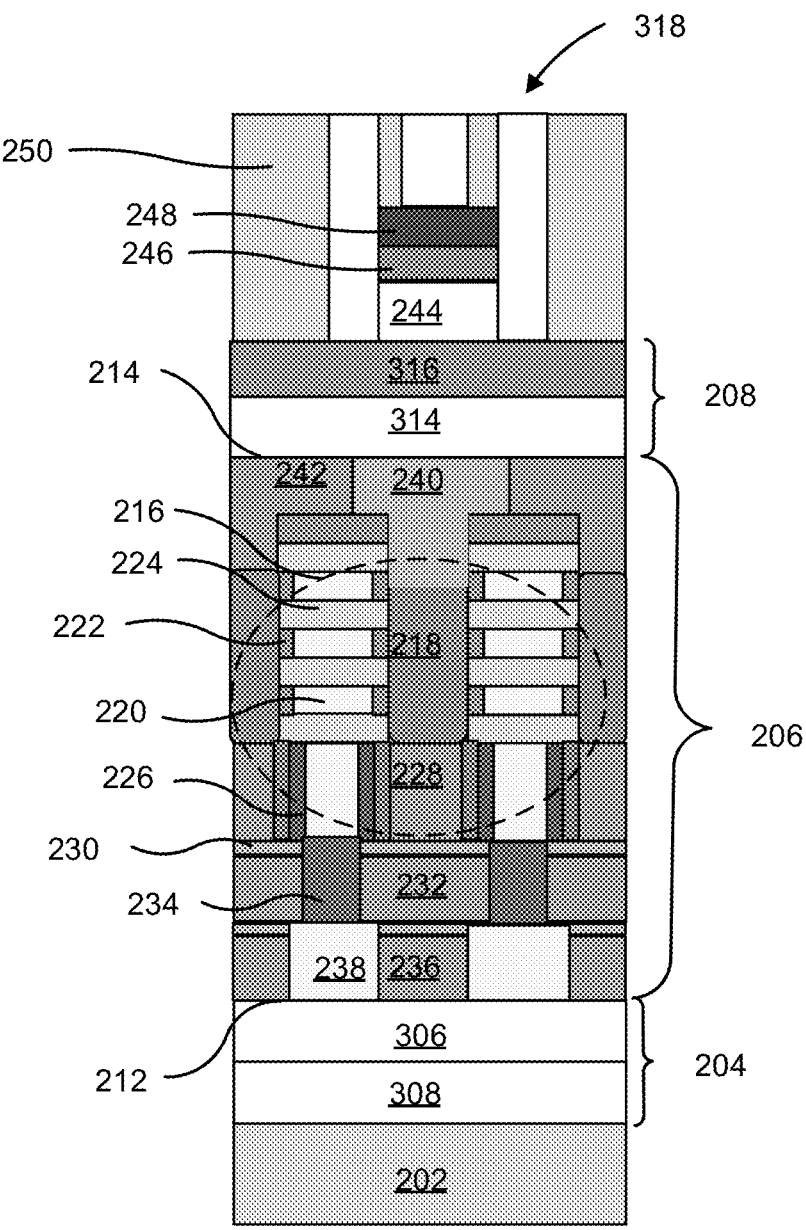
Figure 3S:
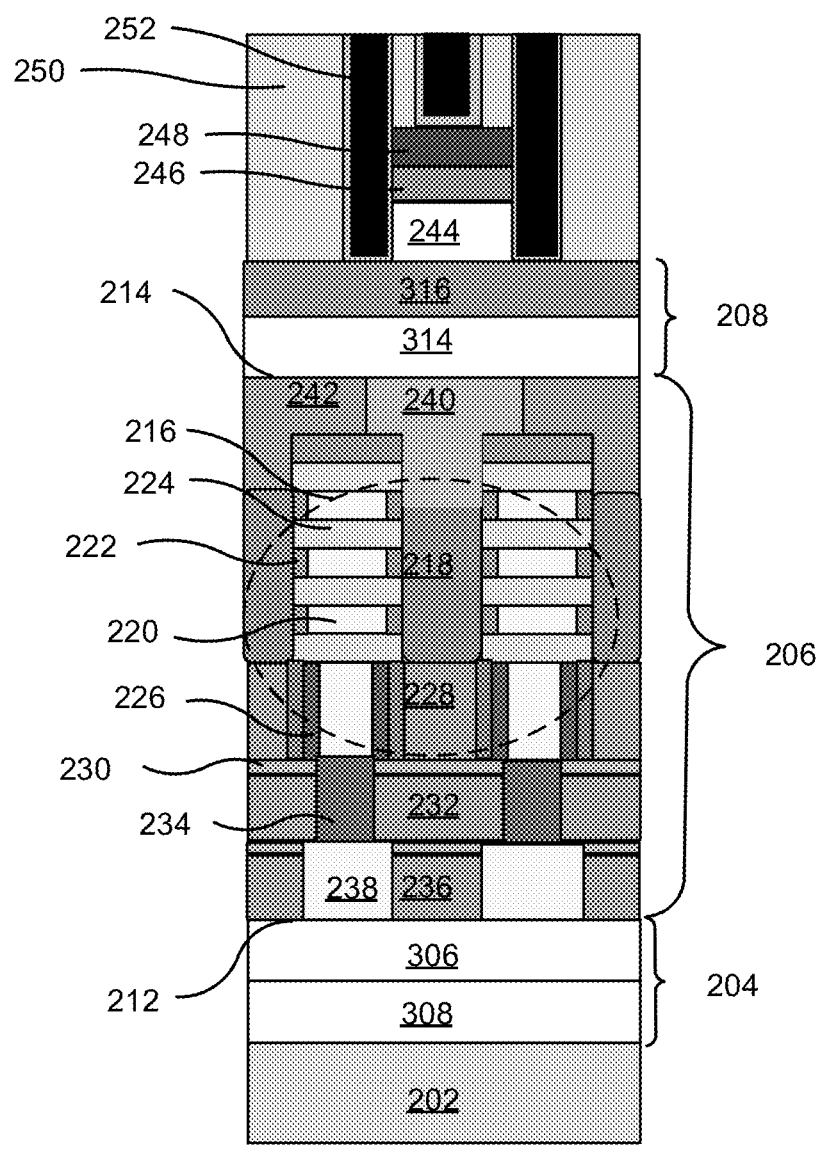
Figure 3T:
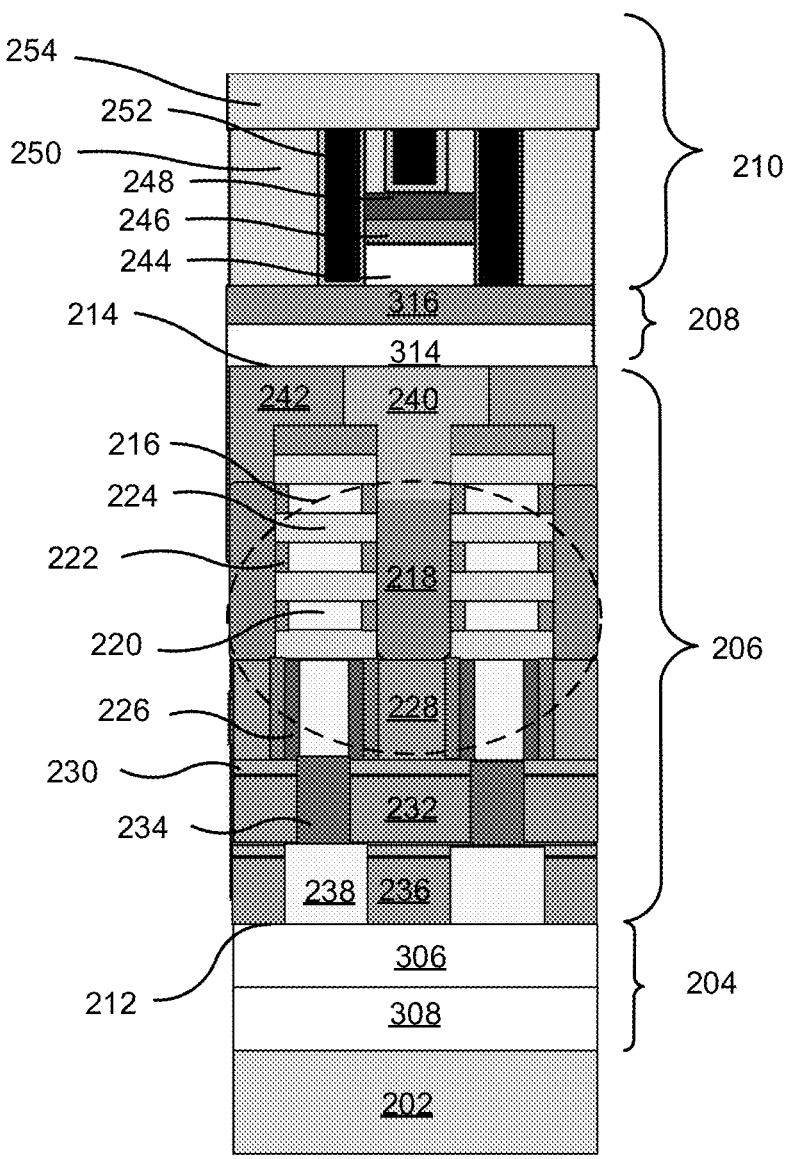
Figure 3U:
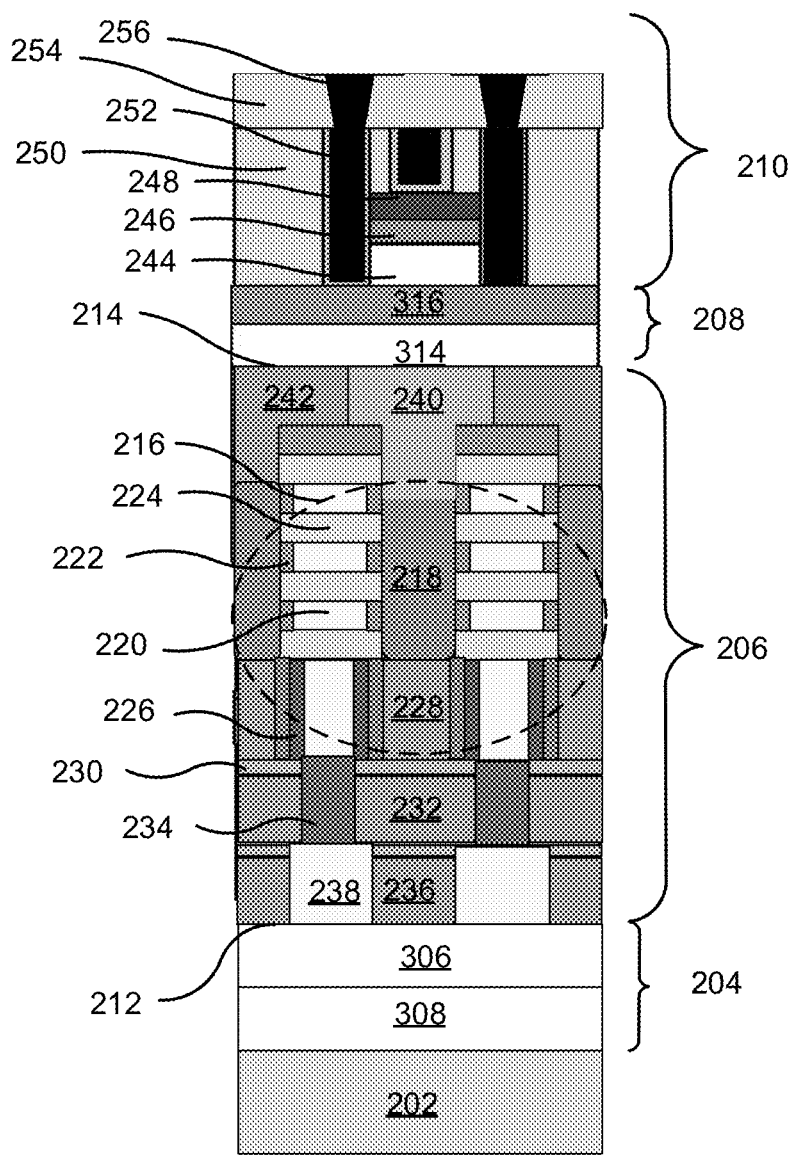
Figure 3V:
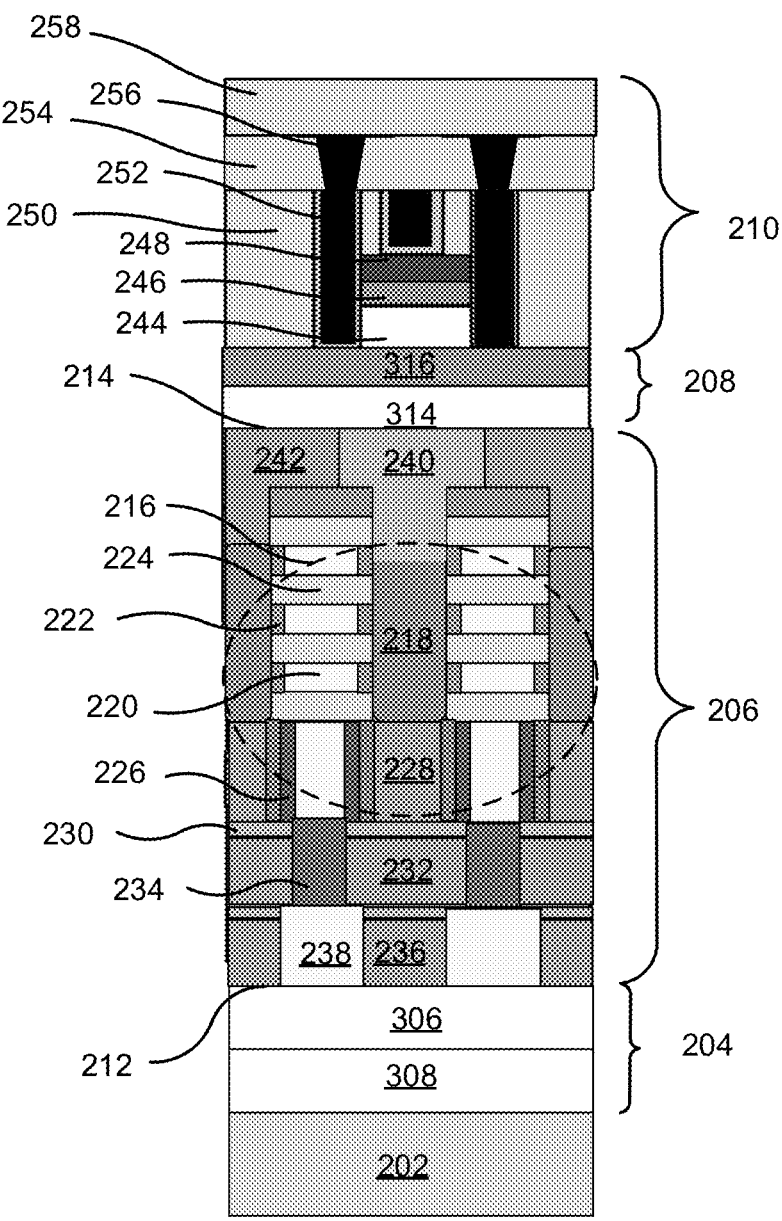
Figure 3W:
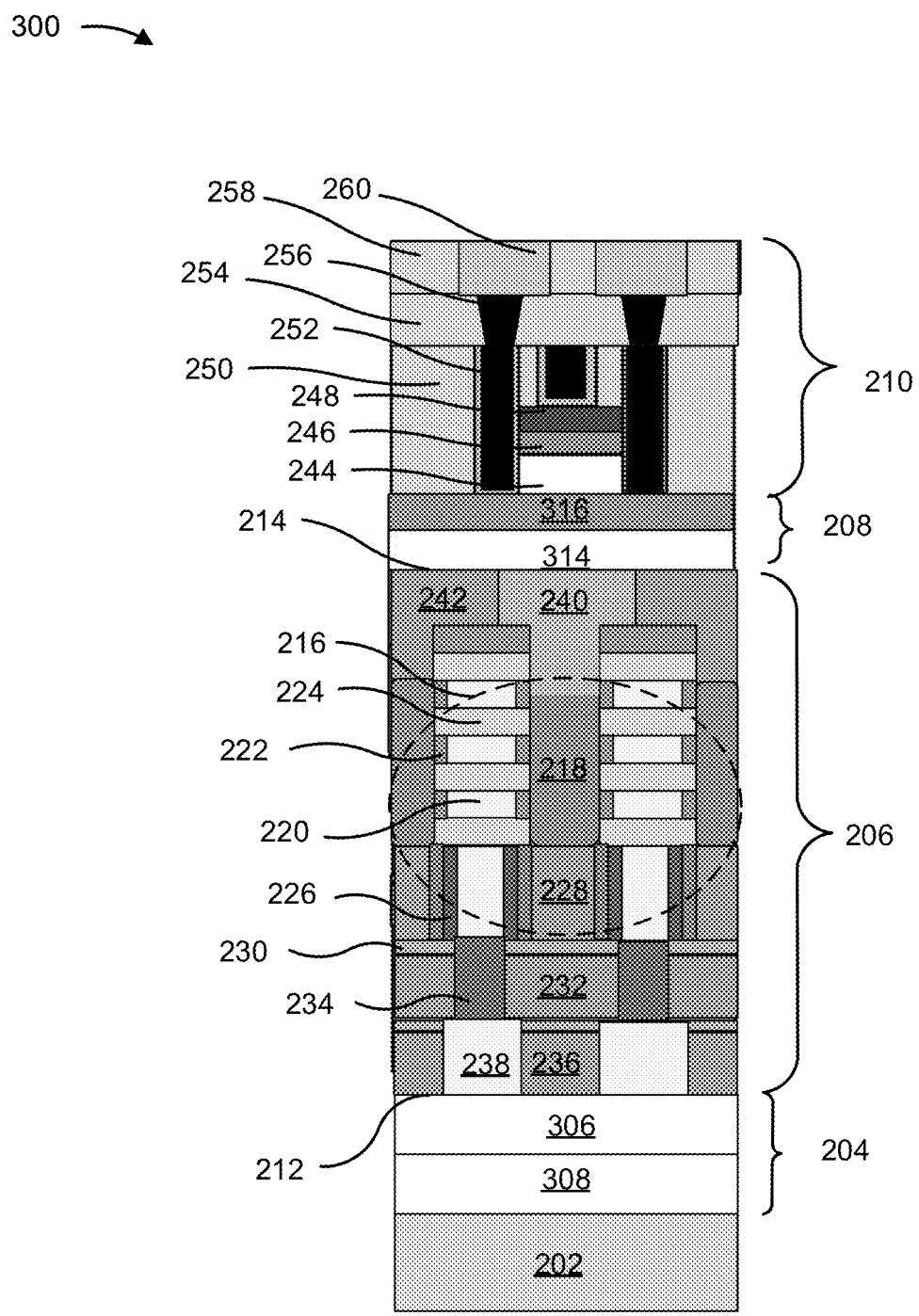

FIGS. 3A-3W are diagrams of an example implementation 300 described herein. Example implementation 300 may be an example process for forming a semiconductor structure (e.g., semiconductor structure 200A). The semiconductor structure may include a memory device (e.g., memory device 210) and a logic device (e.g., logic device 206). The semiconductor structure may include one or more additional devices, structures, and/or layers not shown in FIGS. 3A-3W.

As shown in FIG. 3A, example implementation 300 may include forming a wafer 302. In some implementations, a deposition tool (e.g., deposition tool 102) may deposit a silicon-based structure 264 on a silicon-based structure 304 of the semiconductor structure 200. In some implementations, the deposition tool may deposit a silicon-based structure 262 on the silicon-based structure 264 of the semiconductor structure 200. In some implementations, the deposition tool may use chemical vapor deposition or physical vapor deposition, among other examples, to deposit the silicon-based structure 264 and/or the silicon-based structure 262 onto the silicon silicon-based structure 304 of the semiconductor structure 200A. In some implementations, the silicon-based structure 264 may include an insulating material, such as silicon germanium. In some implementations, the wafer 302 may include an SOI wafer.

As shown in FIG. 3B, example implementation 300 may include forming a GAA FET 216 on the wafer 302. In some implementations, a deposition tool (e.g., deposition tool 102) and an etching tool (e.g., etching tool 104) may deposit and etch layers and/or structures of the GAA FET 216 to form the GAA FET 216. In some implementations, the deposition tool may deposit a layer of material of the GAA FET 216 and the etching tool may remove a portion of the layer of material to form the layers and/or structures of the GAA FET 216 as described herein. In some implementations, a planarization tool (e.g., planarization tool 106) may polish and/or planarize layers of the materials of the GAA FET 216 between deposition and/or etching processes. In some implementations, the deposition tool may use chemical vapor deposition or physical vapor deposition, among other examples, to deposit the layers and/or structures of the GAA FET 216 onto the wafer 302 of the semiconductor structure 200A.

In some implementations, the deposition tool, the etching tool, and/or the planarization tool may form the GAA FET in a front-end-of-line process. As described herein, the GAA FET 216 may include one or more source/drains 218 (e.g., an epitaxial layer), one or more gates 220, spacers 222, silicon-based layers 224, dielectric liners 226, and/or an inter-layer dielectric 228, among other examples.

As shown in FIG. 3C, example implementation 300 may include forming a silicon-based layer 230 on the inter-layer dielectric 228. In some implementations, a deposition tool (e.g., deposition tool 102) may deposit a silicon-based layer 230 on the inter-layer dielectric 228 and/or on the gate stack structure. The deposition tool may deposit the silicon-based layer 230 to provide a barrier between the inter-layer dielectric 228 and one or more materials on the silicon-based layer 230 (e.g., an inter-layer dielectric 232 and/or one or more conductive structures 234). In some implementations, a planarization tool (e.g., planarization tool 106) may polish and/or planarize the silicon-based layer 230.

Example implementation 300 may include forming one or more conductive structures 234 within an inter-layer dielectric 232 and on the GAA FET 216. In some implementations, a deposition tool (e.g., deposition tool 102) and an etching tool (e.g., etching tool 104) may form the one or more conductive structures 234 within the inter-layer dielectric 232. In some implementations, the deposition tool may use chemical vapor deposition or physical vapor deposition, among other examples, to deposit the inter-layer dielectric 232 and the one or more conductive structures 234. In some implementations, the deposition tool may deposit the inter-layer dielectric 232 on the silicon-based layer 230. The etching tool may remove one or more portions of the inter-layer dielectric 232 and the silicon-based layer 230 to form one or more recesses extending through the inter-layer dielectric 232 and the silicon-based layer 230 to the GAA FET 216. The deposition tool may deposit the one or more conductive structures 234 within the recess to provide an electrical connection to the GAA FET 216 through the inter-layer dielectric 232 and the silicon-based layer 230. In some implementations, a planarization tool (e.g., planarization tool 106) may polish and/or planarize material after depositing the inter-layer dielectric 232, after etching the inter-layer dielectric 232, and/or after depositing the one or more conductive structures 234.

Example implementation 300 may include forming another silicon-based layer 230 on the inter-layer dielectric 232. In some implementations, the deposition tool may deposit a silicon-based layer 230 on the inter-layer dielectric 232 and/or on the one or more conductive structures 234. The deposition tool may deposit the silicon-based layer 230 to provide a barrier between the inter-layer dielectric 232 and one or more materials on the silicon-based layer 230 (e.g., an inter-layer dielectric 236 and/or one or more conductive structures 238). In some implementations, a planarization tool (e.g., planarization tool 106) may polish and/or planarize the silicon-based layer 230.

Example implementation 300 may include forming the one or more conductive structures 238 within the inter-layer dielectric 236 and on conductive structures 234. In some implementations, the deposition tool may deposit the inter-layer dielectric 236 and the etching tool may remove one or more portions of the inter-layer dielectric 236 and the silicon-based layer 230 to form one or more recesses extending through the inter-layer dielectric 236 and the silicon-based layer 230 to the one or more conductive structures 234. The deposition tool may deposit the one or more conductive structures 238 within the one or more recesses to provide an electrical connection to the one or more conductive structures 234 through the inter-layer dielectric 236 and the silicon-based layer 230. As shown in FIG. 3C, the inter-layer dielectric 236 and the conductive structure 238 are formed at a side 212 of the logic device 206. In some implementations, a planarization tool (e.g., planarization tool 106) may polish and/or planarize material after depositing the inter-layer dielectric 236, after etching the inter-layer dielectric 236, and/or after depositing the one or more conductive structures 238.

In some implementations, the etching tool may remove a portion of the inter-layer dielectric 236, the inter-layer dielectric 232, the silicon-based layer 230, and/or the inter-layer dielectric 228 to form a recess that extends to the source/drain 218 from the side 212 of the logic device 206. The deposition tool may deposit conductive material into the recess to form a conductive structure that provides an electrical connection to the source/drain 218 from the side 212 of the logic device 206. In this way, the electrical connection to the source/drain 218 may be used as a source/drain terminal for the logic device 206.

As shown in FIG. 3D, example implementation 300 may include forming a high density plasma oxide-based structure 306 at the side 212 of the logic device 206. In some implementations, a deposition tool (e.g., deposition tool 102) may deposit the high density plasma oxide-based structure 306 on the inter-layer dielectric 236 and the conductive structure 238 of the logic device 206. In some implementations, the deposition tool may use chemical vapor deposition or physical vapor deposition, among other examples, to deposit the high density plasma oxide-based structure 306 on the inter-layer dielectric 236 and the conductive structure 238 of the logic device 206. In some implementations, a planarization tool (e.g., planarization tool 106) may polish and/or planarize the high density plasma oxide-based structure 306 after deposition.

As shown in FIG. 3E, example implementation 300 may include bonding a carrier wafer 202, at the side 212 of the logic device 206, via a thermal oxide-based structure 308 and the high density plasma oxide-based structure 306. In some implementations, a deposition tool (e.g., deposition tool 102) may deposit the thermal oxide-based structure 308 on the high density plasma oxide-based structure 306. In some implementations, the deposition tool may use chemical vapor deposition or physical vapor deposition, among other examples, to deposit the thermal oxide-based structure 308 on the high density plasma oxide-based structure 306. In some implementations, a planarization tool (e.g., planarization tool 106) may polish and/or planarize the high density plasma oxide-based structure 308 after deposition.

In some implementations, the carrier wafer 202 may be disposed on the thermal oxide-based structure 308 and a bonding tool (e.g., bonding tool 108) may bond the carrier wafer 202 to the thermal oxide-based structure 308. In some implementations, the bonding tool may bond the carrier wafer 202 to the thermal oxide-based structure 308 via application of heat.

As shown in FIG. 3F, example implementation 300 may include flipping a structure that includes the wafer 302, the logic device 206, the dielectric structure 204, and the carrier wafer 202 such that wafer 302 is now positioned above the logic device 206 rather than below the logic device 206. In other words, the structure that includes the wafer 302, the logic device 206, the dielectric structure 204, and the carrier wafer 202 may be reoriented with the carrier wafer 202 as a bottom layer of the structure. In some implementations, the wafer/die transport tool 114 may flip the structure that includes the wafer 302, the logic device 206, the dielectric structure 204, and the carrier wafer 202.

As shown in FIG. 3G, example implementation 300 may include removing a portion of the wafer 302. In some implementations, a planarization tool (e.g., planarization tool 106) may polish and/or planarize the wafer 302 to remove the portion of the wafer 302 and/or an etching tool (e.g., etching tool 104) may etch the portion of the wafer 302. For example, the planarization tool may remove the silicon-based structure 264 and the silicon-based structure 304 from the wafer 302.

As shown in FIG. 3H, example implementation 300 may include removing a remaining portion of the wafer 302 and/or a portion of the source/drain 218. In some implementations, an etching tool (e.g., etching tool 104) may etch the remaining portion of the wafer 302 and/or the portion of the source/drain 218. As further shown in FIG. 3H, etching the portion of the source/drain 218 may form one or more recesses around an upper portion of a gate structure. For example, etching the portion of the source/drain 218 may form one or more recesses around a spacer 222 and a silicon-based structure 224 that extend above a surface of a remaining portion of the source/drain 218.

As shown in FIG. 3I, example implementation 300 may include forming a dielectric structure 242 within the recesses around the upper portion of the gate structure and on the gate structure. In some implementations, a deposition tool (e.g., deposition tool 102) may use chemical vapor deposition or physical vapor deposition, among other examples, to deposit the dielectric structure 242 around the upper portion of the gate structure and on the gate structure. An upper surface of the dielectric structure 242 may form the side 214 of the logic device 206. In implementations, a planarization tool (e.g., planarization tool 106) may polish and/or planarize the dielectric structure 242 after deposition.

As shown in FIG. 3J, example implementation 300 may include forming a contact photo pattern on the dielectric structure 242. In some implementations, a deposition tool (e.g., deposition tool 102) may use chemical vapor deposition or physical vapor deposition, among other examples, to deposit a photoresist structure 310 onto the dielectric structure 242 in a contact photo pattern. The photoresist structure 310 may be configured to prevent etching of material below the photoresist structure 310. In this way, material that is not below the photoresist structure 310 may be removed without removing the material below the photoresist structure 310.

As shown in FIG. 3K, example implementation 300 may include removing a portion of the dielectric structure 242 to form a recess 312 within the dielectric structure 242. In some implementations, an etching tool (e.g., etching tool 104) and/or an exposure tool (e.g., exposure tool 112) may etch a portion of the dielectric structure 242 to form the recess 312 based on the contact photo pattern on the dielectric structure 242. In some implementations, the recess may extend from the side 214, through the dielectric structure 242, to the source/drain 218. After removing the portion of the dielectric structure, one or more semiconductor processing tools (e.g., etching tool 104) may remove the photoresist structure 310.

As shown in FIG. 3L, example implementation 300 may include forming a conductive structure 240 within the dielectric structure 242. In some implementations, a deposition tool (e.g., deposition tool 102) may use chemical vapor deposition or physical vapor deposition, among other examples, to deposit the conductive structure 240 into the recess 312. In some implementations, a planarization tool (e.g., planarization tool 106) may polish and/or planarize the conductive structure 240 and/or the dielectric structure 242 after deposition.

As shown in FIG. 3M, example implementation 300 may include forming a dielectric layer 314 on the dielectric structure 242 and the conductive structure 240 at the side 214 of the logic device 206. In some implementations, a deposition tool (e.g., deposition tool 102) may use chemical vapor deposition or physical vapor deposition, among other examples, to deposit the dielectric layer 314 onto the dielectric structure 242 and the conductive structure 240. In some implementations, a planarization tool (e.g., planarization tool 106) may polish and/or planarize the dielectric layer 314 after deposition.

As shown in FIG. 3N, example implementation 300 may include forming a dielectric layer 316 on the dielectric layer 314 and forming a dielectric structure 244 on the dielectric layer 316. In some implementations, a deposition tool (e.g., deposition tool 102) may use chemical vapor deposition or physical vapor deposition, among other examples, to deposit the dielectric layer 316 onto the dielectric layer 314 and to deposit the dielectric structure 244 onto the dielectric layer 316. In some implementations, the dielectric layer 314 and the dielectric layer 316 may form a dielectric structure 208. In some implementations, a planarization tool (e.g., planarization tool 106) may polish and/or planarize the dielectric layer 314 and/or the dielectric structure 244 after deposition of the dielectric layer 314 and/or the dielectric layer 244.

As shown in FIG. 3O, example implementation 300 may include forming a first memory layer 246 on the dielectric structure 244 and forming a second memory layer 248 on the first memory layer 246. In some implementations, a bonding tool (e.g., bonding tool 108) may bond the first memory layer 246 to the dielectric structure 244. In some implementations, the bonding tool may bond the first memory layer 246 to the dielectric structure 244 via application of heat. Additional example details for forming the first memory layer 246 on the dielectric structure 244 are described with reference to FIGS. 5A-5C. In some implementations, a deposition tool (e.g., deposition tool 102) may use chemical vapor deposition or physical vapor deposition, among other examples, to deposit the second memory layer 248 onto the first memory layer 246. In some implementations, a planarization tool (e.g., planarization tool 106) may polish and/or planarize the second memory layer 248 after deposition of the second memory layer 248.

As shown in FIG. 3P, example implementation 300 may include removing portions of the dielectric structure 244, the first memory layer 246, and the second memory layer 248. In some implementations, an etching tool (e.g., etching tool 104) may etch the portions of the dielectric structure 244, the first memory layer 246, and the second memory layer 248. In some implementations, a remaining portion of the dielectric structure 244, the first memory layer 246, and the second memory layer 248 may be positioned on (e.g., indirectly on and/or directly above) the GAA FET 216. In some implementations, a planarization tool (e.g., planarization tool 106) may polish and/or planarize the second memory layer 248 after removing the portions of the dielectric structure 244, the first memory layer 246, and the second memory layer 248.

As shown in FIG. 3Q, example implementation 300 may include forming an inter-layer dielectric 250 around the dielectric structure 244, the first memory layer 246, and the second memory layer 248 and on the dielectric structure 208. In some implementations, a deposition tool (e.g., deposition tool 102) may use chemical vapor deposition or physical vapor deposition, among other examples, to deposit the inter-layer dielectric 250 around the dielectric structure 244, the first memory layer 246, and the second memory layer 248 and onto the dielectric structure 208. In some implementations, a planarization tool (e.g., planarization tool 106) may polish and/or planarize the inter-layer dielectric 250 after deposition of the inter-layer dielectric 250.

As shown in FIG. 3R, example implementation 300 may include removing portions of the inter-layer dielectric 250 to form recesses 318 within the inter-layer dielectric 250. In some implementations, an etching tool (e.g., etching tool 104) and/or an exposure tool (e.g., exposure tool 112) may etch the portions of the inter-layer dielectric 250 to form the recesses 318. In some implementations, the recesses 318 may extend to lateral sides of the dielectric structure 244, the first memory layer 246, and/or the second memory layer 248 and/or to a top surface of second memory layer 248. In some implementations, one or more of the recesses 318 may extend to the dielectric structure 208.

As shown in FIG. 3S, example implementation 300 may include forming conductive structures 252 within the recesses 318 of the inter-layer dielectric 250. In some implementations, a deposition tool (e.g., deposition tool 102) may use chemical vapor deposition or physical vapor deposition, among other examples, to deposit the conductive structures 252 into the recesses 318 of the inter-layer dielectric 250. For example, the deposition tool may deposit one or more barrier layers or liners and then deposit a conductive material (e.g., a conductive plug) within the recesses 318 (e.g., on the one or more barrier layers or liners). In some implementations, a planarization tool (e.g., planarization tool 106) may polish and/or planarize the inter-layer dielectric 250 and/or the conductive structures 252 after deposition of the conductive structures 252.

As shown in FIG. 3T, example implementation 300 may include forming an inter-layer dielectric 254 on the inter-layer dielectric 250 and/or the conductive structures 252. In some implementations, a deposition tool (e.g., deposition tool 102) may use chemical vapor deposition or physical vapor deposition, among other examples, to deposit the inter-layer dielectric 254 on the inter-layer dielectric 250 and/or the conductive structures 252. In some implementations, a planarization tool (e.g., planarization tool 106) may polish and/or planarize the inter-layer dielectric 254 after deposition of the inter-layer dielectric 254.

As shown in FIG. 3U, example implementation 300 may include forming conductive structures 256 within recesses of the inter-layer dielectric 254. In some implementations, an etching tool (e.g., etching tool 104) and/or an exposure tool (e.g., exposure tool 112) may form recesses within the inter-layer dielectric 254 (e.g., to provide access to the conductive structures 252) and a deposition tool (e.g., deposition tool 102) may use chemical vapor deposition or physical vapor deposition, among other examples, to deposit the conductive structures 256 into the recesses of the inter-layer dielectric 254. In this way, the conductive structures 256 may provide an electrical connection to the conductive structures 252. In some implementations, a planarization tool (e.g., planarization tool 106) may polish and/or planarize the inter-layer dielectric 254 and/or the conductive structures 256 after deposition of the conductive structures 256.

As shown in FIG. 3V, example implementation 300 may include forming an inter-layer dielectric 258 on the inter-layer dielectric 254 and/or the conductive structures 256. In some implementations, a deposition tool (e.g., deposition tool 102) may use chemical vapor deposition or physical vapor deposition, among other examples, to deposit the inter-layer dielectric 258 on the inter-layer dielectric 254 and/or the conductive structures 256. In some implementations, a planarization tool (e.g., planarization tool 106) may polish and/or planarize the inter-layer dielectric 258 after deposition of the inter-layer dielectric 258.

As shown in FIG. 3W, example implementation 300 may include forming conductive structures 260 within recesses of the inter-layer dielectric 258. In some implementations, an etching tool (e.g., etching tool 104) and/or an exposure tool (e.g., exposure tool 112) may form recesses within the inter-layer dielectric 258 (e.g., to provide access to the conductive structures 256) and a deposition tool (e.g., deposition tool 102) may use chemical vapor deposition or physical vapor deposition, among other examples, to deposit the conductive structures 260 into the recesses of the inter-layer dielectric 258. In this way, the conductive structures 260 may provide an electrical connection to the conductive structures 256. In some implementations, a planarization tool (e.g., planarization tool 106) may polish and/or planarize the inter-layer dielectric 258 and/or the conductive structures 260 after deposition of the conductive structures 260.

Based on forming the memory device 210 on the logic device 206 (e.g., indirectly on the logic device 206) and on the dielectric structure 208 (e.g., directly on the dielectric structure 208), the memory device 210 may be insulated from the logic device 206 and a device density may be increased within the semiconductor structure (e.g., semiconductor structure 200A and/or semiconductor structure 200B). The increased device density may facilitate an increased quantity of memory devices and logic devices within the semiconductor structure, and/or may reduce a dimension (e.g., a width and/or volume) of the semiconductor structure.

As indicated above, FIGS. 3A-3W are provided as an example. Other examples may differ from what is described with regard to FIGS. 3A-3W. The number and arrangement of devices, layers, and/or materials shown in FIGS. 3A-3W are provided as an example. In practice, there may be additional devices, layers, and/or materials, fewer devices, layers, and/or materials, different devices, layers, and/or materials, or differently arranged devices, layers, and/or materials than those shown in FIGS. 3A-3W.

FIGS. 4A-4E are diagrams of an example implementation 400 described herein. Example implementation 400 may be an example process for forming a semiconductor structure (e.g., semiconductor structure 200B). The semiconductor structure may include a memory device (e.g., memory device 210) and a logic device (e.g., logic device 206). The semiconductor structure may include one or more additional devices, structures, and/or layers not shown in FIGS. 4A-4E. In some implementations, FIGS. 4A-4E are diagrams of an example for performing alternative operations to those described with reference to FIGS. 3F-3L. In some implementations, one or more semiconductor processing tools may perform the same or similar processes as shown in FIGS. 3A-3E to form the semiconductor structure shown in FIG. 4A.

Figure 4A:
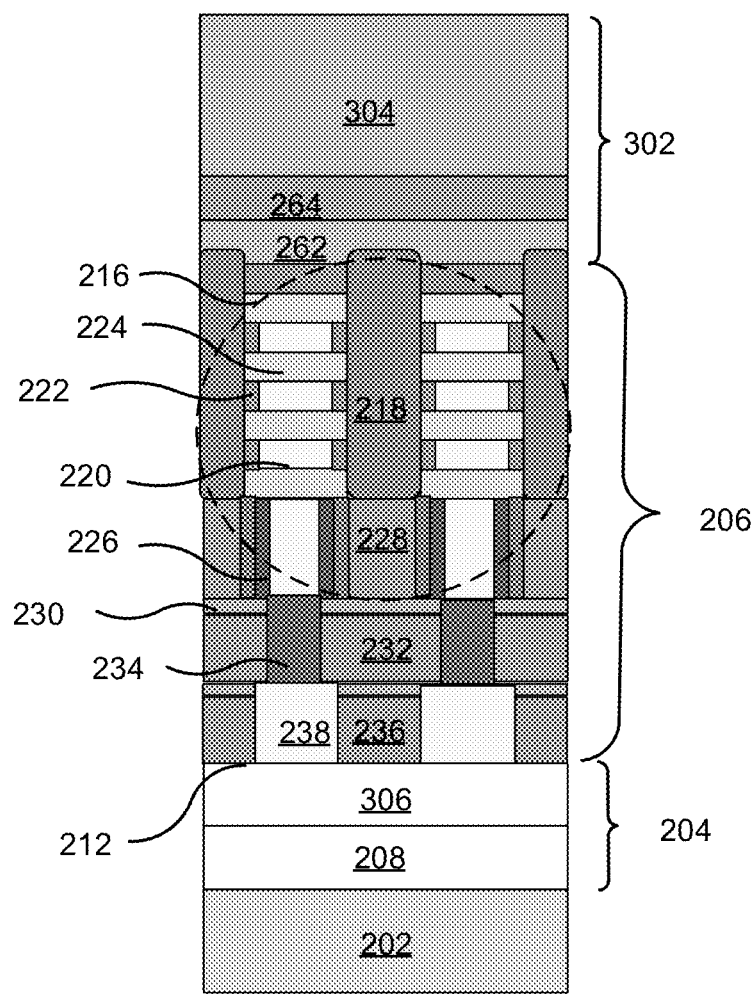
FIGS. 4A-4E are diagrams of an example implementation described herein.

As shown in FIG. 4A, example implementation 400 may include the wafer 302, the logic device 206, the dielectric structure 204, and the carrier wafer 202 with the wafer 302 being on the logic device 206. In some implementations, a structure that includes the wafer 302, the logic device 206, the dielectric structure 204, and the carrier wafer 202 may be reoriented with the carrier wafer 202 as a bottom layer of the structure.

Figure 4B:
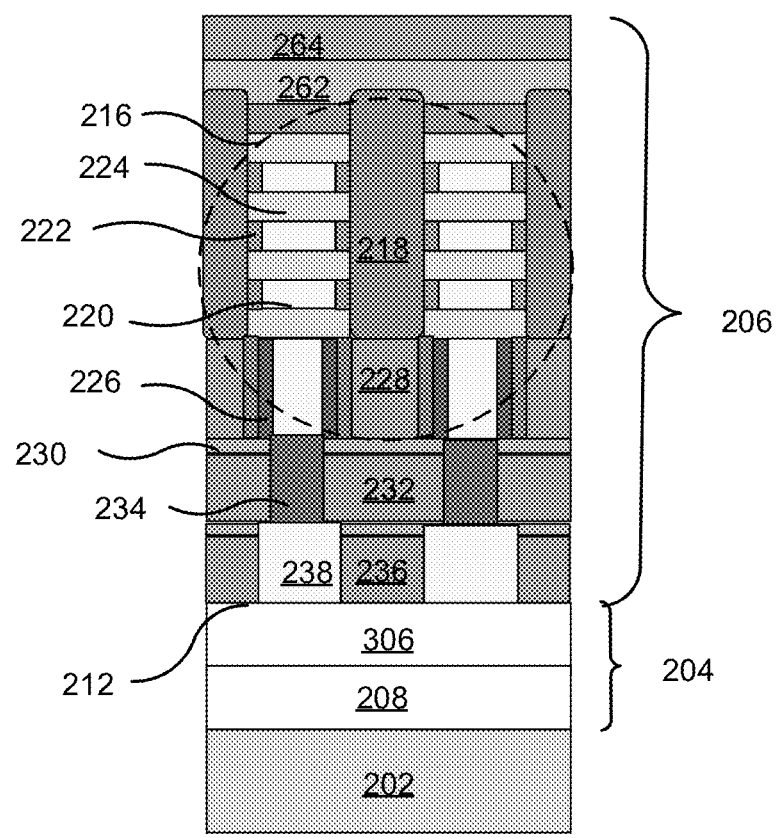

As shown in FIG. 4B, example implementation 400 may include removing a portion of the wafer 302. In some implementations, a planarization tool (e.g., planarization tool 106) may polish and/or planarize the wafer 302 to remove the portion of the wafer 302 and/or an etching tool (e.g., etching tool 104) may etch the portion of the wafer 302. For example, the planarization tool may remove the silicon-based structure 304. In contrast to FIG. 3G, the planarization tool may not remove the silicon-based structure 264. Additionally, the planarization tool may not remove the silicon-based structure 262.

Figure 4C:
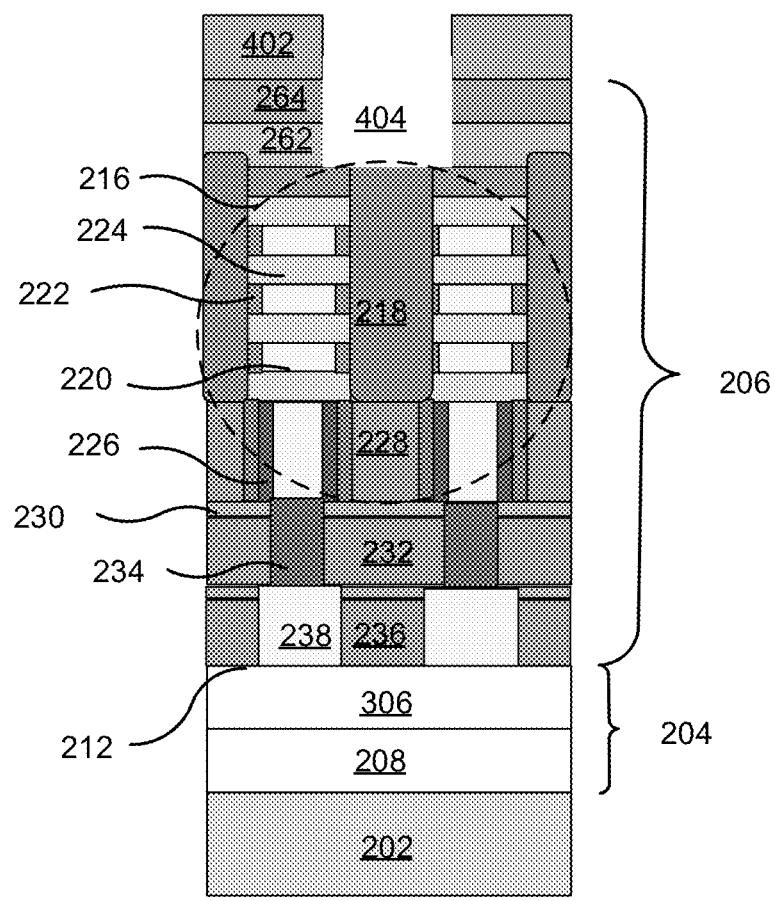

As shown in FIG. 4C, example implementation 400 may include forming a contact photo pattern on the silicon-based structure 264. In some implementations, a deposition tool (e.g., deposition tool 102) may use chemical vapor deposition or physical vapor deposition, among other examples, to deposit a photoresist structure 402 onto the silicon-based structure 264 in a contact photo pattern. The photoresist structure 402 may be configured to prevent etching of material below the photoresist structure 402. In this way, material that is not below the photoresist structure 402 may be removed without removing the material below the photoresist structure 402.

Example implementation 400 may include forming a recess 404 within the silicon-based structure 264 and the silicon-based structure 262. In some implementations, an etching tool (e.g., etching tool 104) and/or an exposure tool (e.g., exposure tool 112) may etch a portion of the silicon-based structure 262 and the portion of the silicon-based structure 264 to form the recess 404. In some implementations, the etching tool and/or the exposure tool may etch a portion of the source/drain 218 to form the recess 404. In some implementations, the recess 404 may extend to the source/drain 218 to provide the recess through the silicon-based structure 264 and the silicon-based structure 262 to the source/drain 218.

Figure 4D:
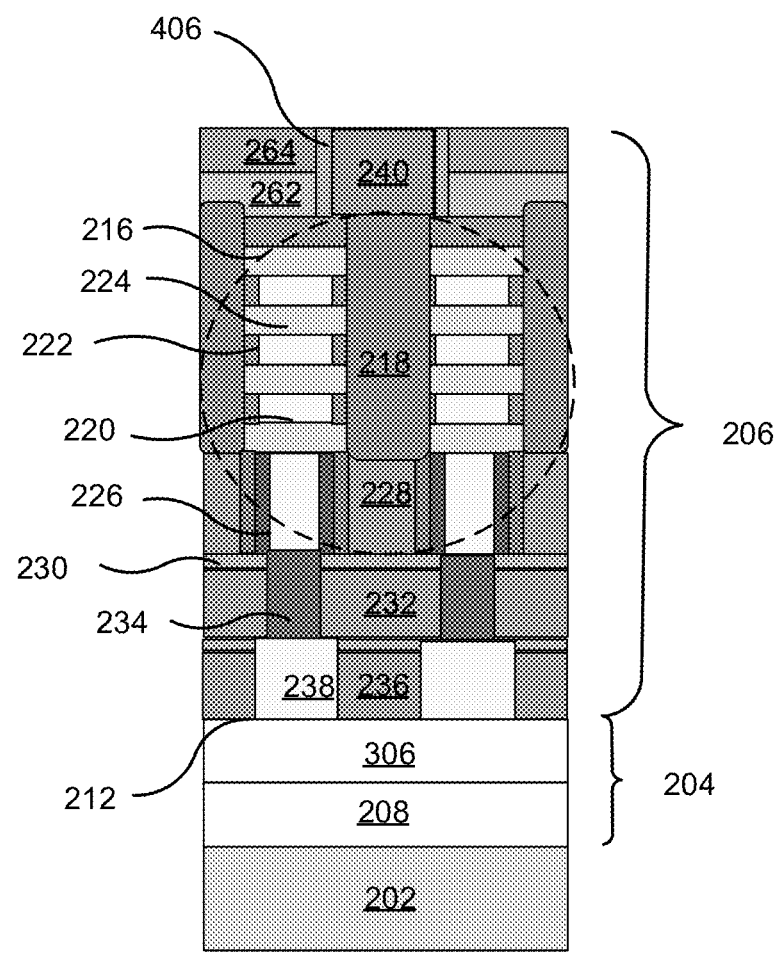

As shown in FIG. 4D, example implementation 400 may include forming a conductive structure 240 and/or a liner 406 within the recess 404. In some implementations, a deposition tool (e.g., deposition tool 102) may use chemical vapor deposition or physical vapor deposition, among other examples, to deposit the liner 406 (e.g., a silicon nitride-based material or a titanium nitride-based material, among other examples) within the recess 404 (e.g., on sidewalls of the recess 404 and not on a bottom surface of the recess 404 or on sidewalls and the bottom surface of the recess 404). The deposition tool may use chemical vapor deposition or physical vapor deposition, among other examples, to deposit the conductive structure 240 into the recess 404 and on the liner 406. In some implementations, a planarization tool (e.g., planarization tool 106) may polish and/or planarize the conductive structure 240, the liner 406, and/or the silicon-based structure 264 after deposition.

Figure 4E:
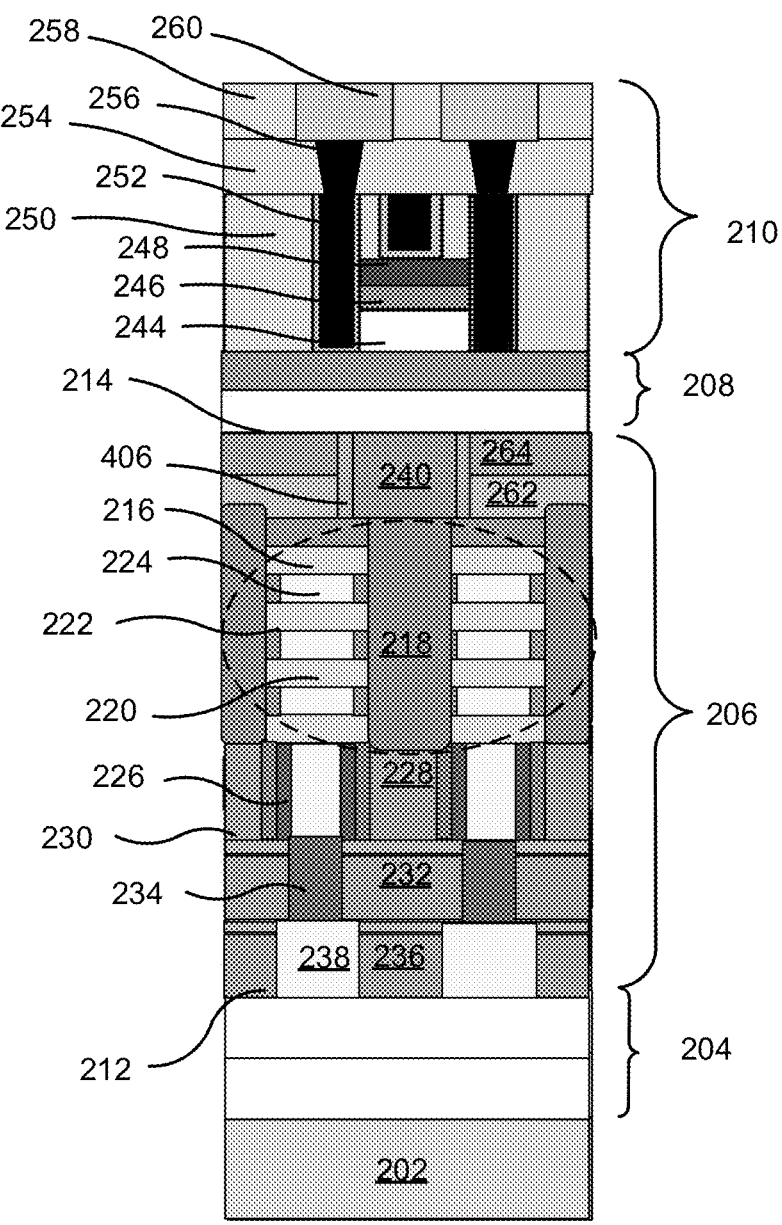

As shown in FIG. 4E, the example implementation 400 may include forming the dielectric structure 208 and the memory device 210 on the logic device 206. In some implementations, one or more semiconductor processing tools may perform the same or similar processes described with reference to FIGS. 3M-3W to form the dielectric structure 208 and the memory device 210 on the logic device 206 of example implementation 400.

Based on using the silicon-based structure 262 and the silicon-based structure 264 as structural support for the conductive structure 240, example implementation 400 may reduce a number of depositions of dielectric material (e.g., to deposit the dielectric structure 242 of semiconductor structure 200A).

As indicated above, FIGS. 4A-4E are provided as an example. Other examples may differ from what is described with regard to FIGS. 4A-4E. The number and arrangement of devices, layers, and/or materials shown in FIGS. 4A-4E are provided as an example. In practice, there may be additional devices, layers, and/or materials, fewer devices, layers, and/or materials, different devices, layers, and/or materials, or differently arranged devices, layers, and/or materials than those shown in FIGS. 4A-4E.

FIGS. 5A-5E are diagrams of an example implementation 500 described herein. Example implementation 500 may be an example process for forming a portion of a semiconductor structure (e.g., semiconductor structure 200A or 200B). The semiconductor structure may include a memory device (e.g., memory device 210) and a logic device (e.g., logic device 206). The semiconductor structure may include one or more additional devices, structures, and/or layers not shown in FIGS. 5A-5E. In some implementations, FIGS. 5A-5E are diagrams of an example for forming the first memory layer 246 and/or bonding the first memory layer 246 to the dielectric structure 244 as described with reference to FIG. 3O.

Figure 5A:
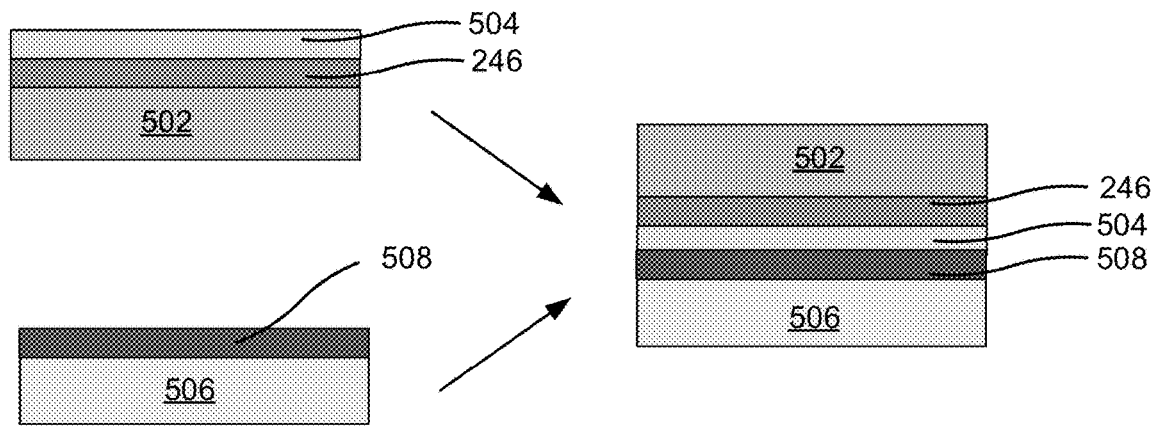
FIGS. 5A-5E are diagrams of an example implementation described herein.

As shown in FIG. 5A, example implementation 500 may include forming the first memory layer 246 (e.g., a tungsten-based layer) on a silicon wafer 502 and forming an adhesion layer 504 on the first memory layer 246. In some implementations, a deposition tool (e.g., deposition tool 102) may use chemical vapor deposition or physical vapor deposition, among other examples, to deposit the first memory layer 246 onto the silicon wafer 502 and to deposit the adhesion layer 504 onto the first memory layer 246. In some implementations, a planarization tool (e.g., planarization tool 106) may polish and/or planarize the first memory layer 246 and/or the adhesion layer 504 after deposition of the first memory layer 246 and/or the adhesion layer 504. Although example implementation 500 is described with reference to a silicon wafer 502, wafers of other materials may be used in place of the silicon wafer 502.

As also shown in FIG. 5A, example implementation 500 may include forming a release layer 508 on a carrier 506 (e.g., a glass carrier). In some implementations, a deposition tool (e.g., deposition tool 102) may use spin coating and/or curing, chemical vapor deposition, or physical vapor deposition, among other examples, to deposit the release layer 508 onto the carrier 506.

As further shown in FIG. 5A, example implementation 500 may include flipping a structure that includes the silicon wafer 502, the first memory layer 246 and the adhesion layer 504 and bonding the first memory layer 246 to the carrier 506 via the adhesion layer 504 and the release layer 508. In some implementations, a bonding tool (e.g., bonding tool 108) may bond the first memory layer 246 to the carrier 506. In some implementation, the bonding tool may bond the first memory layer 246 to the carrier 506 via application of heat.

Figure 5B:
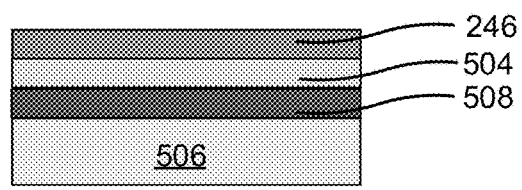

As shown in FIG. 5B, example implementation 500 may include removing the silicon wafer 502 from the first memory layer 246. In some implementations, an etching tool (e.g., etching tool 104), the wafer/die transport tool 114, and/or another semiconductor processing tool may peel away the silicon wafer 502. Removing the silicon wafer 502 may leave the first memory layer 246 exposed on an upper surface of the portion of the semiconductor structure shown in FIG. 5B.

Figure 5C:
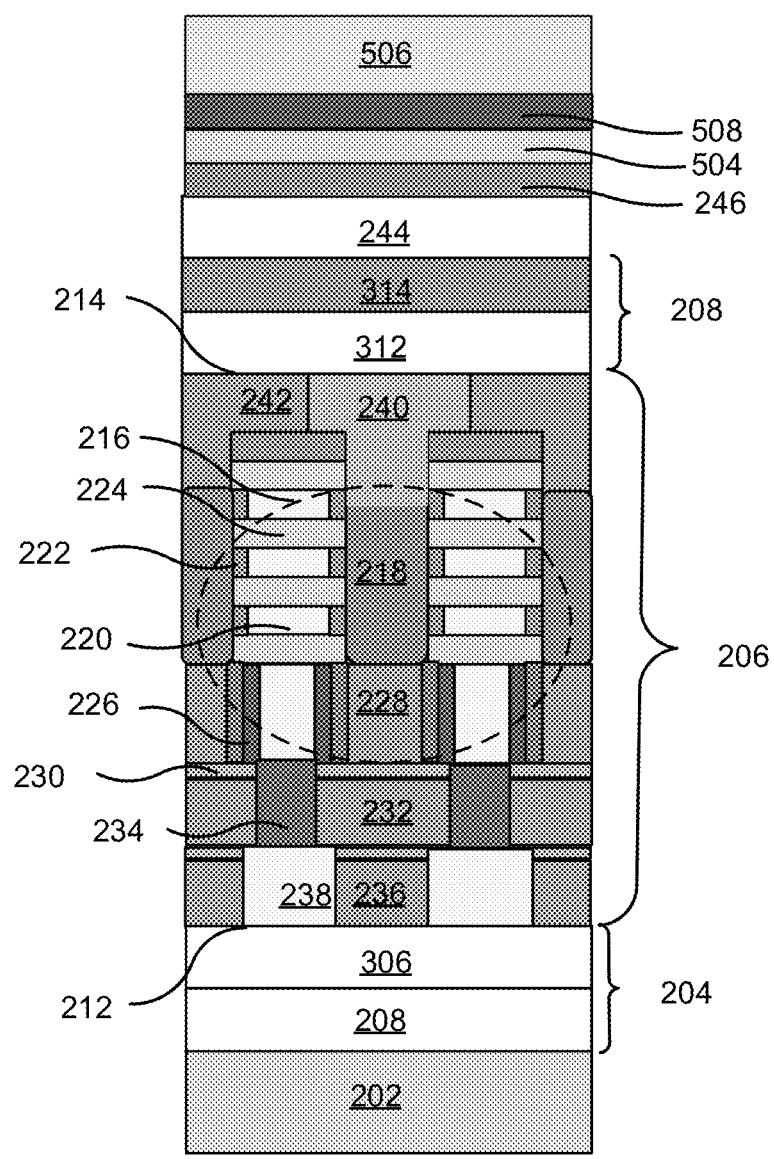

As shown in FIG. 5C, example implementation 500 may include flipping the portion of the semiconductor structure shown in FIG. 5B and bonding the first memory layer 246 to the dielectric structure 244. In some implementations, a bonding tool (e.g., bonding tool 108) may bond the first memory layer 246 to the dielectric structure 244. In some implementations, the bonding tool may bond the first memory layer 246 to the dielectric structure via application of heat.

Figure 5D:
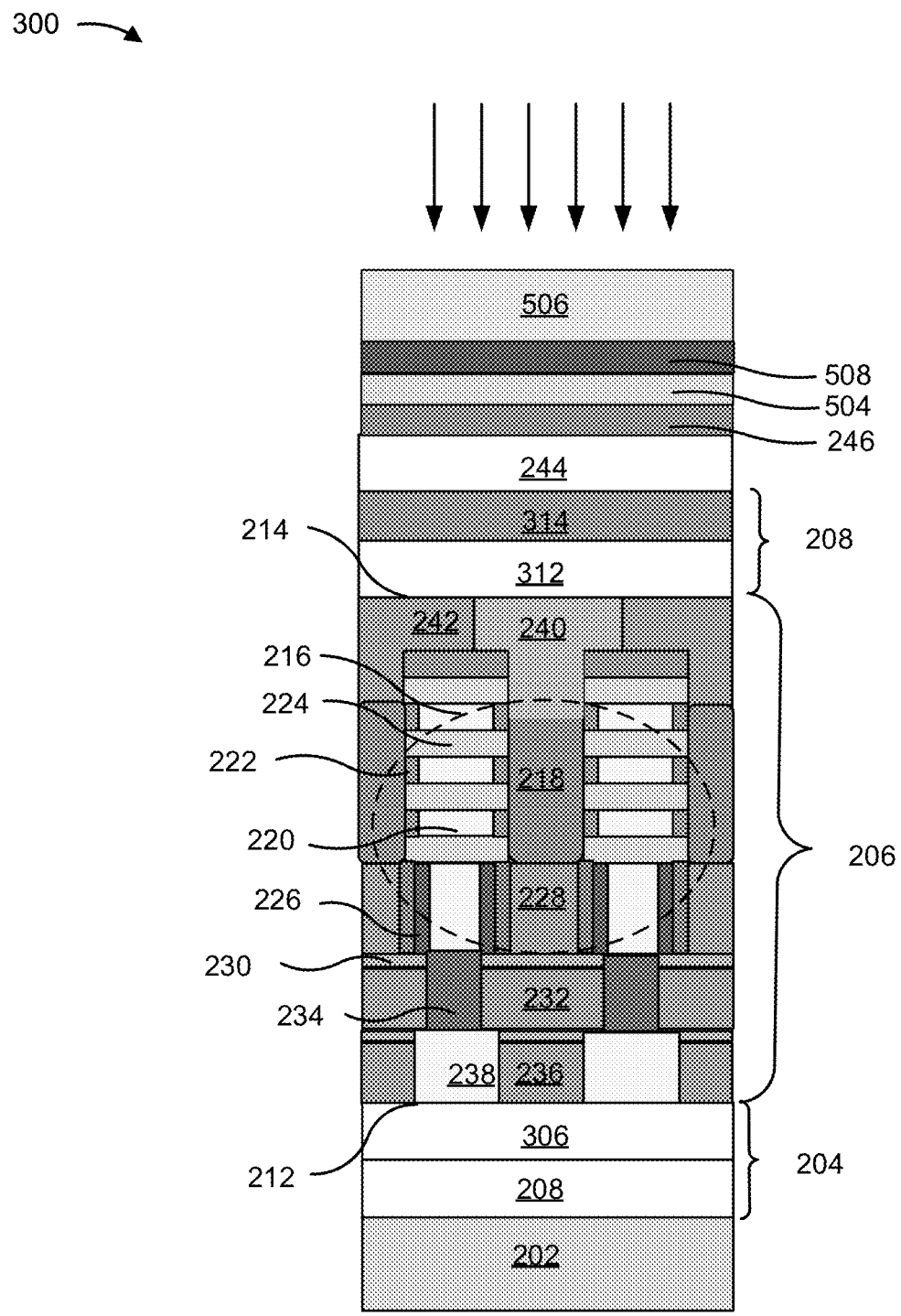

As shown in FIG. 5D, example implementation 500 may expose the carrier 506 to a radiation source. In some implementations, a laser tool (e.g., a laser tool 110) may expose the carrier 506 to a radiation source. In some implementations, radiation may travel through the carrier 506 (e.g., if the carrier is translucent) and may interact with the release layer 508 to melt away the release layer 508 (e.g., to eject release layer material and/or change a physical state of the release layer material (e.g., from a solid to a liquid or from a solid to a gas)).

Figure 5E:
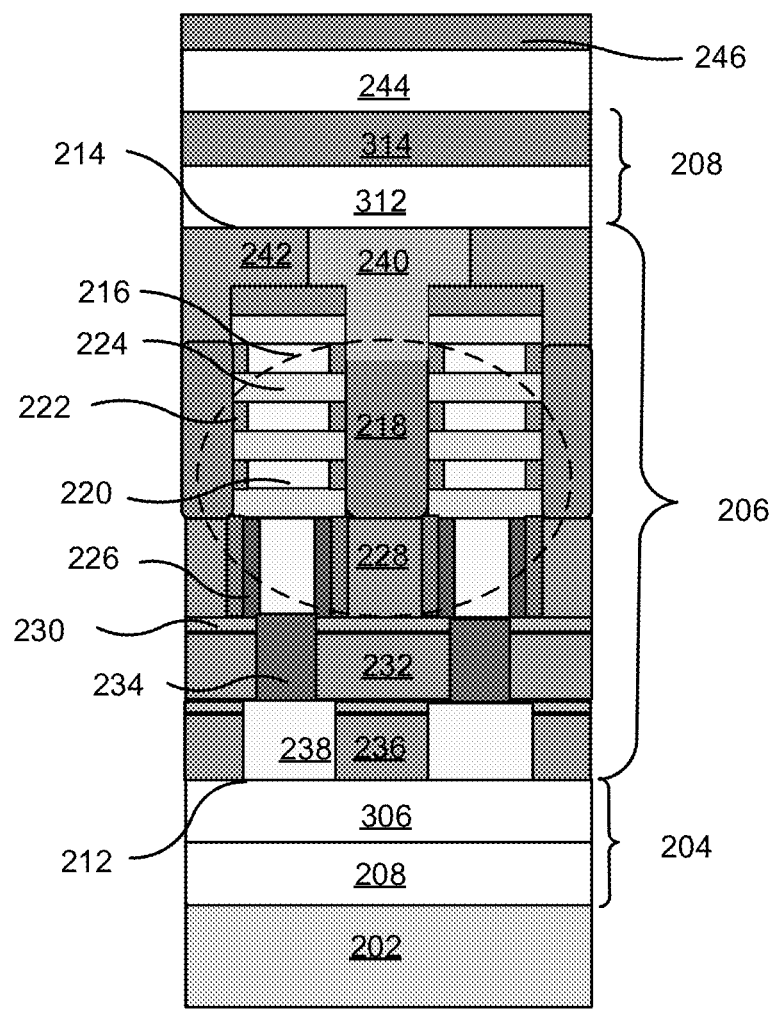

As shown in FIG. 5E, example implementation 500 may include removing the carrier 506 and the adhesion layer 504 from the first memory layer 246. In some implementations, an etching tool (e.g., etching tool 104) and/or a planarization tool (e.g., planarization tool 106) may remove the carrier 506 and the adhesion layer 504 (e.g., via application of chemicals and/or plasma to scrub the carrier 506 and the adhesion layer 504).

As indicated above, FIGS. 5A-5E are provided as an example. Other examples may differ from what is described with regard to FIGS. 5A-5E. The number and arrangement of devices, layers, and/or materials shown in FIGS. 5A-5E are provided as an example. In practice, there may be additional devices, layers, and/or materials, fewer devices, layers, and/or materials, different devices, layers, and/or materials, or differently arranged devices, layers, and/or materials than those shown in FIGS. 5A-5E.

FIGS. 6A-6E are diagrams of an example implementation 600 described herein. Example implementation 600 may be an example process for forming a semiconductor structure. The semiconductor structure may include a memory device (e.g., memory device 210) and a logic device (logic device 206). The semiconductor structure may include one or more additional devices, structures, and/or layers not shown in FIGS. 6A-6E. In some implementations, one or more semiconductor processing tools may perform the same or similar processes as shown in FIGS. 3A-3W, 4A-4E, and/or 5A-5E to form the semiconductor structure shown in FIG. 6A. In some implementations, the example implementation 600 may include a conductive structure 606 that provides an electrical connection to the logic device 206 through the memory device 210. In some implementations, the conductive structure 606 may be positioned at various layers of the logic device 206 to provide manufacturing flexibility.

Figure 6A:
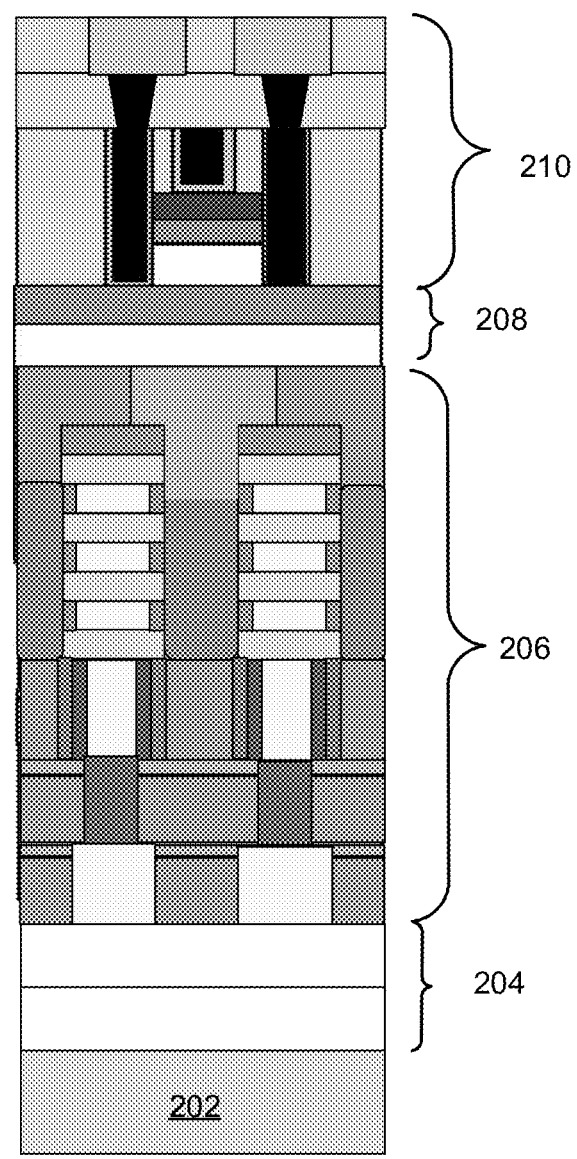
FIGS. 6A-6E are diagrams of an example implementation described herein.

As shown in FIG. 6A, example implementation 600 may include the carrier wafer 202, the dielectric structure 204, the logic device 206, the dielectric structure 208, and the memory device 210.

Figure 6B:
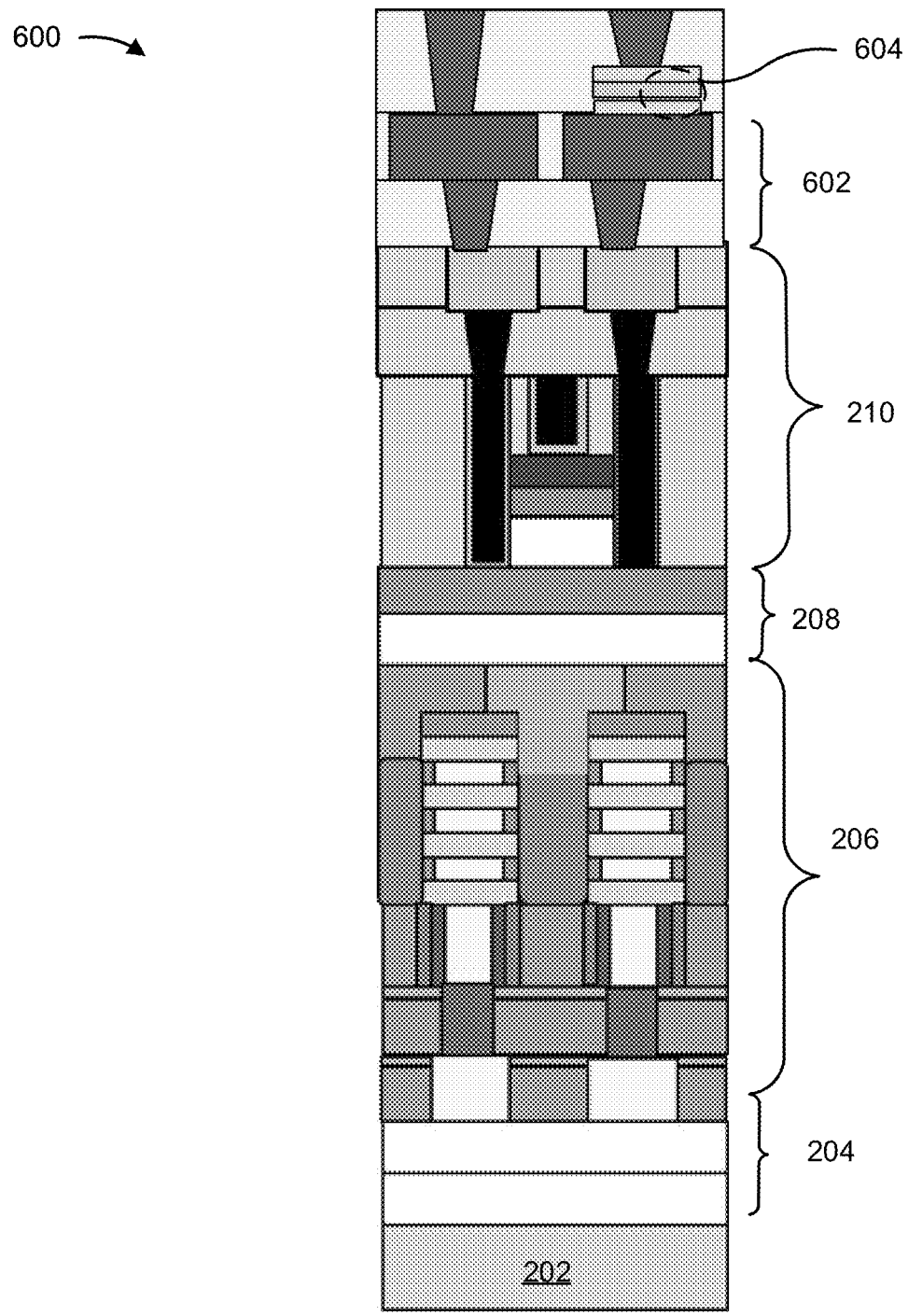

As shown in FIG. 6B, example implementation 600 may include forming one or more connections 602 between a resistor 604 and the memory device 210 to electrically couple the resistor 604 to the memory device 210. For example, a deposition tool (e.g., deposition tool 102) and/or an etching tool (e.g., etching tool 104) may form one or more inter-metal dielectrics and/or conductive structures within the inter-metal dielectrics to provide an electrical connection through the one or more inter-metal dielectrics to the memory device 210. The one or more inter-metal dielectrics may include a low-k material, such as silicon dioxide, silicon nitride, or silicon oxynitride, among other examples.

Figure 6C:
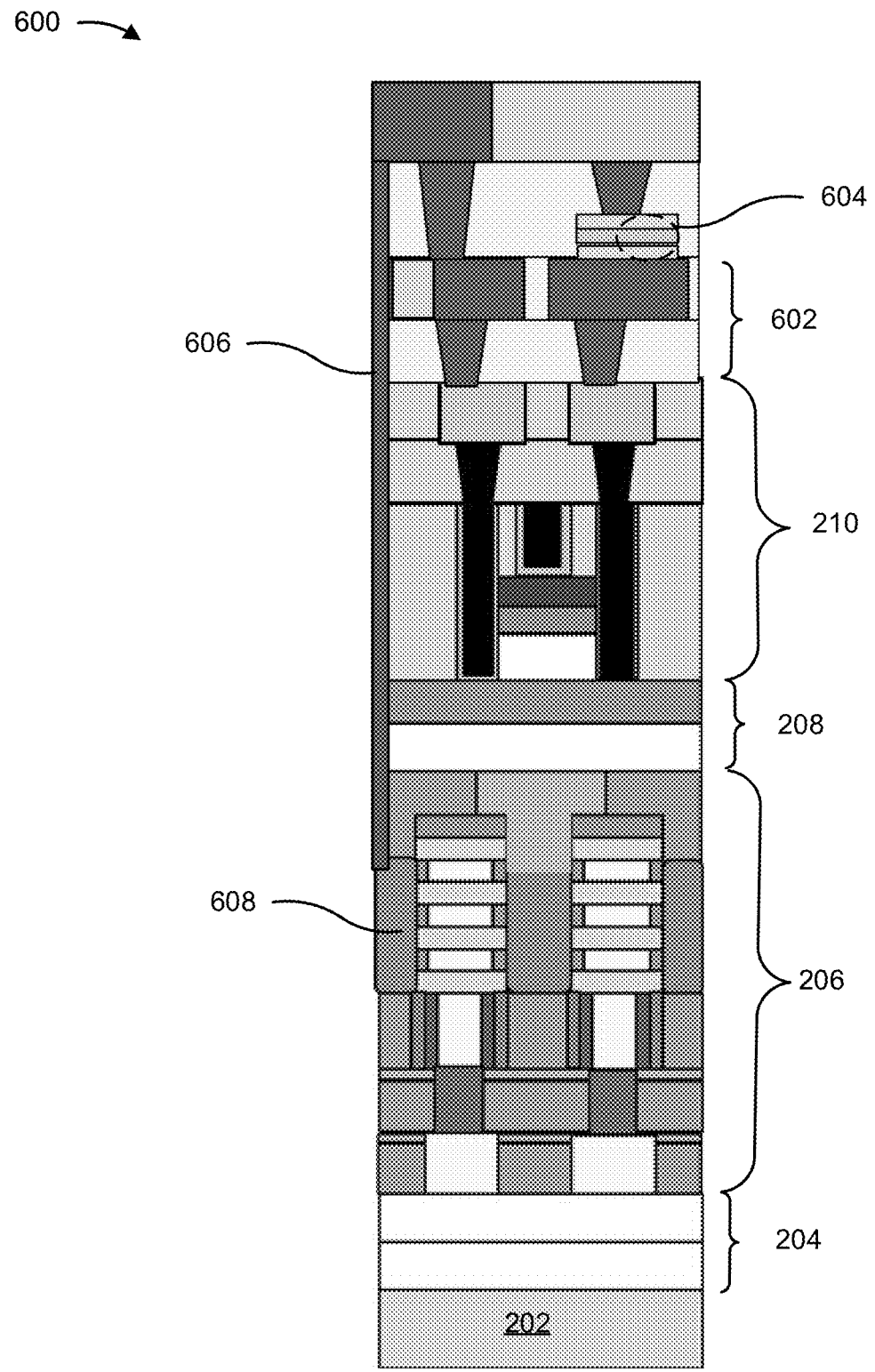

As shown in FIG. 6C, example implementation 600 may include forming a conductive structure 606 (e.g., a through-oxide via) that extends through the memory device 210 to a conductive structure 608 on a front side metal 1 layer of the logic device 206. For example, an etching tool (e.g., etching tool 104) may form a recess and a deposition tool (e.g., deposition tool 102) may dispose a conductive material into the recess to form the conductive structure 606.

The conductive structure 606 may provide an electrical connection through the memory device 210 to the front side metal 1 layer of the logic device 206.

Figure 6D:
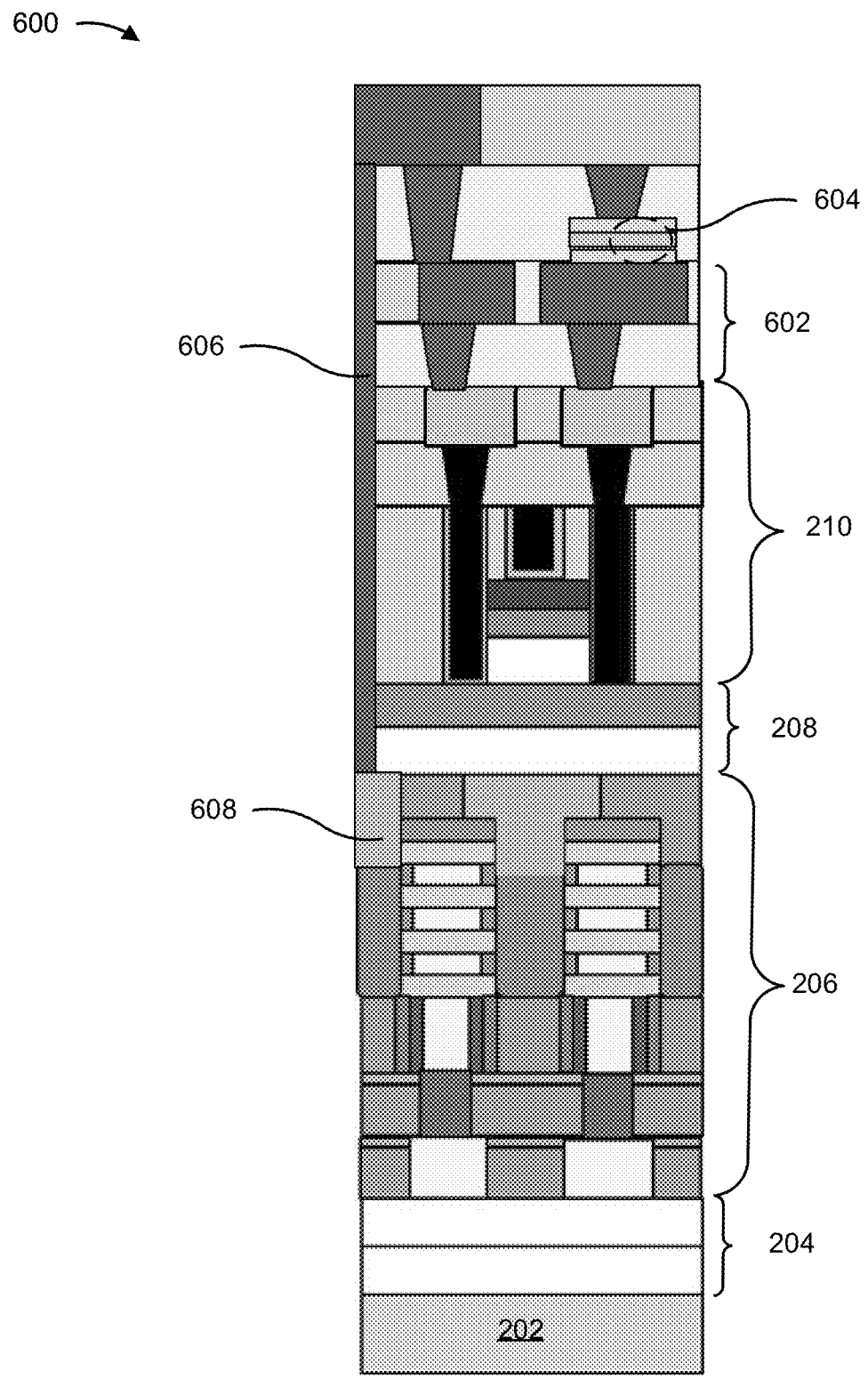

As shown in FIG. 6D, example implementation 600 may include (e.g., additionally or alternatively to FIG. 6C) forming a conductive structure 606 (e.g., a through-oxide via) that extends through the memory device 210 to a conductive structure 608 on a front side metal 2 layer of the logic device 206. For example, an etching tool (e.g., etching tool 104) may form a recess and a deposition tool (e.g., deposition tool 102) may dispose a conductive material into the recess to form the conductive structure 606. The conductive structure 606 may provide an electrical connection through the memory device 210 to the front side metal 2 layer of the logic device 206.

Figure 6E:
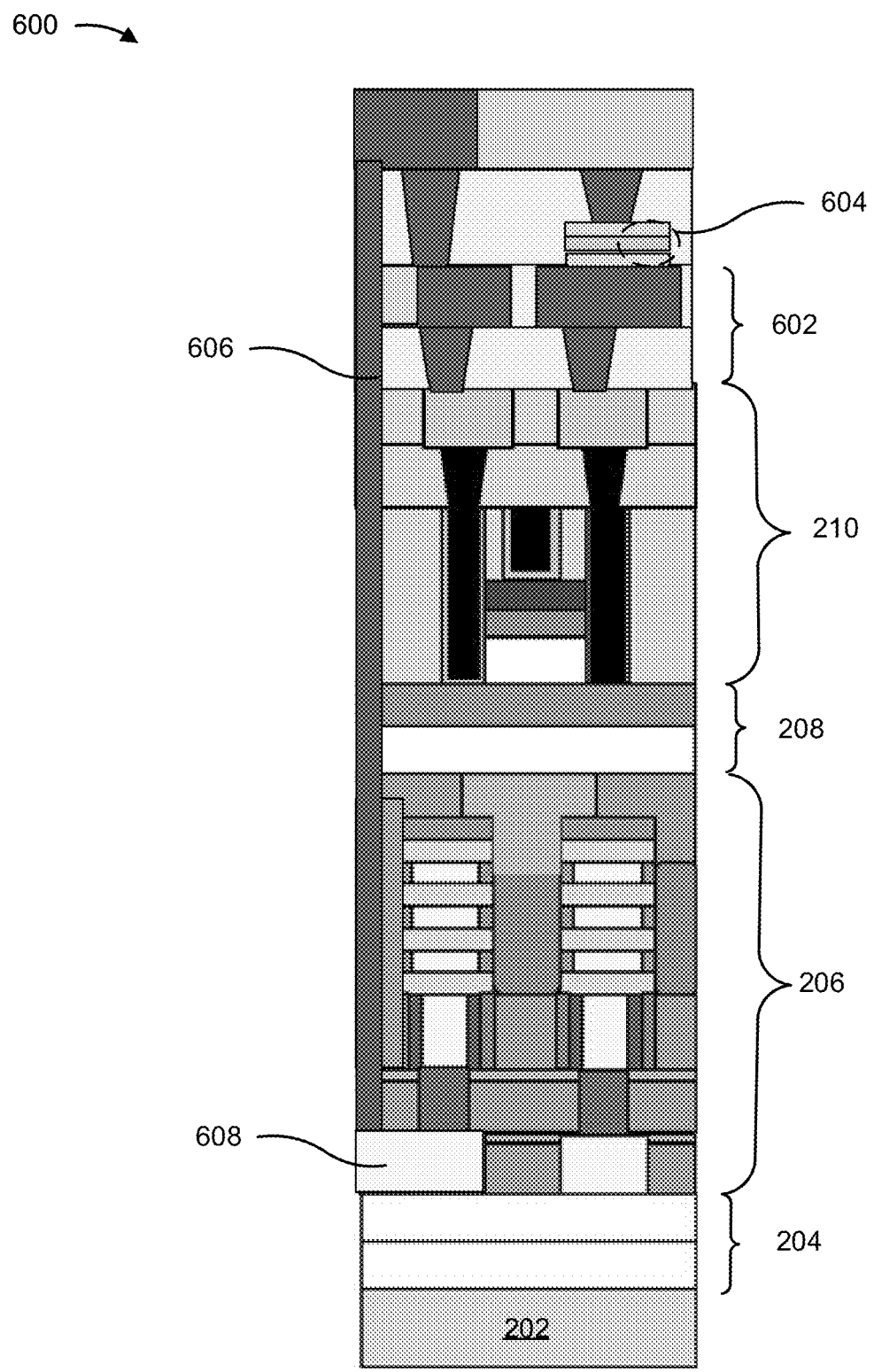

As shown in FIG. 6E, example implementation 600 may include (e.g., additionally or alternatively to FIG. 6C and FIG. 6D) forming a conductive structure 606 (e.g., a through-oxide via) that extends through the memory device 210 to a conductive structure 608 on a back side metal 0 layer of the logic device 206. For example, an etching tool (e.g., etching tool 104) may form a recess and a deposition tool (e.g., deposition tool 102) may dispose a conductive material into the recess to form the conductive structure 606. The conductive structure 606 may provide an electrical connection through the memory device 210 to the back side metal 0 layer of the logic device 206.

As indicated above, FIGS. 6A-6E are provided as examples. Other examples may differ from what is described with regard to FIGS. 6A-6E. The number and arrangement of devices, layers, and/or materials shown in FIGS. 6A-6E are provided as an example. In practice, there may be additional devices, layers, and/or materials, fewer devices, layers, and/or materials, different devices, layers, and/or materials, or differently arranged devices, layers, and/or materials than those shown in FIGS. 6A-6E.

FIGS. 7A-7E are diagrams of an example implementation 700 described herein. Example implementation 700 may be an example process for forming a semiconductor structure. The semiconductor structure may include a memory device (e.g., memory device 210) and a logic device (logic device 206). The semiconductor structure may include one or more additional devices, structures, and/or layers not shown in FIGS. 7A-7E. In some implementations, one or more semiconductor processing tools may perform the same or similar processes as shown in FIGS. 3A-3W, 4A-4E, and/or 5A-5E to form the semiconductor structure shown in FIG. 7A. In some implementations, the example implementation 700 may include a conductive structure 706 that provides an electrical connection to the logic device 206 through the memory device 210. In some implementations, the conductive structure 706 may be positioned at various layers of the logic device 206 to provide manufacturing flexibility.

Figure 7A:
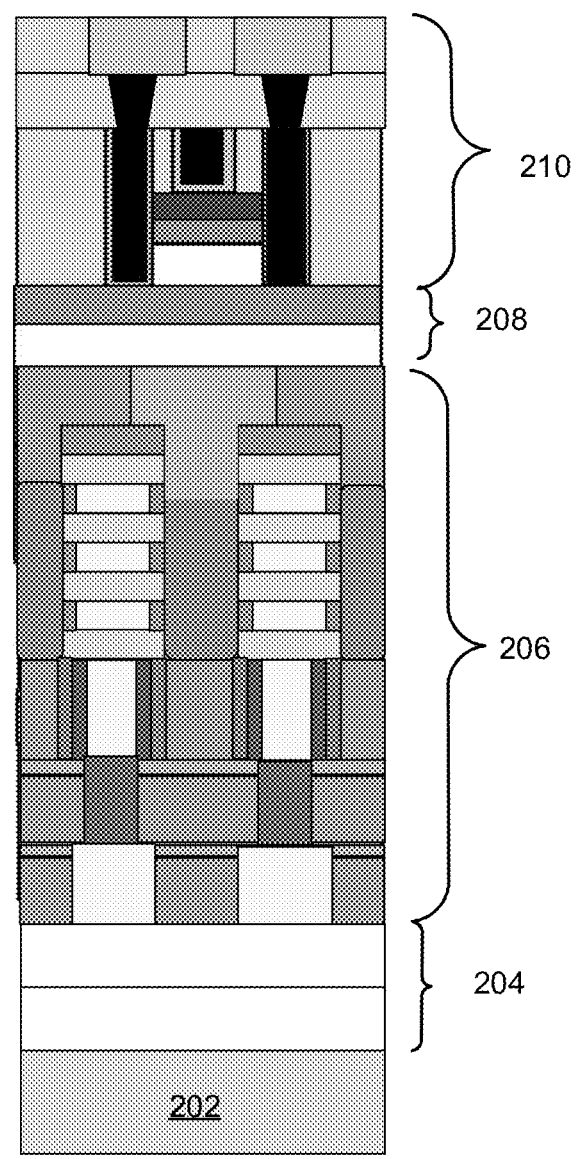
FIGS. 7A-7E are diagrams of an example implementation described herein.

As shown in FIG. 7A, example implementation 700 may include the carrier wafer 202, the dielectric structure 204, the logic device 206, the dielectric structure 208, and the memory device 210.

Figure 7B:
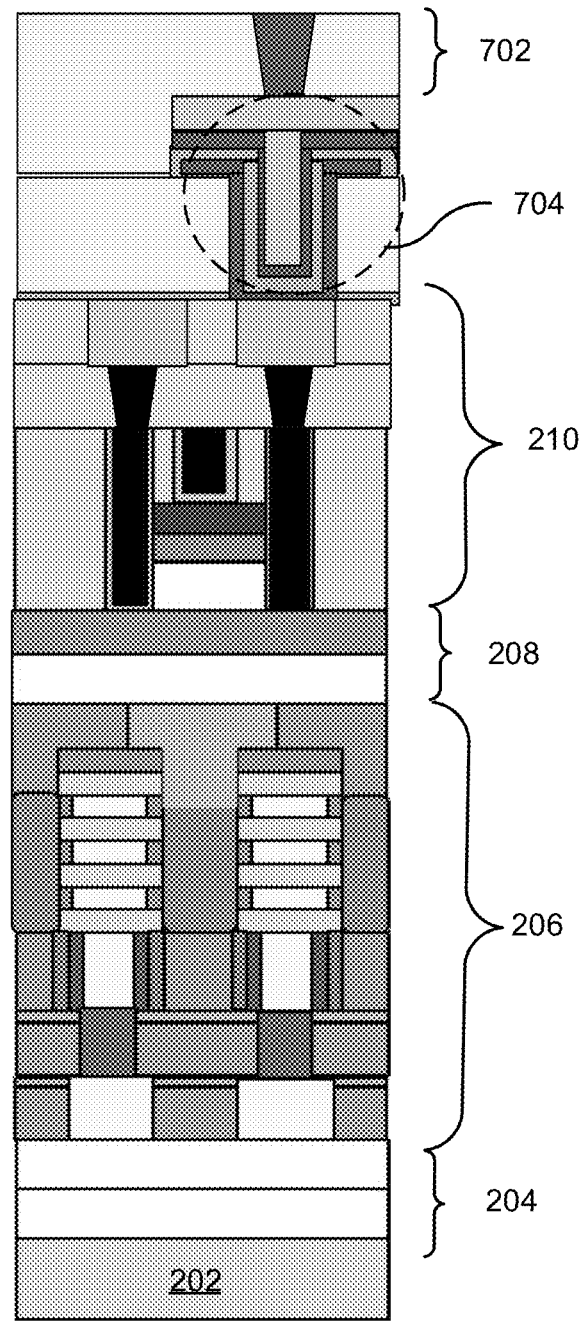

As shown in FIG. 7B, example implementation 700 may include forming one or more connections 702 between a capacitor 704 and the memory device 210 to electrically couple the capacitor 704 to another component of the semiconductor structure. For example, a deposition tool (e.g., deposition tool 102) and/or an etching tool (e.g., etching tool 104) may form one or more inter-metal dielectrics and/or conductive structures within the inter-metal dielectrics to provide an electrical connection through the one or more inter-metal dielectrics to the memory device 210. The one or more inter-metal dielectrics may include a low-k material, such as silicon dioxide, silicon nitride, or silicon oxynitride, among other examples.

Figure 7C:
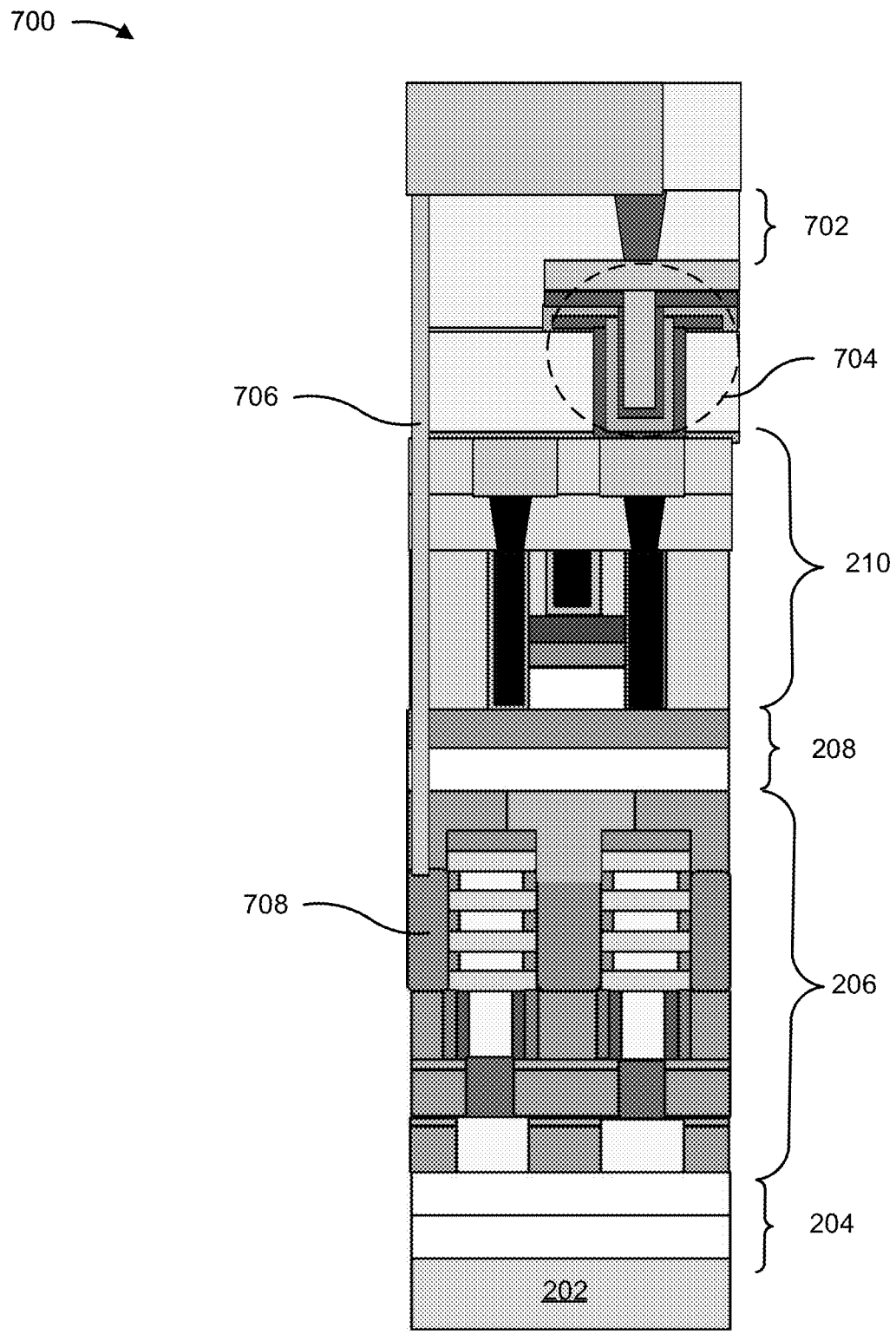

As shown in FIG. 7C, example implementation 700 may include forming a conductive structure 706 (e.g., a through-oxide via) that extends through the memory device 210 to a conductive structure 708 on a front side metal 1 layer of the logic device 206. For example, an etching tool (e.g., etching tool 104) may form a recess and a deposition tool (e.g., deposition tool 102) may dispose a conductive material into the recess to form the conductive structure 706. The conductive structure 706 may provide an electrical connection through the memory device 210 to the front side metal 1 layer of the logic device 206.

Figure 7D:
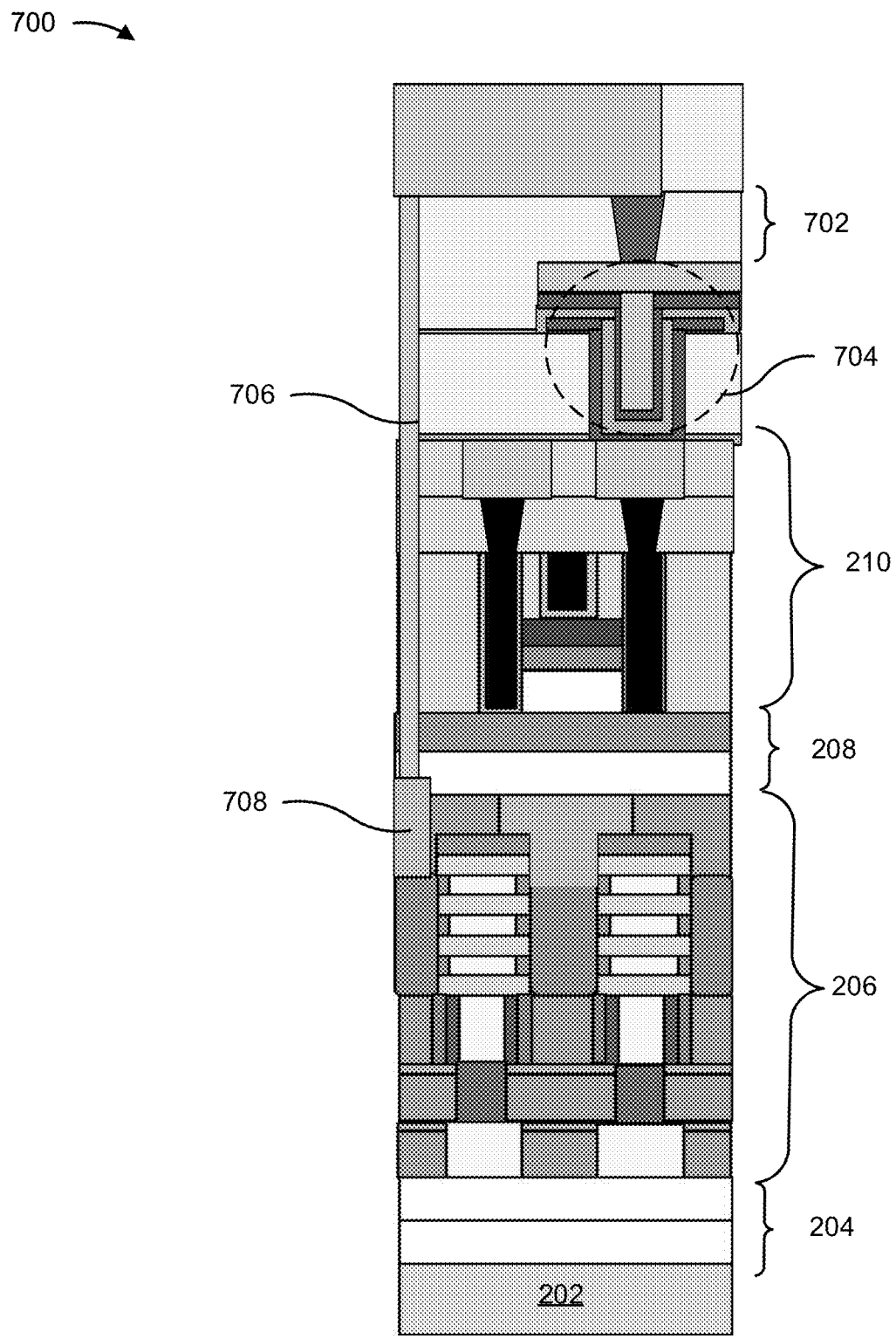

As shown in FIG. 7D, example implementation 700 may include (e.g., additionally or alternatively to FIG. 7C) forming a conductive structure 706 (e.g., a through-oxide via) that extends through the memory device 210 to a conductive structure 708 on a front side metal 2 layer of the logic device 206. For example, an etching tool (e.g., etching tool 104) may form a recess and a deposition tool (e.g., deposition tool 102) may dispose a conductive material into the recess to form the conductive structure 706. The conductive structure 706 may provide an electrical connection through the memory device 210 to the front side metal 2 layer of the logic device 206.

Figure 7E:
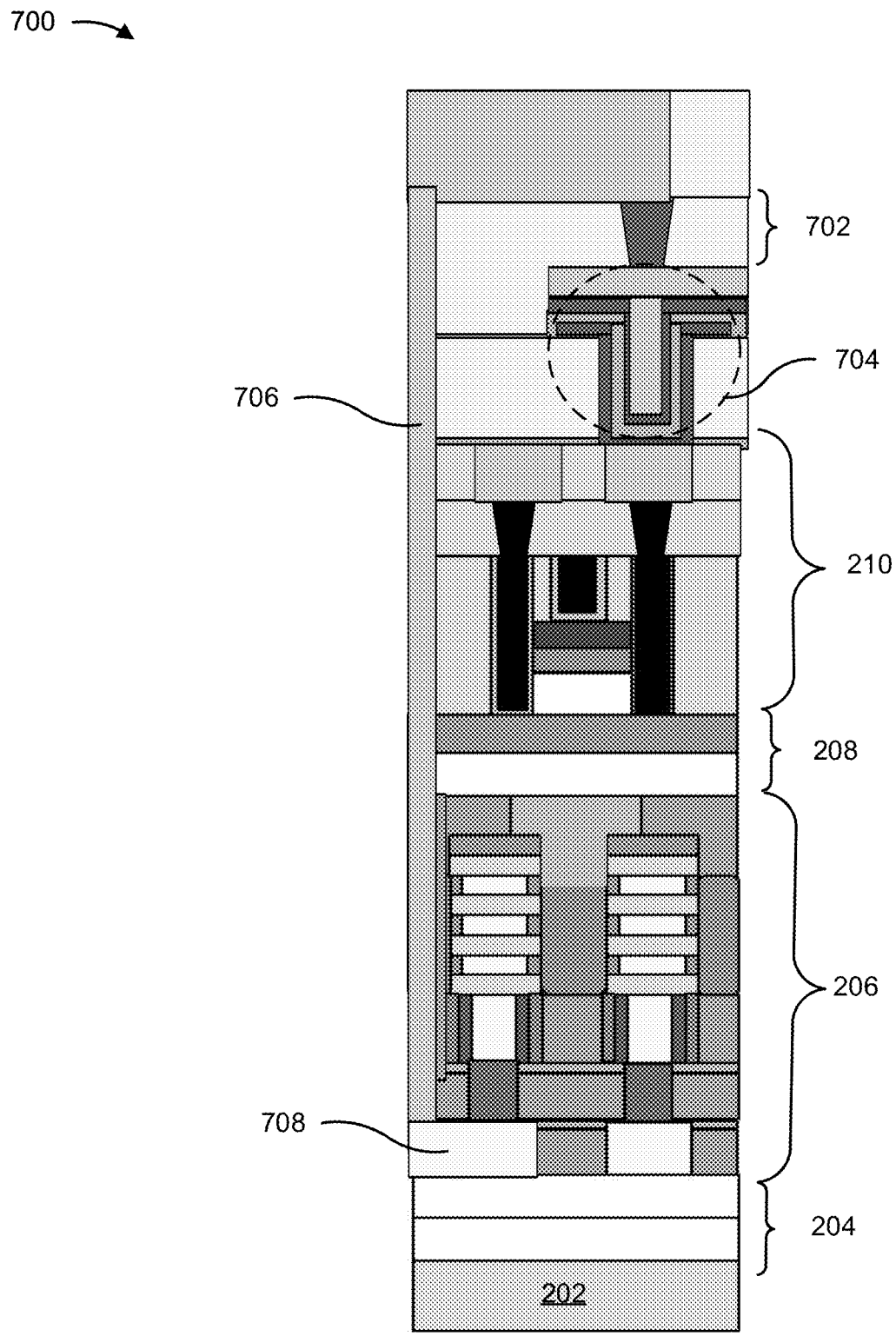

As shown in FIG. 7E, example implementation 700 may include (e.g., additionally or alternatively to FIG. 7C and FIG. 7D) forming a conductive structure 706 (e.g., a through-oxide via) that extends through the memory device 210 to a conductive structure 708 on a back side metal 0 layer of the logic device 206. For example, an etching tool (e.g., etching tool 104) may form a recess and a deposition tool (e.g., deposition tool 102) may dispose a conductive material into the recess to form the conductive structure 706. The conductive structure 706 may provide an electrical connection through the memory device 210 to the back side metal 0 layer of the logic device 206.

As indicated above, FIGS. 7A-7E are provided as examples. Other examples may differ from what is described with regard to FIGS. 7A-7E. The number and arrangement of devices, layers, and/or materials shown in FIGS. 7A-7E are provided as an example. In practice, there may be additional devices, layers, and/or materials, fewer devices, layers, and/or materials, different devices, layers, and/or materials, or differently arranged devices, layers, and/or materials than those shown in FIGS. 7A-7E.

FIGS. 8A-8E are diagrams of an example implementation 800 described herein. Example implementation 800 may be an example process for forming a semiconductor structure. The semiconductor structure may include a memory device (e.g., memory device 210) and a logic device (logic device 206). The semiconductor structure may include one or more additional devices, structures, and/or layers not shown in FIGS. 8A-8E. In some implementations, one or more semiconductor processing tools may perform the same or similar processes as shown in FIGS. 3A-3W, 4A-4E, and/or 5A-5E to form the semiconductor structure shown in FIG. 8A. In some implementations, the example implementation 800 may include a conductive structure 806 that provides an electrical connection to the logic device 206 through the memory device 210. In some implementations, the conductive structure 806 may be positioned at various layers of the logic device 206 to provide manufacturing flexibility.

Figure 8A:
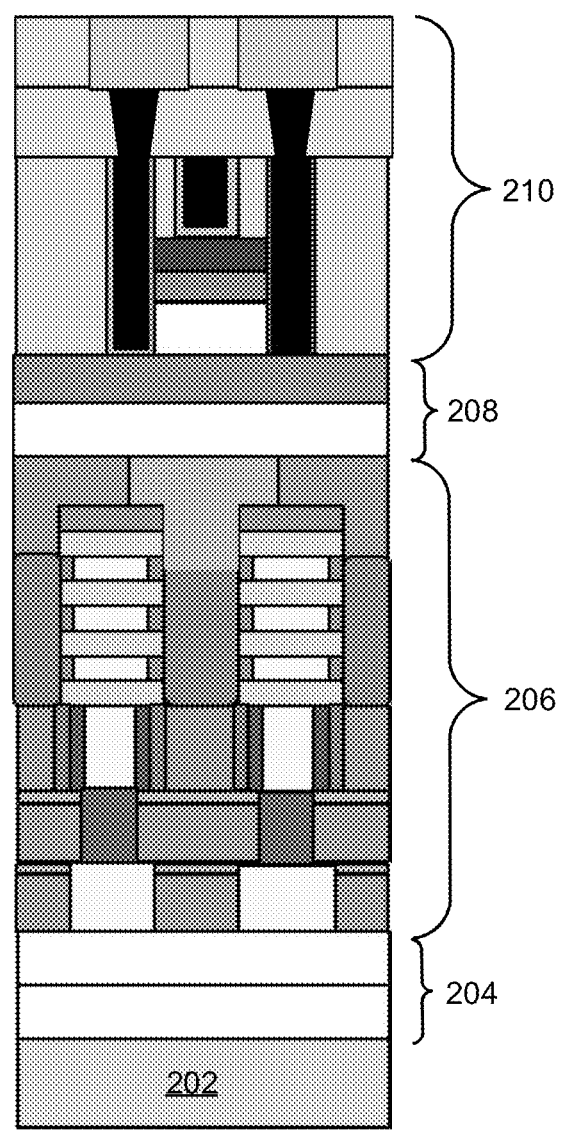
FIGS. 8A-8E are diagrams of an example implementation described herein.

As shown in FIG. 8A, example implementation 800 may include the carrier wafer 202, the dielectric structure 204, the logic device 206, the dielectric structure 208, and the memory device 210.

Figure 8B:
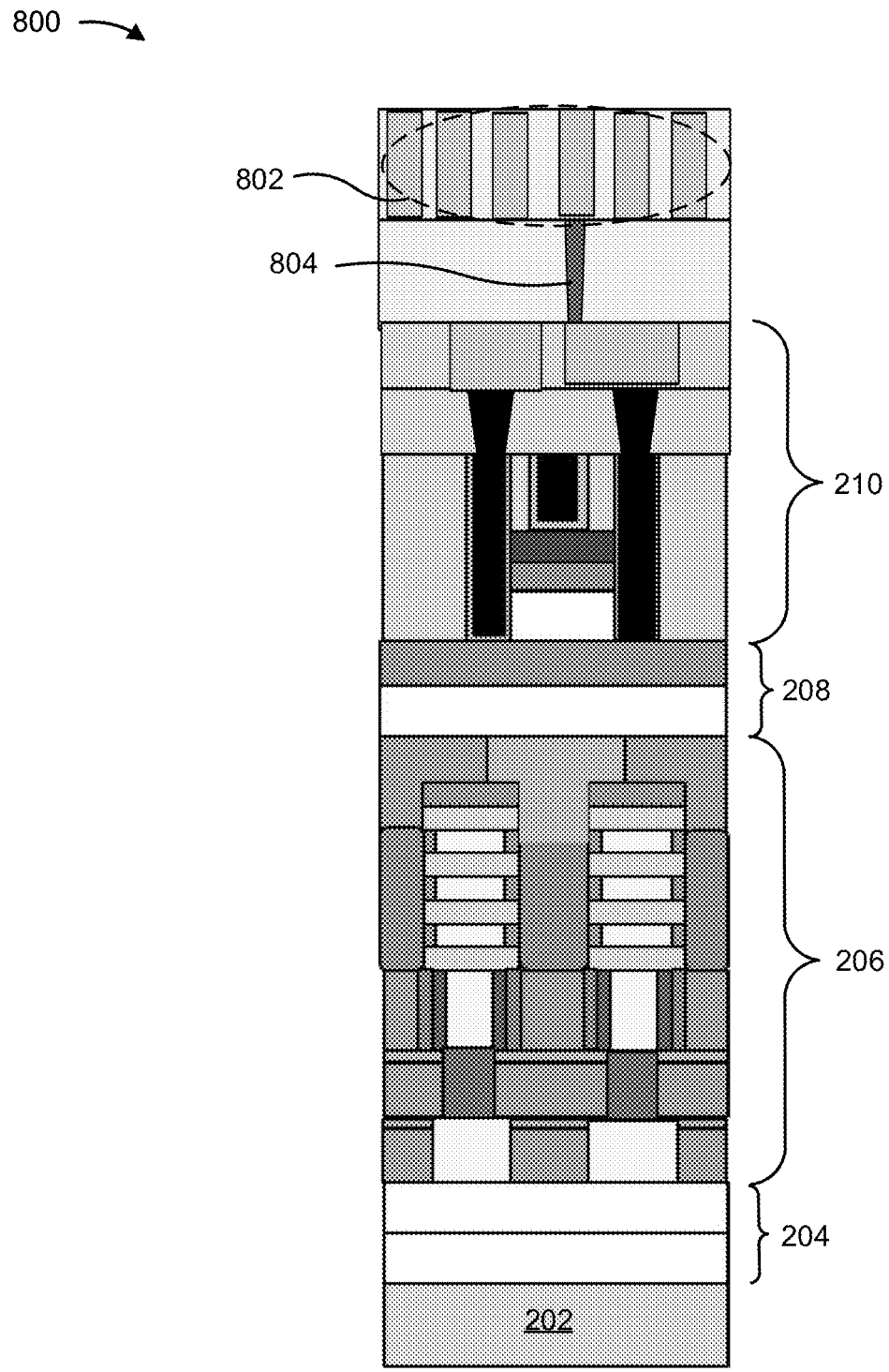

As shown in FIG. 8B, example implementation 800 may include forming one or more connections 804 between an inductor 802 and the memory device 210 to electrically couple the inductor 802 to the memory device 210. For example, a deposition tool (e.g., deposition tool 102) and/or an etching tool (e.g., etching tool 104) may form one or more inter-metal dielectrics and/or conductive structures within the inter-metal dielectrics to provide an electrical connection through the one or more inter-metal dielectrics to the memory device 210. The one or more inter-metal dielectrics may include a low-k material, such as silicon dioxide, silicon nitride, or silicon oxynitride, among other examples.

Figure 8C:
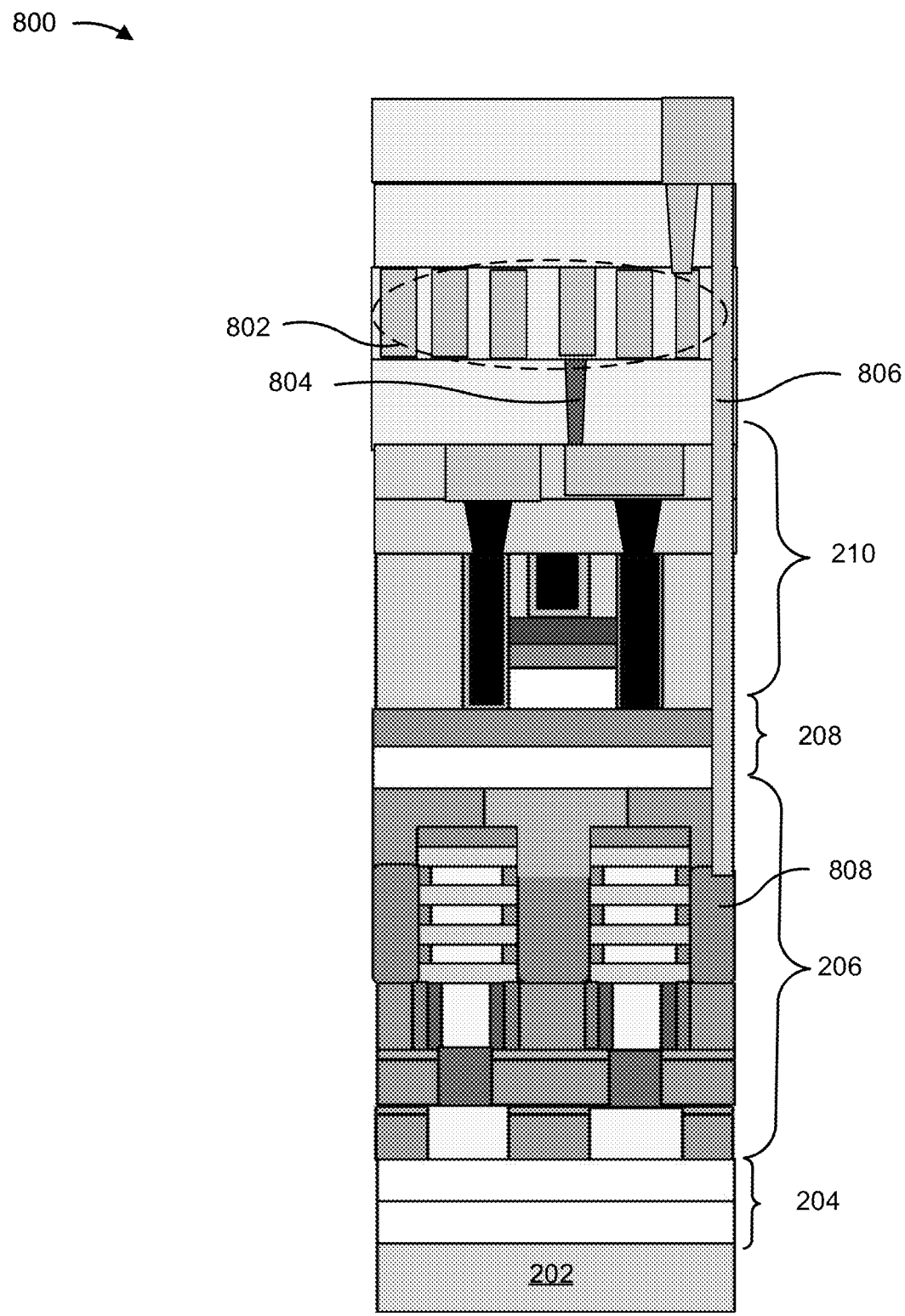

As shown in FIG. 8C, example implementation 800 may include forming a conductive structure 806 (e.g., a through-oxide via) that extends through the memory device 210 to a conductive structure 808 on a front side metal 1 layer of the logic device 206. For example, an etching tool (e.g., etching tool 104) may form one or more recesses and a deposition tool (e.g., deposition tool 102) may dispose a conductive material into the one or more recesses to form the conductive structure 806. The conductive structure 806 may provide an electrical connection through the memory device 210 to the front side metal 1 layer of the logic device 206.

Figure 8D:
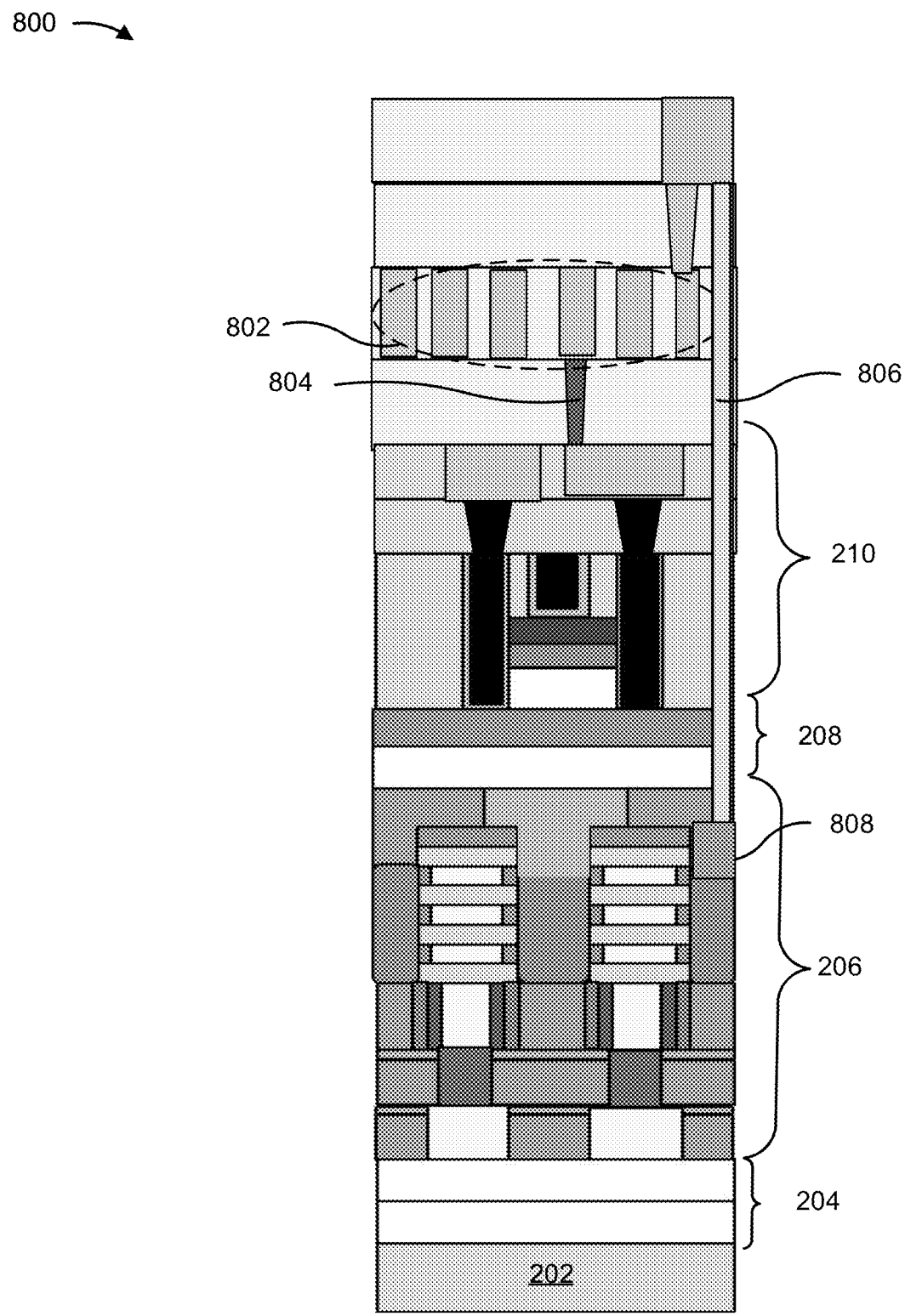

As shown in FIG. 8D, example implementation 800 may include (e.g., additionally or alternatively to FIG. 8C) forming a conductive structure 806 (e.g., a through-oxide via) that extends through the memory device 210 to a conductive structure 808 on a front side metal 2 layer of the logic device 206. For example, an etching tool (e.g., etching tool 104) may form a recess and a deposition tool (e.g., deposition tool 102) may dispose a conductive material into the recess to form the conductive structure 806. The conductive structure 806 may provide an electrical connection through the memory device 210 to the front side metal 2 layer of the logic device 206.

Figure 8E:
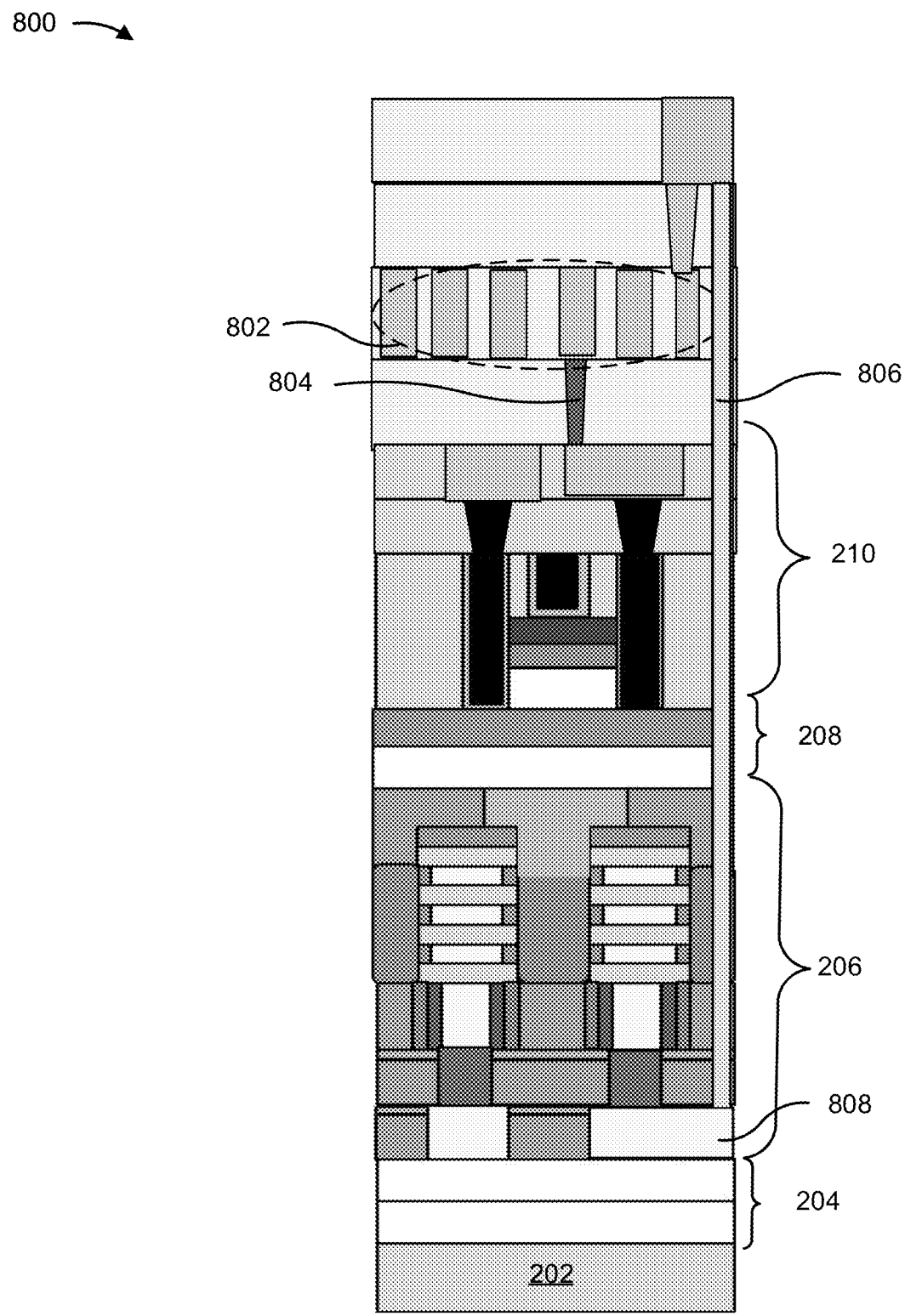

As shown in FIG. 8E, example implementation 800 may include (e.g., additionally or alternatively to FIG. 8C and FIG. 8D) forming a conductive structure 806 (e.g., a through-oxide via) that extends through the memory device 210 to a conductive structure 808 on a back side metal 0 layer of the logic device 206. For example, an etching tool (e.g., etching tool 104) may form a recess and a deposition tool (e.g., deposition tool 102) may dispose a conductive material into the recess to form the conductive structure 806. The conductive structure 806 may provide an electrical connection through the memory device 210 to the back side metal 0 layer of the logic device 206.

As indicated above, FIGS. 8A-8E are provided as examples. Other examples may differ from what is described with regard to FIGS. 8A-8E. The number and arrangement of devices, layers, and/or materials shown in FIGS. 8A-8E are provided as an example. In practice, there may be additional devices, layers, and/or materials, fewer devices, layers, and/or materials, different devices, layers, and/or materials, or differently arranged devices, layers, and/or materials than those shown in FIGS. 8A-8E.

Figure 9A:
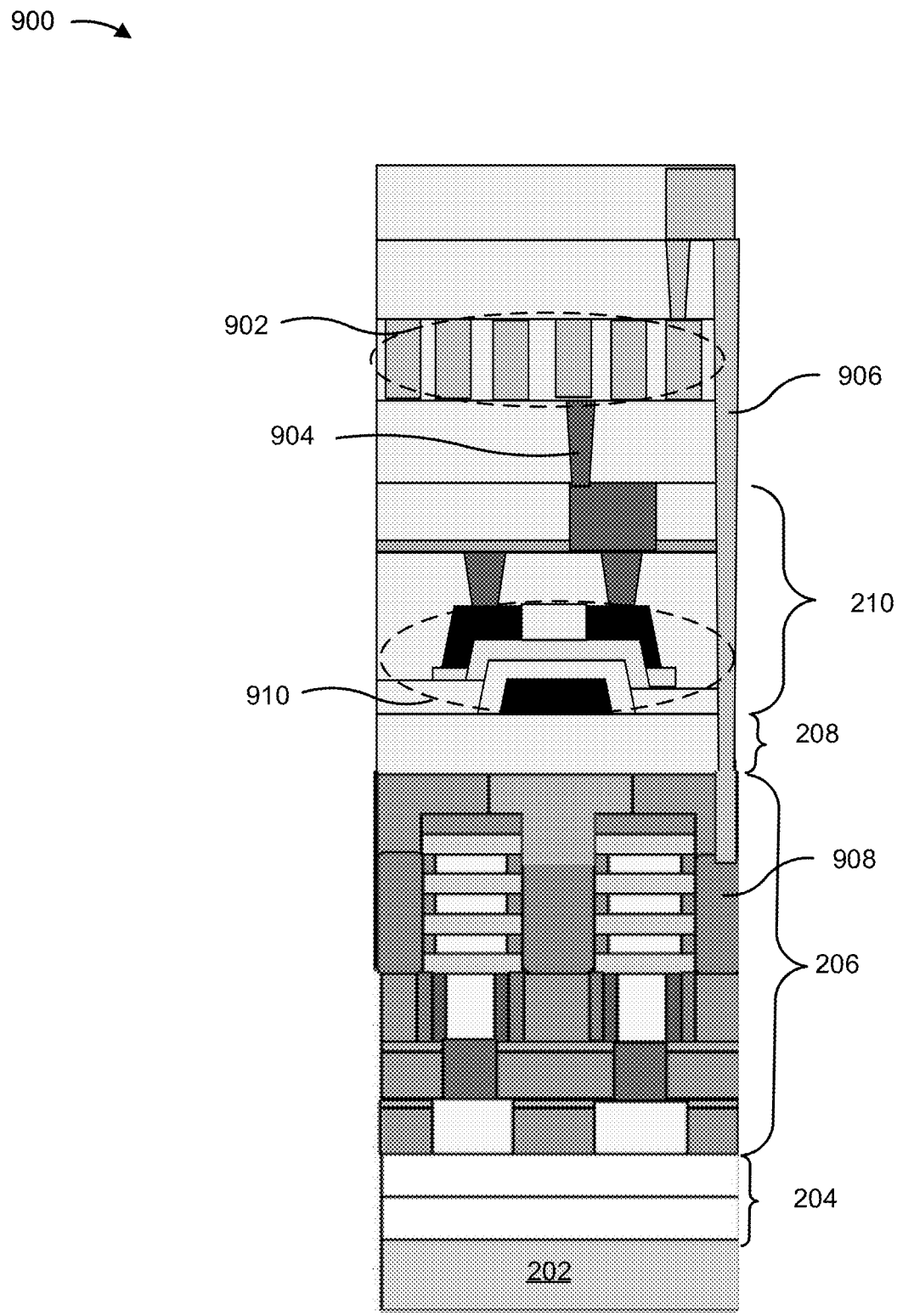
FIGS. 9A-9C are diagrams of an example implementation described herein.
Figure 9B:
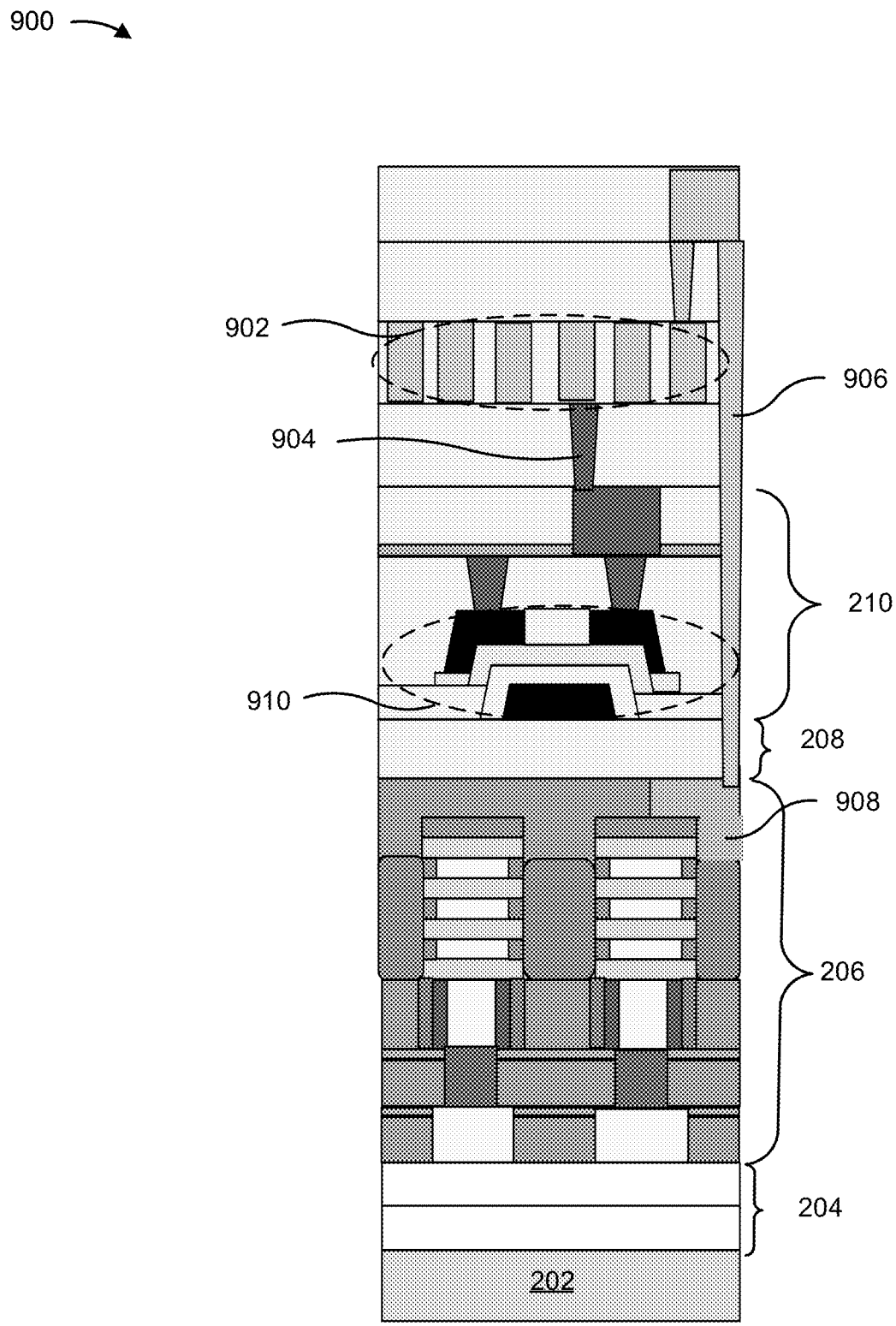
Figure 9C:
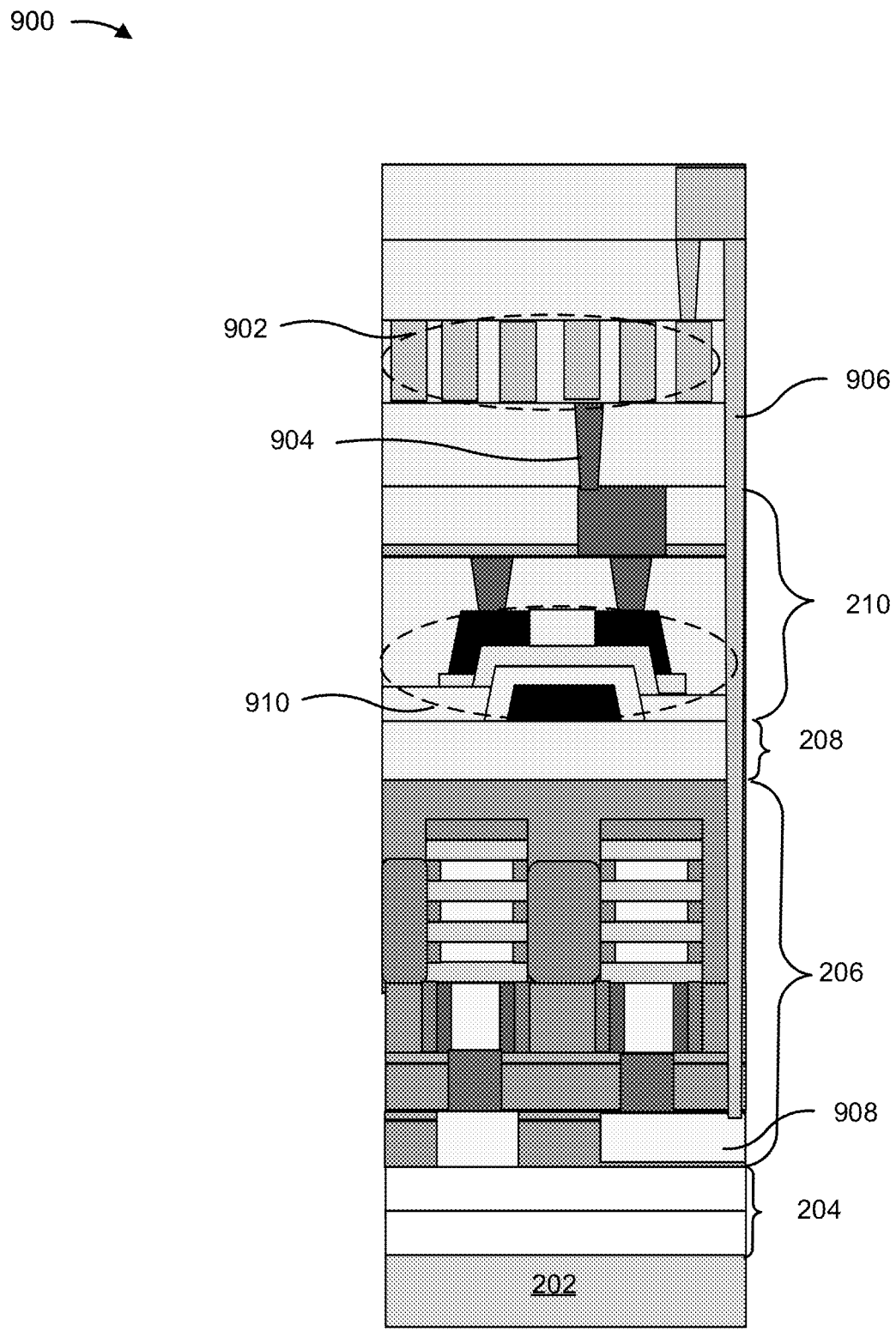

FIGS. 9A-9C are diagrams of an example implementation 900 described herein. Example implementation 900 may be an example process for forming a semiconductor structure. The semiconductor structure may include a memory device (e.g., memory device 210) and a logic device (logic device 206). The semiconductor structure may include one or more additional devices, structures, and/or layers not shown in FIGS. 9A-9C. In some implementations, one or more semiconductor processing tools may perform the same or similar processes as shown in FIGS. 3A-3W, 4A-4E, 5A-5E, and/or 8A-8B to form the semiconductor structures shown in FIGS. 9A-9C. In some implementations, FIGS. 9A-9C are diagrams similar to those of FIGS. 8C-8E, with a different type of thin film resistor illustrated. In FIGS. 9A-9C a memory device 210 includes an indium gallium zinc oxide thin film transistor 910.

As shown in FIG. 9A, example implementation 900 may include forming a conductive structure 906 (e.g., a through-oxide via) that extends through the memory device 210 (that includes an indium gallium zinc oxide thin film transistor 910) to a conductive structure 908 on a front side metal 1 layer of the logic device 206. For example, an etching tool (e.g., etching tool 104) may form a recess and a deposition tool (e.g., deposition tool 102) may dispose a conductive material into the recess to form the conductive structure 906. The conductive structure 906 may provide an electrical connection through the memory device 210 to the front side metal 1 layer of the logic device 206. In some implementations, the example implementation 900 may include a conductive structure 906 that provides an electrical connection to the logic device 206 through the memory device 210. In some implementations, the conductive structure 906 may be positioned at various layers of the logic device 206 to provide manufacturing flexibility.

As shown in FIG. 9B, example implementation 900 may include (e.g., additionally or alternatively to FIG. 9A) forming a conductive structure 906 (e.g., a through-oxide via) that extends through the memory device 210 (that includes an indium gallium zinc oxide thin film transistor 910) to a conductive structure 908 on a front side metal 2 layer of the logic device 206. For example, an etching tool (e.g., etching tool 104) may form recess and a deposition tool (e.g., deposition tool 102) may dispose a conductive material into the recess to form the conductive structure 906. The conductive structure 906 may provide an electrical connection through the memory device 210 to the front side metal 2 layer of the logic device 206.

As shown in FIG. 9C, example implementation 900 may include (e.g., additionally or alternatively to FIG. 9A and FIG. 9B) forming a conductive structure 906 (e.g., a through-oxide via) that extends through the memory device 210 (that includes an indium gallium zinc oxide thin film transistor 910) to a conductive structure 908 on a back side metal 0 layer of the logic device 206. For example, an etching tool (e.g., etching tool 104) may form a recess and a deposition tool (e.g., deposition tool 102) may dispose a conductive material into the recess to form the conductive structure 906. The conductive structure 906 may provide an electrical connection through the memory device 210 to the back side metal 0 layer of the logic device 206.

As indicated above, FIGS. 9A-9C are provided as examples. Other examples may differ from what is described with regard to FIGS. 9A-9C. The number and arrangement of devices, layers, and/or materials shown in FIGS. 9A-9C are provided as an example. In practice, there may be additional devices, layers, and/or materials, fewer devices, layers, and/or materials, different devices, layers, and/or materials, or differently arranged devices, layers, and/or materials than those shown in FIGS. 9A-9C.

FIG. 10 is a diagram of example components of a device 1000, which may correspond to deposition tool 102, etching tool 104, planarization tool 106, bonding tool 108, laser tool 110, exposure tool 112, and/or wafer/die transport tool 114. In some implementations, deposition tool 102, etching tool 104, planarization tool 106, bonding tool 108, laser tool 110, exposure tool 112, and/or wafer/die transport tool 114 may include one or more devices 1000 and/or one or more components of device 1000. As shown in FIG. 10, device 1000 may include a bus 1010, a processor 1020, a memory 1030, a storage component 1040, an input component 1050, an output component 1060, and a communication component 1070.

Bus 1010 includes a component that enables wired and/or wireless communication among the components of device 1000. Processor 1020 includes a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 includes one or more processors capable of being programmed to perform a function. Memory 1030 includes a random access memory, a read only memory, and/or another type of memory (e.g., a flash memory, a magnetic memory, and/or an optical memory).

Storage component 1040 stores information and/or software related to the operation of device 1000. For example, storage component 1040 may include a hard disk drive, a magnetic disk drive, an optical disk drive, a solid state disk drive, a compact disc, a digital versatile disc, and/or another type of non-transitory computer-readable medium. Input component 1050 enables device 1000 to receive input, such as user input and/or sensed inputs. For example, input component 1050 may include a touch screen, a keyboard, a keypad, a mouse, a button, a microphone, a switch, a sensor, a global positioning system component, an accelerometer, a gyroscope, and/or an actuator. Output component 1060 enables device 1000 to provide output, such as via a display, a speaker, and/or one or more light-emitting diodes. Communication component 1070 enables device 1000 to communicate with other devices, such as via a wired connection and/or a wireless connection. For example, communication component 1070 may include a receiver, a transmitter, a transceiver, a modem, a network interface card, and/or an antenna.

Device 1000 may perform one or more processes described herein. For example, a non-transitory computer-readable medium (e.g., memory 1030 and/or storage component 1040) may store a set of instructions (e.g., one or more instructions, code, software code, and/or program code) for execution by processor 1020. Processor 1020 may execute the set of instructions to perform one or more processes described herein. In some implementations, execution of the set of instructions, by one or more processors 1020, causes the one or more processors 1020 and/or the device 1000 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 10 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

Figure 11:
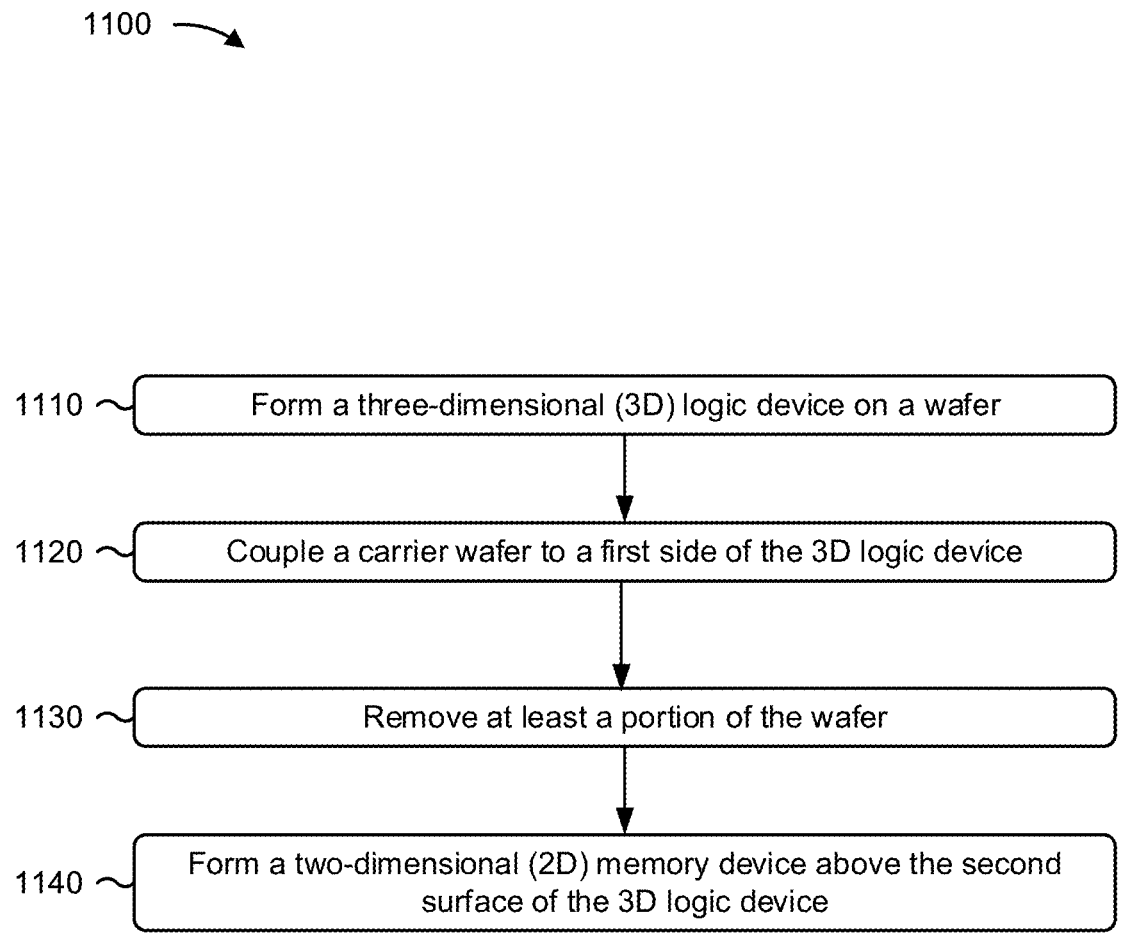
FIGS. 11 and 12 are flowcharts of example processes relating to forming a semiconductor structure.

FIG. 11 is a flowchart of an example process 1100 associated with semiconductor structure and manufacturing method thereof. In some implementations, one or more process blocks of FIG. 11 may be performed by one or more semiconductor processing tools (e.g., deposition tool 102, etching tool 104, planarization tool 106, bonding tool 108, laser tool 110, exposure tool 112, and/or wafer/die transport tool 114). Additionally, or alternatively, one or more process blocks of FIG. 11 may be performed by one or more components of device 1000, such as processor 1020, memory 1030, storage component 1040, input component 1050, output component 1060, and/or communication component 1070.

As shown in FIG. 11, process 1100 may include forming a logic device on a wafer (block 1110). For example, the one or more semiconductor processing tools may form a logic device 206 on a wafer 302, as described above.

As further shown in FIG. 11, process 1100 may include coupling a carrier wafer to a first side of the logic device, the first side being a side opposite the wafer (block 1120). For example, the one or more semiconductor processing tools may couple a carrier wafer 202 to a first side 212 of the logic device 206, the first side 212 being a side opposite the wafer 302, as described above.

As further shown in FIG. 11, process 1100 may include removing at least a portion of the wafer from a second side of the logic device (block 1130). For example, the one or more semiconductor processing tools may remove at least a portion of the wafer 302 from a second side 214 of the logic device 206, as described above.

As further shown in FIG. 11, process 1100 may include forming a memory device on the second side of the logic device after removing the at least a portion of the wafer from the second side of the logic device (block 1140). For example, the one or more semiconductor processing tools may form a memory device 210 on the second side 214 of the logic device 206 after removing the at least a portion of the wafer 302 from the second side 214 of the logic device 206, as described above.

Process 1100 may include additional implementations, such as any single implementation or any combination of implementations described below and/or in connection with one or more other processes described elsewhere herein.

In a first implementation, process 1100 includes forming a conductive structure 240 at the second side 214 of the logic device 206, and forming a dielectric structure 208 on a surface of the conductive structure 240, wherein forming the memory device 210 on the second side 214 of the logic device 206 comprises forming the memory device 210 on the dielectric structure 208.

In a second implementation, alone or in combination with the first implementation, process 1100 includes forming a resistor 604 above the memory device 210, and forming a connection 602 between the resistor and the memory device 210, wherein the memory device 210 comprises a resistive random-access memory device.

In a third implementation, alone or in combination with one or more of the first and second implementations, process 1100 includes forming a capacitor 704 above the memory device 210, wherein the memory device 210 comprises a dynamic random-access memory device.

In a fourth implementation, alone or in combination with one or more of the first through third implementations, process 1100 includes forming an inductor 802 above the memory device 210, and forming a connection 804 between the inductor 802 and the memory device 210.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

Figure 12:
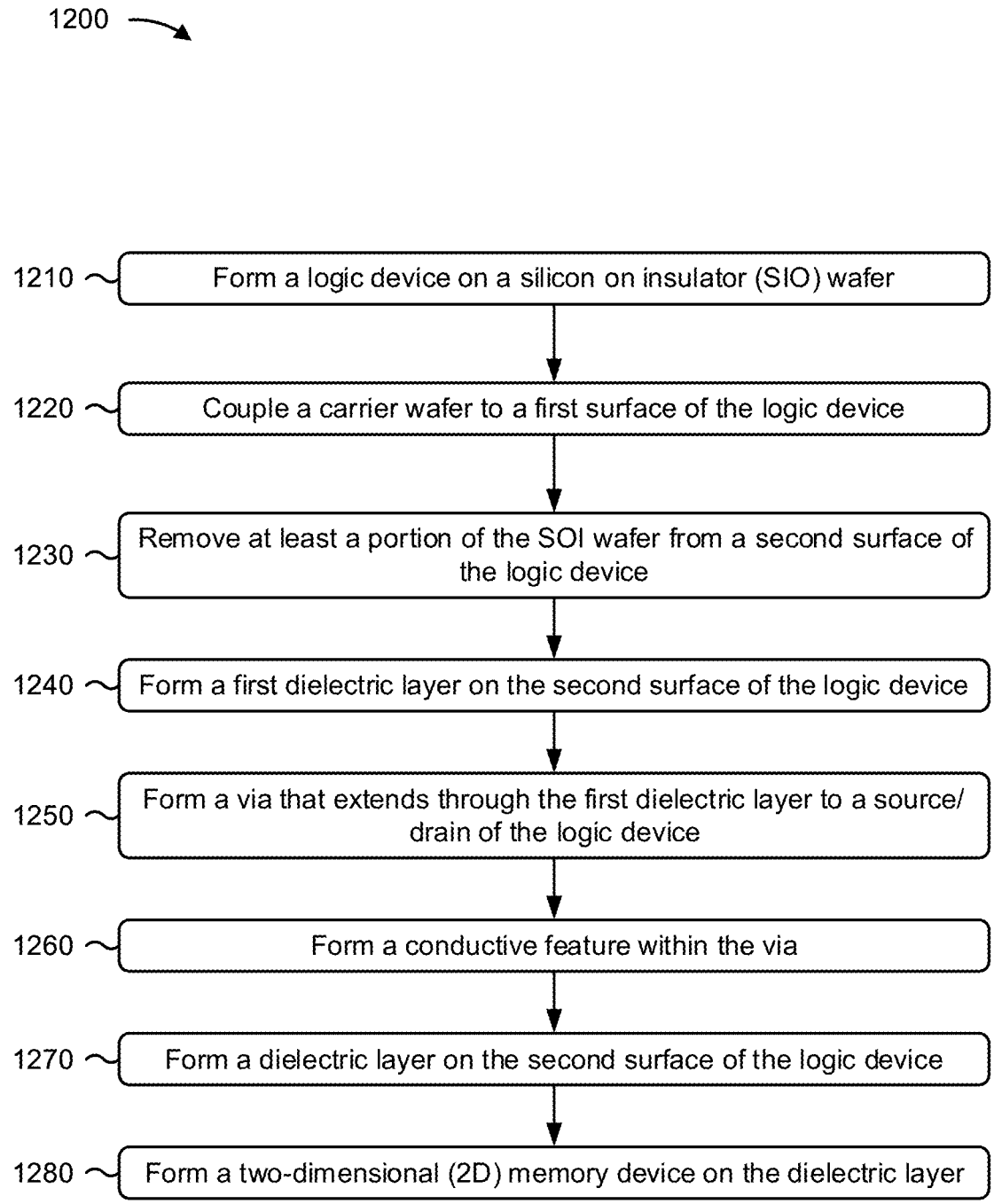

FIG. 12 is a flowchart of an example process 1200 associated with semiconductor structure and manufacturing method thereof. In some implementations, one or more process blocks of FIG. 12 may be performed by a one or more semiconductor processing tools (e.g., deposition tool 102, etching tool 104, planarization tool 106, bonding tool 108, laser tool 110, exposure tool 112, and/or wafer/die transport tool 114). Additionally, or alternatively, one or more process blocks of FIG. 12 may be performed by one or more components of device 1000, such as processor 1020, memory 1030, storage component 1040, input component 1050, output component 1060, and/or communication component 1070.

As shown in FIG. 12, process 1200 may include forming a logic device (206) on an SOI wafer (block 1210). For example, the one or more semiconductor processing tools may form a logic device 206 on an SOI wafer 302, as described above.

As further shown in FIG. 12, process 1200 may include coupling, using wafer-on-wafer bonding, a carrier wafer to a first side of the logic device (block 1220). For example, the one or more semiconductor processing tools may couple, using wafer-on-wafer bonding, a carrier wafer 202 to a first side 212 of the logic device 206, the first side 212 being a side opposite the SOI wafer 302, as described above.

As further shown in FIG. 12, process 1200 may include removing at least a portion of the SOI wafer from a second side of the logic device (block 1230). For example, the one or more semiconductor processing tools may remove at least a portion of the SOI wafer 302 from a second side 214 of the logic device 206, the second side 214 being opposite the first side 212, as described above.

As further shown in FIG. 12, process 1200 may include forming a dielectric layer at the second side of the logic device (block 1240). For example, the one or more semiconductor processing tools may form a dielectric structure 242 at the second side 214 of the logic device 206, as described above.

As further shown in FIG. 12, process 1200 may include forming a recess that extends through the dielectric layer to a source/drain or conductive structure of the logic device (block 1250). For example, the one or more semiconductor processing tools may form a recess 312 that extends through the dielectric structure 242 to a source/drain 218 or conductive structure 608/708/808/908 of the logic device 206, as described above.

As further shown in FIG. 12, process 1200 may include forming a conductive structure within the recess (block 1260). For example, the one or more semiconductor processing tools may form a conductive structure 240 within the recess 312, as described above.

As further shown in FIG. 12, process 1200 may include forming a dielectric structure on a surface of the dielectric structure 242 and a surface of the conductive structure (block 1270). For example, the one or more semiconductor processing tools may form a dielectric structure 208 on a surface of the dielectric structure 242 and a surface of the conductive structure 240, as described above.

As further shown in FIG. 12, process 1200 may include forming a memory device on the dielectric structure (block 1280). For example, the one or more semiconductor pro-cessing tools may form a memory device 210 on the dielectric structure 208, as described above.

Process 1200 may include additional implementations, such as any single implementation or any combination of implementations described below and/or in connection with one or more other processes described elsewhere herein.

In a first implementation, the conductive structure 240 comprises a contact silicide, and a contact metal plug.

In a second implementation, alone or in combination with the first implementation, process 1200 includes forming a tungsten-based layer 246 on a silicon wafer 502, coupling a first surface of the tungsten-based layer 246 to a carrier 506, the first surface of the tungsten-based layer 246 being a surface opposite the silicon wafer 502, removing the silicon wafer 502, exposing a second surface of the tungsten-based layer 246, the second surface being opposite the first surface, coupling the second surface of the tungsten-based layer 246 at the second side 214 of the logic device 206, and removing the carrier 506, wherein the memory device 210 comprises the tungsten-based layer 246.

In a third implementation, alone or in combination with one or more of the first and second implementations, the memory device 210 comprises a 2D memory device 210, wherein the logic device 206 comprises a 3D logic device 206, or a combination thereof.

Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

In this way, a memory device may be stacked on a logic device and a device density may be increased within a semiconductor structure. The increased device density may facilitate an increased quantity of memory devices and logic devices within the semiconductor structure, and/or may reduce a dimension (e.g., a width and/or volume) of the semiconductor structure.

As described in greater detail above, some implementations described herein provide a semiconductor structure. The semiconductor structure includes a logic device disposed, at a first side of the logic device, on a carrier wafer of the semiconductor structure. The semiconductor structure includes a dielectric structure disposed on a second side of the logic device, the second side being opposite the first side. The semiconductor structure includes a memory device formed on the dielectric structure.

As described in greater detail above, some implementations described herein provide a method. The method includes forming a logic device on a wafer. The method includes coupling a carrier wafer to a first side of the logic device, the first side being a side opposite the wafer. The method includes removing at least a portion of the wafer from a second side of the logic device. The method includes forming a memory device on the second side of the logic device after removing the at least a portion of the wafer from the second side of the logic device.

As described in greater detail above, some implementations described herein provide a method. The method includes forming a logic device on an SOI wafer. The method includes coupling, using wafer-on-wafer bonding, a carrier wafer to a first side of the logic device, the first side being a side opposite the SOI wafer. The method includes removing at least a portion of the SOI wafer from a second side of the logic device, the second side being opposite the first side. The method includes forming a dielectric layer at the second side of the logic device. The method includes forming a recess that extends through the dielectric layer to a source/drain or conductive structure of the logic device. The method includes forming a conductive structure within the recess. The method includes forming a dielectric structure on a surface of the dielectric layer and a surface of the conductive structure. The method includes forming a memory device on the dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a logic device on a wafer;
coupling a carrier wafer to a first side of the logic device, the first side being a side opposite the wafer;
removing at least a portion of the wafer from a second side of the logic device; and
forming a memory device on the second side of the logic device after removing at least the portion of the wafer from the second side of the logic device.

2. The method of claim 1, further comprising:
forming a conductive structure at the second side of the logic device; and
forming a dielectric structure on a surface of the conductive structure,
wherein forming the memory device on the second side of the logic device comprises:
forming the memory device on the dielectric structure.

3. The method of claim 1, further comprising:
forming a resistor above the memory device; and
forming a connection between the resistor and the memory device,
wherein the memory device comprises a resistive random-access memory device.

4. The method of claim 1, further comprising:
forming a capacitor above the memory device,
wherein the memory device comprises a dynamic random-access memory device.

5. The method of claim 1, further comprising:
forming an inductor above the memory device; and
forming a connection between the inductor and the memory device.

6. A method, comprising:
forming a logic device on a silicon on insulator (SOI) wafer;
coupling, using wafer-on-wafer bonding, a carrier wafer to a first side of the logic device, the first side being a side opposite the SOI wafer;
removing at least a portion of the SOI wafer from a second side of the logic device, the second side being opposite the first side;
forming a dielectric layer at the second side of the logic device after removing at least the portion of the SOI wafer from the second side of the logic device;
forming a recess that extends through the dielectric layer to a source/drain or conductive structure of the logic device;
forming a conductive structure within the recess;
forming a dielectric structure on a surface of the dielectric layer and a surface of the conductive structure; and
forming a memory device on the dielectric structure.

7. The method of claim 6, wherein the conductive structure comprises:
a contact silicide, and
a contact metal plug.

8. The method of claim 6, further comprising:
forming a tungsten-based layer on a silicon wafer;
coupling a first surface of the tungsten-based layer to a carrier, the first surface of the tungsten-based layer being a surface opposite the silicon wafer;
removing the silicon wafer, exposing a second surface of the tungsten-based layer, the second surface being opposite the first surface;
coupling the second surface of the tungsten-based layer at the second side of the logic device; and
removing the carrier,
wherein the memory device comprises the tungsten-based layer.

9. The method of claim 6, wherein the memory device comprises a two-dimensional (2D) memory device,
wherein the logic device comprises a three-dimensional (3D) logic device,
or a combination thereof.

10. The method of claim 6, wherein coupling the carrier wafer to the first side of the logic device comprises:
bonding the carrier wafer to the first side of the logic device via a thermal oxide-based structure and a plasma oxide-based structure.

11. The method of claim 6, wherein removing at least the portion of the SOI wafer from the second side of the logic device comprises:
planarizing the wafer to remove at least the portion of the SOI wafer from the second side of the logic device.

12. The method of claim 6, wherein removing at least the portion of the SOI wafer from the second side of the logic device comprises:
etching at least the portion of the SOI wafer.

13. The method of claim 6, further comprising:
removing a portion of the source/drain; and
wherein forming the dielectric layer at the second side of the logic device comprises:
forming the dielectric layer at the second side of the logic device after removing the portion of the source/drain.

14. The method of claim 6, further comprising:
forming a contact photo pattern on the dielectric layer; and
wherein forming the recess comprises:
forming the recess based on the contact photo pattern.

15. The method of claim 6, further comprising:
forming a resistor above the memory device; and
forming a connection between the resistor and the memory device.

16. The method of claim 6, further comprising:
forming a capacitor above the memory device; and
forming a connection between the capacitor and the memory device.

17. The method of claim 6, further comprising:
forming an inductor above the memory device; and
forming a connection between the inductor and the memory device.

18. The method of claim 2, wherein forming the conductive structure comprises:
  forming a contact photo pattern after removing at least the portion of the wafer from the second side of the logic device;
  forming a recess based on the contact photo pattern; and
  forming the conductive structure within the recess.

19. The method of claim 3, further comprising:
  forming a conductive structure to provide a connection through the memory device to the logic device.

20. The method of claim 4, further comprising:
  forming a conductive structure to provide a connection through the memory device to the logic device.

* * * * *